US012229028B2

(12) United States Patent
Tang

(10) Patent No.: US 12,229,028 B2
(45) Date of Patent: Feb. 18, 2025

(54) MEMORY DEVICE WITH FAILED MAIN BANK REPAIR USING REDUNDANT BANK

(71) Applicant: YANGTZE MEMORY TECHNOLOGIES CO., LTD., Wuhan (CN)

(72) Inventor: Qiang Tang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/413,583

(22) Filed: Jan. 16, 2024

(65) Prior Publication Data

US 2024/0152435 A1 May 9, 2024

Related U.S. Application Data

(63) Continuation of application No. 17/467,190, filed on Sep. 4, 2021, now Pat. No. 11,934,281, which is a (Continued)

(30) Foreign Application Priority Data

Mar. 24, 2021 (WO) ................ PCT/CN2021/082687
Mar. 24, 2021 (WO) ................ PCT/CN2021/082696

(51) Int. Cl.
*G06F 11/00* (2006.01)
*G06F 11/20* (2006.01)
*G11C 16/04* (2006.01)

(52) U.S. Cl.
CPC ...... *G06F 11/2094* (2013.01); *G06F 11/2043* (2013.01); *G11C 16/0483* (2013.01); *G06F 2201/85* (2013.01)

(58) Field of Classification Search
CPC ............. G06F 11/2094; G06F 2201/85; G11C 16/0483; G11C 16/10; G11C 16/26
See application file for complete search history.

(56) References Cited

U.S. PATENT DOCUMENTS 6,208,569 B1 3/2001 Patel et al.
7,359,261 B1 4/2008 Wu et al.
(Continued)

FOREIGN PATENT DOCUMENTS

CN 1419243 A 5/2003
CN 1567475 A 1/2005
(Continued)

OTHER PUBLICATIONS

International Search Report issued in corresponding International Application No. PCT/CN2021/103495, mailed Dec. 28, 2021, 5 pages.

(Continued)

*Primary Examiner* — Joshua P Lottich
(74) *Attorney, Agent, or Firm* — BAYES PLLC

(57) ABSTRACT

In certain aspects, a memory device includes an array of memory cells, an input/output (I/O) circuit, and I/O control logic coupled to the I/O circuit. The array of memory cells includes P groups of banks. Each group of banks includes N main banks and M redundant banks, where each of P, N and M is a positive integer, and N is greater than M. The I/O circuit is coupled to the P groups of banks and configured to direct P×N pieces of data to or from P×N working banks, respectively. One of the M redundant banks is coupled with at least two main banks of the N main banks through the I/O circuit. The I/O control logic is configured to in responding to K main banks of the P groups of banks failed, determine the P×N working banks including K redundant banks of P×M redundant banks, where K is a positive integer not greater than P, and control the I/O circuit to direct P×N
(Continued)

1100

OBTAIN BANK FAIL INFORMATION INDICATIVE OF A FAILED MAIN BANK — 1102

DETERMINE WORKING BANKS FROM THE MAIN BANKS AND A REDUNDANT BANK BASED ON THE BANK FAIL INFORMATION — 1104

SELECT ONE WORKING BANK OF EACH PAIR OF ADJACENT BANKS BASED ON THE BANK FAIL INFORMATION — 1106

CONTROL DIRECTING A PIECE OF DATA TO OR FROM THE SELECTED WORKING BANK OF EACH PAIR OF ADJACENT BANKS — 1108 pieces of data to or from the P×N working banks, respectively.

20 Claims, 39 Drawing Sheets

Related U.S. Application Data continuation of application No. PCT/CN2021/103495, filed on Jun. 30, 2021.

(56) References Cited

U.S. PATENT DOCUMENTS

| | | | |
|---|---|---|---|
| 7,865,804 | B2 | 1/2011 | Blevins |
| 9,195,593 | B1 | 11/2015 | Radovic |
| 2003/0090942 | A1 | 5/2003 | Furumochi |
| 2003/0090943 | A1 | 5/2003 | Okuyama et al. |
| 2003/0106001 | A1 | 6/2003 | Kurumada et al. |
| 2003/0191991 | A1 | 10/2003 | Hsu et al. |
| 2004/0040020 | A1 | 2/2004 | Yang |
| 2004/0076042 | A1 | 4/2004 | Wu et al. |
| 2004/0123282 | A1 | 6/2004 | Rao |
| 2005/0057963 | A1 | 3/2005 | Ogura et al. |
| 2005/0108461 | A1 | 5/2005 | Boldt et al. |
| 2006/0064561 | A1 | 3/2006 | Simeral et al. |
| 2006/0244484 | A1 | 11/2006 | Fang et al. |
| 2008/0259701 | A1 | 10/2008 | Gajjewar et al. |
| 2009/0316460 | A1 | 12/2009 | Orginos et al. |
| 2011/0041016 | A1 | 2/2011 | O'Connell |
| 2011/0289349 | A1 | 11/2011 | Loeser et al. |
| 2012/0182817 | A1 | 7/2012 | Fujiwara |
| 2013/0013843 | A1 | 1/2013 | Radovic et al. |
| 2013/0036276 | A1 | 2/2013 | Radovic et al. |
| 2013/0036332 | A1 | 2/2013 | Gove et al. |
| 2013/0117602 | A1 | 5/2013 | Kim et al. |
| 2013/0201767 | A1 | 8/2013 | Kim |
| 2013/0339821 | A1 | 12/2013 | Cordero et al. |
| 2014/0108725 | A1 | 4/2014 | Lee et al. |
| 2014/0115283 | A1 | 4/2014 | Radovic et al. |
| 2015/0143163 | A1 | 5/2015 | Dasari et al. |
| 2015/0317338 | A1 | 11/2015 | Radovic et al. |
| 2016/0077940 | A1 | 3/2016 | Son et al. |
| 2016/0093404 | A1 | 3/2016 | Huang et al. |
| 2017/0270017 | A1 | 9/2017 | Li |
| 2019/0163408 | A1 | 5/2019 | Berger |
| 2020/0365208 | A1 | 11/2020 | Schreck et al. |
| 2022/0148674 | A1 | 5/2022 | Qiao et al. |
| 2023/0069753 | A1 | 3/2023 | Ryu et al. |

FOREIGN PATENT DOCUMENTS

| | | | |
|---|---|---|---|
| CN | 102163465 | A | 8/2011 |
| CN | 104112478 | A | 10/2014 |
| CN | 106257595 | A | 12/2016 |
| JP | 2000260198 | A | 9/2000 |
| KR | 20010046347 | A | 6/2001 |
| KR | 20030017885 | A | 3/2003 |
| KR | 20110076223 | A | 7/2011 |
| KR | 20160031326 | A | 3/2016 |
| WO | 2021/006970 | A1 | 1/2021 |

OTHER PUBLICATIONS

International Search Report issued in corresponding International Application No. PCT/CN2021/103626, mailed Dec. 21, 2021, 5 pages.

300
301
302
PERIPHERAL CIRCUIT
304
306
308
310
312
313
314
315
316
318
320
VWL
VWL
VWL
VWL
VWL
VWL 502 504

| | B0_L | RED | B0_H | RED | B1_L | RED | B1_H | RED | B2_L | RED | B2_H | RED | B3_L | RED | B3_H | RED |
|---|---|---|---|---|---|---|---|---|---|---|---|---|---|---|---|---|
| DATA 1ST 8N | 0 | x | 1 | x | 2 | x | 3 | x | 4 | x | 5 | x | 6 | x | 7 | x |
| DATA 2ND 8N | 8 | x | 9 | x | 10 | x | 11 | x | 12 | x | 13 | x | 14 | x | 15 | x |

FIG. 6A 502 504

| | B0_L | RED | B0_H | RED | B1_L | RED | B1_H | RED | B2_L | RED | B2_H | RED | B3_L | RED | B3_H | RED |
|---|---|---|---|---|---|---|---|---|---|---|---|---|---|---|---|---|
| DATA 1ST 8N | 0 | x | 1 | x | 2 | x | 3 | x | 4 | x | x | 5 | 6 | x | 7 | x |
| DATA 2ND 8N | x | 8 | 9 | x | 10 | x | 11 | x | 12 | x | 13 | x | 14 | x | 15 | x |

FIG. 6B 702 704

| | B0_L | B0_H | B1_L | B1_H | RED | B2_L | B2_H | B3_L | B3_H |
|---|---|---|---|---|---|---|---|---|---|
| DATA $1^{ST}$ 8N | 0 | 1 | 2 | 3 | x | 4 | 5 | 6 | 7 |
| DATA $2^{ND}$ 8N | 8 | 9 | 10 | 11 | x | 12 | 13 | 14 | 15 |

FIG. 10A

1630
REGISTERS
414
416
413
CONTROL LOGIC
412
I/O CONTROL LOGIC
I/F
417
DATA I/O
1418
1302a
PLANE SECTION 1502a
PAGE BUFFER SECTION 1406a
PLANE SECTION 1502b
PAGE BUFFER SECTION 1406b
PAGE BUFFER SECTION 1406c
PLANE SECTION 1502c
PAGE BUFFER SECTION 1406d
PLANE SECTION 1502d
1405a
1405b
1405c
1405d
407a
407b
407c
407d
1402a
1403a
1401
1403b
1302b
1405e
1405f
1405g
407e
407f
407g
407h
1402b
1404
1407a
1407b

1640
PLANE SECTION 1502a
PAGE BUFFER SECTION 1406a
PLANE SECTION 1502b
PAGE BUFFER SECTION 1406b
PAGE BUFFER SECTION 1406c
PLANE SECTION 1502c
PAGE BUFFER SECTION 1406d
PLANE SECTION 1502d
1402a
1402b
1404a
1404b
1401
I/O CIRCUIT
407a
407b
407c
1403a
1403b
1405a
1405b
1405c
1405d
1405e
1405f
1407a
1407b
1407c
1407d
1418
1302a
1302b
REGISTERS
414
CONTROL LOGIC
413
I/O CONTROL LOGIC
412
I/F
DATA I/O
416
417

1850

| I/O Data Line | 1801 | 1802 | 1803 | 1804 | | 1806 | 1807 | 1808 | 1809 |
|---|---|---|---|---|---|---|---|---|---|
| Clk0 | (0,0) | (0,1) | (0,2) | (0,3) | | (0,4) | (0,5) | (0,6) | (0,7) |
| Clk1 | (1,0) | (1,1) | (1,2) | (1,3) | | (1,4) | (1,5) | (1,6) | (1,7) |

1852

| Signal Line | 1811 | 1812 | 1813 | 1814 | 1815 | 1816 | 1817 | 1818 | 1819 |
|---|---|---|---|---|---|---|---|---|---|
| Clk1 | | (0,0) | (0,1) | (0,2) | (0,3) | (0,4) | (0,5) | (0,6) | (0,7) |
| Clk2 | (1,0) | (1,1) | (1,2) | (1,3) | (0,3) | (1,4) | (1,5) | (1,6) | (1,7) |

1854

| Signal Line | 1821 | 1822 | 1823 | 1824 | 1825 | 1826 | 1827 | 1828 | 1829 |
|---|---|---|---|---|---|---|---|---|---|
| Clk2 | | | (0,0) | (0,1) | (0,2) | (0,4) | (0,5) | (0,6) | (0,7) |
| Clk3 | (1,0) | (1,1) | (1,2) | (1,3) | (0,3) | (1,4) | (1,5) | (1,6) | (1,7) |

1856

| | | | | | | | | | |
|---|---|---|---|---|---|---|---|---|---|
| Group 1 | (1,0) | (1,1) | (1,2) | (1,3) | (0,3) | (1,4) | (1,5) | (1,6) | (1,7) |
| Group 0 | X | X | (0,0) | (0,1) | (0,2) | (0,4) | (0,5) | (0,6) | (0,7) |

| I/O Data Line | 1801 | 1802 | 1803 | 1804 | | 1806 | 1807 | 1808 | 1809 |
|---|---|---|---|---|---|---|---|---|---|
| Clk0 | (1,0) | (1,1) | (1,2) | (1,3) | | (1,4) | (1,5) | (1,6) | (1,7) |
| Clk1 | (0,0) | (0,1) | (0,2) | (0,3) | | (0,4) | (0,5) | (0,6) | (0,7) |
| Clk2 | (0,0) | (0,1) | (0,2) | (0,3) | | (0,4) | (0,5) | (0,6) | (0,7) |

1862

| Signal Line | 1811 | 1812 | 1813 | 1814 | 1815 | 1816 | 1817 | 1818 | 1819 |
|---|---|---|---|---|---|---|---|---|---|
| Clk1 | (1,0) | (1,1) | (1,2) | (1,3) | | (1,4) | (1,5) | (1,6) | (1,7) |
| Clk2 | (1,0) | (1,1) | (1,2) | (1,3) | (0,3) | (1,4) | (1,5) | (1,6) | (1,7) |
| Clk3 | | (0,0) | (0,1) | (0,2) | | (0,4) | (0,5) | (0,6) | (0,7) |

1864

| Signal Line | 1821 | 1822 | 1823 | 1824 | 1825 | 1826 | 1827 | 1828 | 1829 |
|---|---|---|---|---|---|---|---|---|---|
| Clk3 | (1,0) | (1,1) | (1,2) | (1,3) | (0,3) | (1,4) | (1,5) | (1,6) | (1,7) |
| Clk4 | | | (0,0) | (0,1) | (0,2) | (0,4) | (0,5) | (0,6) | (0,7) |

1866

| | | | | | | | | | |
|---|---|---|---|---|---|---|---|---|---|
| Group 1 | (1,0) | (1,1) | (1,2) | (1,3) | (0,3) | (1,4) | (1,5) | (1,6) | (1,7) |
| Group 0 | X | X | (0,0) | (0,1) | (0,2) | (0,4) | (0,5) | (0,6) | (0,7) |

| I/O Data Line | 1903 | 1904 | | 1906 | 1907 |
|---|---|---|---|---|---|
| Clk0 | (0,0) | (0,1) | | (0,2) | (0,3) |
| Clk1 | (1,0) | (1,1) | | (1,2) | (1,3) |
| Clk2 | (2,0) | (2,1) | | (2,2) | (2,3) |

1952

| Signal Line | 1913 | 1914 | 1915 | 1916 | 1917 |
|---|---|---|---|---|---|
| Clk1 | | (0,0) | (0,1) | (0,2) | (0,3) |
| Clk2 | (1,0) | (1,1) | (0,1) | (1,2) | (1,3) |
| Clk3 | (2,0) | (2,1) | (0,1) | (2,2) | (2,3) |

1954

| Signal Line | 1923 | 1924 | 1925a | 1925b | 1926 | 1927 |
|---|---|---|---|---|---|---|
| Clk2 | | | (0,0) | (0,1) | (0,2) | (0,3) |
| Clk3 | (1,0) | (1,1) | (0,0) | (0,1) | (1,2) | (1,3) |
| Clk4 | (2,0) | (2,1) | | (0,1) | (2,2) | (2,3) |

1955

| Signal Line | 1933 | 1934 | 1935 | 1936 | 1937 |
|---|---|---|---|---|---|
| Clk3 | | | (0,2) | | (0,3) |
| Clk4 | (1,0) | (1,1) | (0,0) | (1,2) | (1,3) |
| Clk5 | (2,0) | (2,1) | (0,1) | (2,2) | (2,3) |

1956

| | | | | | |
|---|---|---|---|---|---|
| Group 2 | (2,0) | (2,1) | (0,1) | (2,2) | (2,3) |
| Group 1 | (1,0) | (1,1) | (0,0) | (1,2) | (1,3) |
| Group 0 | X | X | (0,2) | X | (0,3) |

| I/O Data Line | 1903 | 1904 | | 1906 | 1907 |
|---|---|---|---|---|---|
| Clk0 | (0,0) | (0,1) | | (0,2) | (0,3) |
| Clk1 | (1,0) | (1,1) | | (1,2) | (1,3) |
| Clk2 | (2,0) | (2,1) | | (2,2) | (2,3) |

1962

| Signal Line | 1913 | 1914 | 1915 | 1916 | 1917 |
|---|---|---|---|---|---|
| Clk1 | (0,0) | (0,1) | | (0,2) | (0,3) |
| Clk2 | (1,0) | (1,1) | | (1,2) | (1,3) |
| Clk3 | (2,0) | (2,1) | | (2,2) | (2,3) |

1964

| Signal Line | 1923 | 1924 | 1925a | 1925b | 1926 | 1927 |
|---|---|---|---|---|---|---|
| Clk2 | (0,0) | (0,1) | (0,2) | | | (0,3) |
| Clk3 | (1,0) | (1,1) | (0,2) | | (1,2) | (1,3) |
| Clk4 | (2,0) | (2,1) | (0,2) | | (2,2) | (2,3) |

1965

| Signal Line | 1933 | 1934 | 1935 | 1936 | 1937 |
|---|---|---|---|---|---|
| Clk3 | | (0,0) | (0,1) | | (0,3) |
| Clk4 | (1,0) | (1,1) | (1,2) | | (1,3) |
| Clk5 | (2,0) | (2,1) | (0,2) | (2,2) | (2,3) |

1966

| | | | | | |
|---|---|---|---|---|---|
| Group 2 | (2,0) | (2,1) | (0,2) | (2,2) | (2,3) |
| Group 1 | (1,0) | (1,1) | (1,2) | X | (1,3) |
| Group 0 | X | (0,0) | (0,1) | X | (0,3) |

| | | | | | | | | | |
|---|---|---|---|---|---|---|---|---|---|
| Group 1 | (1,0) | (1,1) | (1,2) | (1,3) | (0,3) | (1,4) | (1,5) | (1,6) | (1,7) |
| Group 0 | X | X | (0,0) | (0,1) | (0,2) | (0,4) | (0,5) | (0,6) | (0,7) |

2150

| | | | | | | | | | |
|---|---|---|---|---|---|---|---|---|---|
| Signal Line | 2101 | 2102 | 2103 | 2104 | 2105 | 2106 | 2107 | 2108 | 2109 |
| Clk0 | | | (0,0) | (0,1) | (0,2) | (0,4) | (0,5) | (0,6) | (0,7) |
| Clk1 | (1,0) | (1,1) | (1,2) | (1,3) | (0,3) | (1,4) | (1,5) | (1,6) | (1,7) |

2152

| | | | | | | | | | |
|---|---|---|---|---|---|---|---|---|---|
| Signal Line | 2111 | 2112 | 2113 | 2114 | 2115 | 2116 | 2117 | 2118 | 2119 |
| Clk1 | | (0,0) | (0,1) | (0,2) | (0,3) | (0,4) | (0,5) | (0,6) | (0,7) |
| Clk2 | (1,0) | (1,1) | (1,2) | (1,3) | | (1,4) | (1,5) | (1,6) | (1,7) |

2154

| | | | | | | | | | |
|---|---|---|---|---|---|---|---|---|---|
| Signal Line | 2121 | 2122 | 2123 | 2124 | | 2126 | 2127 | 2128 | 2129 |
| Clk2 | (0,0) | (0,1) | (0,2) | (0,3) | | (0,4) | (0,5) | (0,6) | (0,7) |
| Clk3 | (1,0) | (1,1) | (1,2) | (1,3) | | (1,4) | (1,5) | (1,6) | (1,7) |

| | | | | | |
|---|---|---|---|---|---|
| Group 2 | (2,0) | (2,1) | (0,1) | (2,2) | (2,3) |
| Group 1 | (1,0) | (1,1) | (0,0) | (1,2) | (1,3) |
| Group 0 | X | X | (0,2) | X | (0,3) |

2250

| Signal Line | 2203 | 2204 | 2205 | 2206 | 2207 |
|---|---|---|---|---|---|
| Clk0 | | | (0,2) | | (0,3) |
| Clk1 | (1,0) | (1,1) | (0,0) | (1,2) | (1,3) |
| Clk2 | (2,0) | (2,1) | (0,1) | (2,2) | (2,3) |

2252

| Signal Line | 2213 | 2214 | 2215 | 2216 | 2217 |
|---|---|---|---|---|---|
| Clk1 | | | (0,0) | (0,2) | (0,3) |
| Clk2 | (1,0) | (1,1) | | (1,2) | (1,3) |
| Clk3 | (2,0) | (2,1) | | (2,2) | (2,3) |

2254

| Signal Line | 2223 | 2224 | 2225 | 2226 | 2227 |
|---|---|---|---|---|---|
| Clk2 | | (0,0) | (0,1) | (0,2) | (0,3) |
| Clk3 | (1,0) | (1,1) | | (1,2) | (1,3) |
| Clk4 | (2,0) | (2,1) | | (2,2) | (2,3) |

2255

| Signal Line | 2233 | 2234 | | 2236 | 2237 |
|---|---|---|---|---|---|
| Clk3 | (0,0) | (0,1) | | (0,2) | (0,3) |
| Clk4 | (1,0) | (1,1) | | (1,2) | (1,3) |
| Clk5 | (2,0) | (2,1) | | (2,2) | (2,3) |

| | | | | | |
|---|---|---|---|---|---|
| Group 2 | (2,0) | (2,1) | (0,2) | (2,2) | (2,3) |
| Group 1 | (1,0) | (1,1) | (1,2) | X | (1,3) |
| Group 0 | X | (0,0) | (0,1) | X | (0,3) |

2260

| Signal Line | 2203 | 2204 | 2205 | 2206 | 2207 |
|---|---|---|---|---|---|
| Clk0 | | (0,0) | (0,1) | | (0,3) |
| Clk1 | (1,0) | (1,1) | (1,2) | | (1,3) |
| Clk2 | (2,0) | (2,1) | (0,2) | (2,2) | (2,3) |

2262

| Signal Line | 2213 | 2214 | 2215 | 2216 | 2217 |
|---|---|---|---|---|---|
| Clk1 | (0,0) | (0,1) | | | (0,3) |
| Clk2 | (1,0) | (1,1) | | (1,2) | (1,3) |
| Clk3 | (2,0) | (2,1) | | (2,2) | (2,3) |

2264

| Signal Line | 2223 | 2224 | 2225 | 2226 | 2227 |
|---|---|---|---|---|---|
| Clk2 | (0,0) | (0,1) | (0,2) | | (0,3) |
| Clk3 | (1,0) | (1,1) | | (1,2) | (1,3) |
| Clk4 | (2,0) | (2,1) | | (2,2) | (2,3) |

2265

| Signal Line | 2233 | 2234 | | 2236 | 2237 |
|---|---|---|---|---|---|
| Clk3 | (0,0) | (0,1) | | (0,2) | (0,3) |
| Clk4 | (1,0) | (1,1) | | (1,2) | (1,3) |
| Clk5 | (2,0) | (2,1) | | (2,2) | (2,3) |

FIG. 22C

MEMORY DEVICE WITH FAILED MAIN BANK REPAIR USING REDUNDANT BANK

CROSS-REFERENCE TO RELATED APPLICATIONS

This application is a continuation of U.S. application Ser. No. 17/467,190, filed on Sep. 4, 2021, which is a continuation of International Application No. PCT/CN2021/103495, filed on Jun. 30, 2021, entitled "MEMORY DEVICE WITH FAILED MAIN BANK REPAIR USING REDUNDANT BANK," both of which are hereby incorporated by reference in their entireties. This application also claims the benefit of priorities to International Application No. PCT/CN2021/082696, filed on Mar. 24, 2021, entitled "MEMORY DEVICE WITH FAILED MAIN BANK REPAIR USING REDUNDANT BANK," and International Application No. PCT/CN2021/082687, filed on Mar. 24, 2021, entitled "MEMORY DEVICE WITH FAILED MAIN BANK REPAIR USING REDUNDANT BANK," both of which are incorporated herein by reference in their entireties. This application is also related to U.S. application Ser. No. 17/467,192, filed on Sep. 4, 2021, entitled "MEMORY DEVICE WITH FAILED MAIN BANK REPAIR USING REDUNDANT BANK," which is incorporated herein by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory or NAND Flash memory. As the number of memory cells continues increasing in Flash memory, failed (bad) memory cells can occur during the manufacturing of the memory device.

For example, most NAND Flash memory devices are shipped from the foundry with some failed memory cells. These cells are typically identified according to a specified failed cell marking strategy. By allowing some bad cells, manufacturers can achieve higher yields than would be possible if all cells had to be verified to be good. This significantly reduces NAND Flash memory costs and only slightly decreases the storage capacity of the parts.

SUMMARY

In one aspect, a memory device includes an array of memory cells, an input/output (I/O) circuit, and I/O control logic coupled to the I/O circuit. The array of memory cells includes P groups of banks. Each group of banks includes N main banks and a redundant bank such that P redundant banks are included in and shared by the P groups of banks. Each of P and N is a positive integer. The I/O circuit is coupled to the P groups of banks and configured to direct P×N pieces of data to or from P×N working banks, respectively. The I/O control logic is configured to determine the P×N working banks from the P groups of banks based on bank fail information indicative of K failed main banks from the P groups of banks. The P×N working banks include K redundant banks of the P redundant banks. K is a positive integer not greater than P. The I/O control logic is also configured to control the I/O circuit to direct P×N pieces of data to or from the P×N working banks, respectively.

In another aspect, a system includes a memory device configured to store data and a memory controller coupled to the memory device and configured to control the memory device. The memory device includes an array of memory cells, an I/O circuit, and I/O control logic coupled to the I/O circuit. The array of memory cells includes P groups of banks. Each group of banks includes N main banks and a redundant bank such that P redundant banks are included in and shared by the P groups of banks. Each of P and Nis a positive integer. The I/O circuit is coupled to the P groups of banks and configured to direct P×N pieces of data to or from P×N working banks, respectively. The I/O control logic is configured to determine the P×N working banks from the P groups of banks based on bank fail information indicative of K failed main banks from the P groups of banks. The P×N working banks include K redundant banks of the P redundant banks. K is a positive integer not greater than P. The I/O control logic is also configured to control the I/O circuit to direct P×N pieces of data to or from the P×N working banks, respectively.

In still another aspect, a method for operating a memory device is provided. The memory device includes an array of memory cells. The array of memory cells includes P groups of banks. Each group of banks includes N main banks and a redundant bank such that P redundant banks are included in the P groups of banks. Each of P and Nis a positive integer. P×N working banks are determined from the P groups of banks based on bank fail information indicative of K failed main banks from the P groups of banks. The P×N working banks include K redundant banks of the P redundant banks. K is a positive integer not greater than P. P×N pieces of data are directed to or from the P×N working banks, respectively.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 6A and 6B illustrate a failed main bank repair scheme using redundant banks implemented by the memory device in FIG. 5.

FIGS. 10A-10C illustrate an exemplary failed main bank repair scheme using redundant banks implemented by the memory device in FIGS. 7-9, according to some aspects of the present disclosure.

FIGS. 18B-18C illustrate an exemplary failed main bank repair scheme in data input implemented by the memory device in FIG. 18A, according to some aspects of the present disclosure.

FIGS. 19B-19C illustrate an exemplary failed main bank repair scheme in data input implemented by the memory device in FIG. 19A, according to some aspects of the present disclosure.

FIG. 21B illustrates an exemplary failed main bank repair scheme in data output implemented by the memory device in FIG. 21A, according to some aspects of the present disclosure.

FIGS. 22B-22C illustrate an exemplary failed main bank repair scheme in data output implemented by the memory device in FIG. 21A, according to some aspects of the present disclosure.

Figure 1:
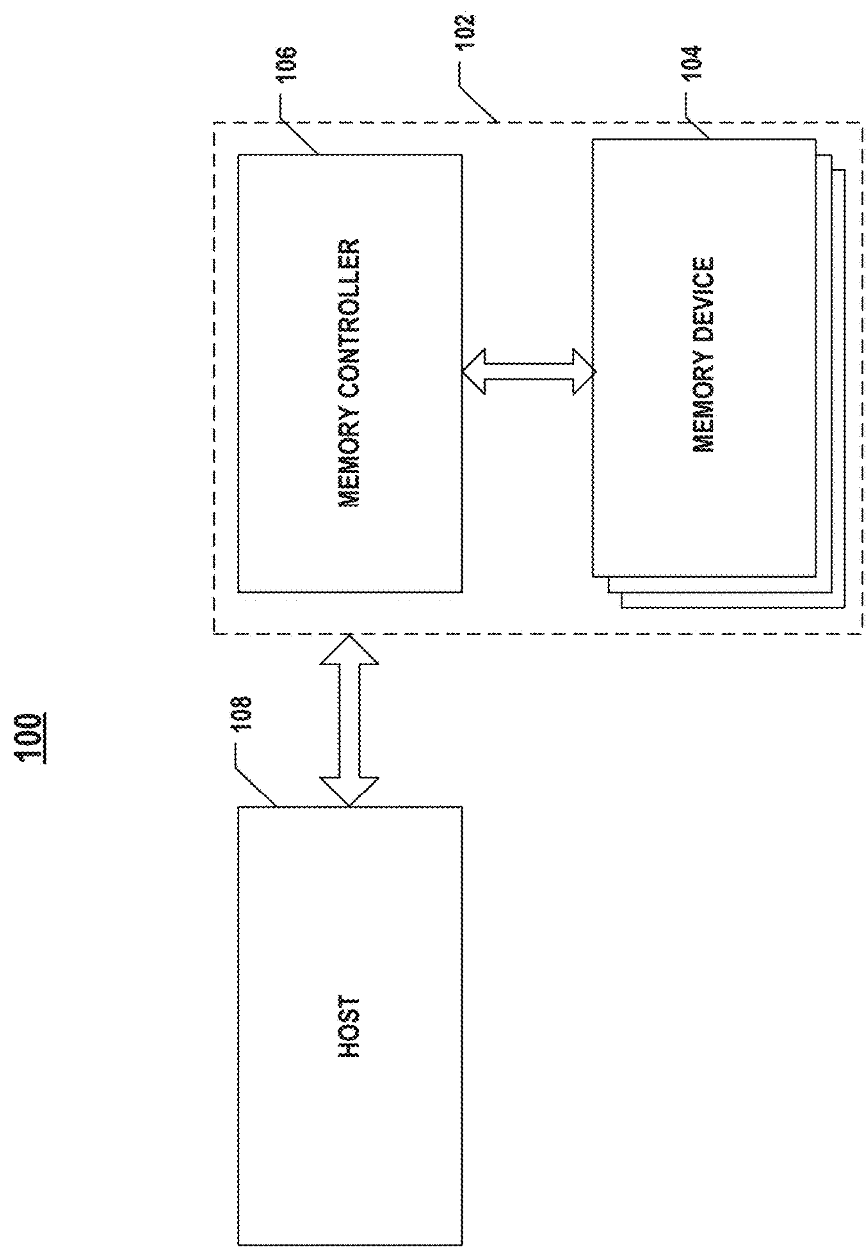
FIG. 1 illustrates a block diagram of an exemplary system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As the number of memory cells continues to increase to meet the continuously increasing demand for larger storage capability, the chance of memory cell failure also increases during the fabrication of memory devices. One way to deal with the failed memory cells is adding redundant memory cell areas (e.g., redundant banks, a.k.a. redundant columns or redundant groups) besides main memory cell areas (e.g., main banks, a.k.a. main columns or main groups). For each memory device, if the number of failed memory cell areas identified during the post-fabrication test is below a limit (e.g., not greater than the number of redundant memory cell areas), then a repair scheme can be employed such that the redundant memory cell areas can replace the failed memory cell areas for reading and writing data when operating the memory device.

Some known memory devices, such as NAND Flash memory devices, can perform concurrent data input/output (I/O) operations to write or read 8 pieces of data (e.g., 8 bytes) to or from 8 physically separated main memory cell areas (e.g., main banks). The same number of 8 redundant memory cell areas (e.g., redundant banks) are coupled to the main memory cell areas, respectively. Once a main memory cell area is identified as a failed main memory cell area, the corresponding redundant memory cell area replaces the failed memory cell area in data input and output, according to the known repair scheme. However, such a repair scheme and redundant bank design have various issues. For example, the large number of redundant banks can waste chip area as oftentimes not all of them may be used. The relatively large number of redundant banks may also affect the flexibility of the repair scheme. Also, the extra routing length to couple each main bank and the respective redundant bank may increase the skew of the data line.

To address one or more of the aforementioned issues, the present disclosure introduces a solution in which a smaller number of redundant banks than the main banks can be used along with a flexible repair scheme to handle failed main banks in memory devices, such as NAND Flash memory devices. Consistent with certain aspects of the present disclosure, multiplexers can be used to couple adjacent banks, such that the input or output data can be shifted between adjacent banks (either main bank or redundant bank). As a result, a redundant bank is no longer dedicated to a specific main bank but instead, can replace any failed main bank without coupling to each main bank. Therefore, the total chip area of redundant banks, as well as the chance of wasting redundant bank area, can both be significantly reduced. Moreover, as each bank is coupled to only adjacent bank(s) due to the data shift-based repair scheme, the skew between each data line can be reduced as well with shortened routing length of data lines. The redundant bank design and data shift-based repair scheme disclosed herein can also increase the repair flexibility even with a smaller number of redundant banks compared with the known approach.

Consistent with certain aspects of the present disclosure, the data shift-based repair scheme disclosed herein can be implemented in a die level (or a plane level) of a memory device. An I/O circuit and I/O control logic used to implement the data shift-based repair scheme can be shared by a plurality of planes in a die (or shared by a plurality of plane sections in a plane). For example, instead of implementing an instance of the I/O circuit and an instance of the I/O control logic in each plane section of every plane, the I/O circuit and the I/O control logic can be implemented in the die and shared by the different planes in the die. Alternatively, an instance of the I/O circuit and an instance of the I/O control logic can be implemented in each plane and shared by different plane sections within the respective plane. As a result, due to a share of the I/O circuit and the I/O control logic across the different planes in the die (or the different plane sections in the respective plane), a circuit area overhead can be reduced, and optimization of a timing control of the data shift-based repair scheme can be implemented more easily.

Consistent with certain aspects of the present disclosure, each group of banks for concurrent data input/output in a memory device may include multiple main banks and a redundant bank. The I/O circuit disclosed herein may include a write MUX array and a read MUX array, with each of the write MUX array and the read MUX array including multiple sub-arrays (e.g., multiple levels of data shifting sub-circuits). In this case, a redundant bank in each group of banks may not only be shared by multiple main banks in the same group, but also shared by one or more other groups of banks to replace any failed main bank in the one or more other groups. Therefore, the total chip area of redundant banks, as well as the chance of wasting redundant bank area, can be further reduced.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. As disclosed below in detail, memory device 104, such as NAND Flash memory device, can include a smaller number of redundant banks than the main banks and implement a flexible, data shift-based repair scheme in data input and output operations to handle failed main banks identified during the post-fabrication test of memory device 104.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
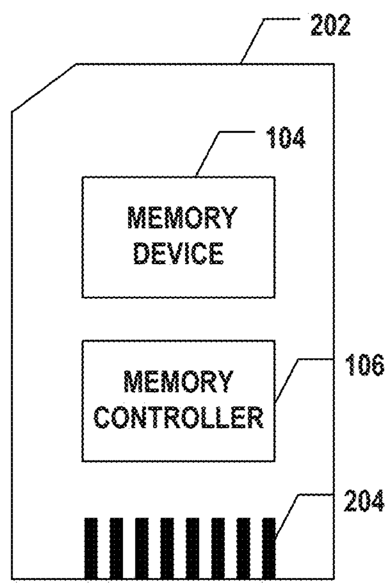
FIG. 2A illustrates a diagram of an exemplary memory card having a memory device, according to some aspects of the present disclosure.
Figure 2B:
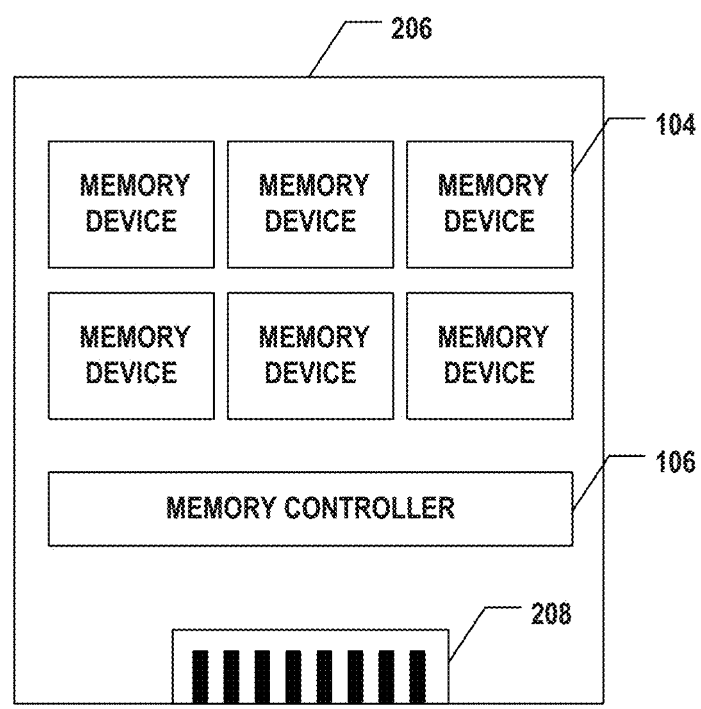
FIG. 2B illustrates a diagram of an exemplary solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
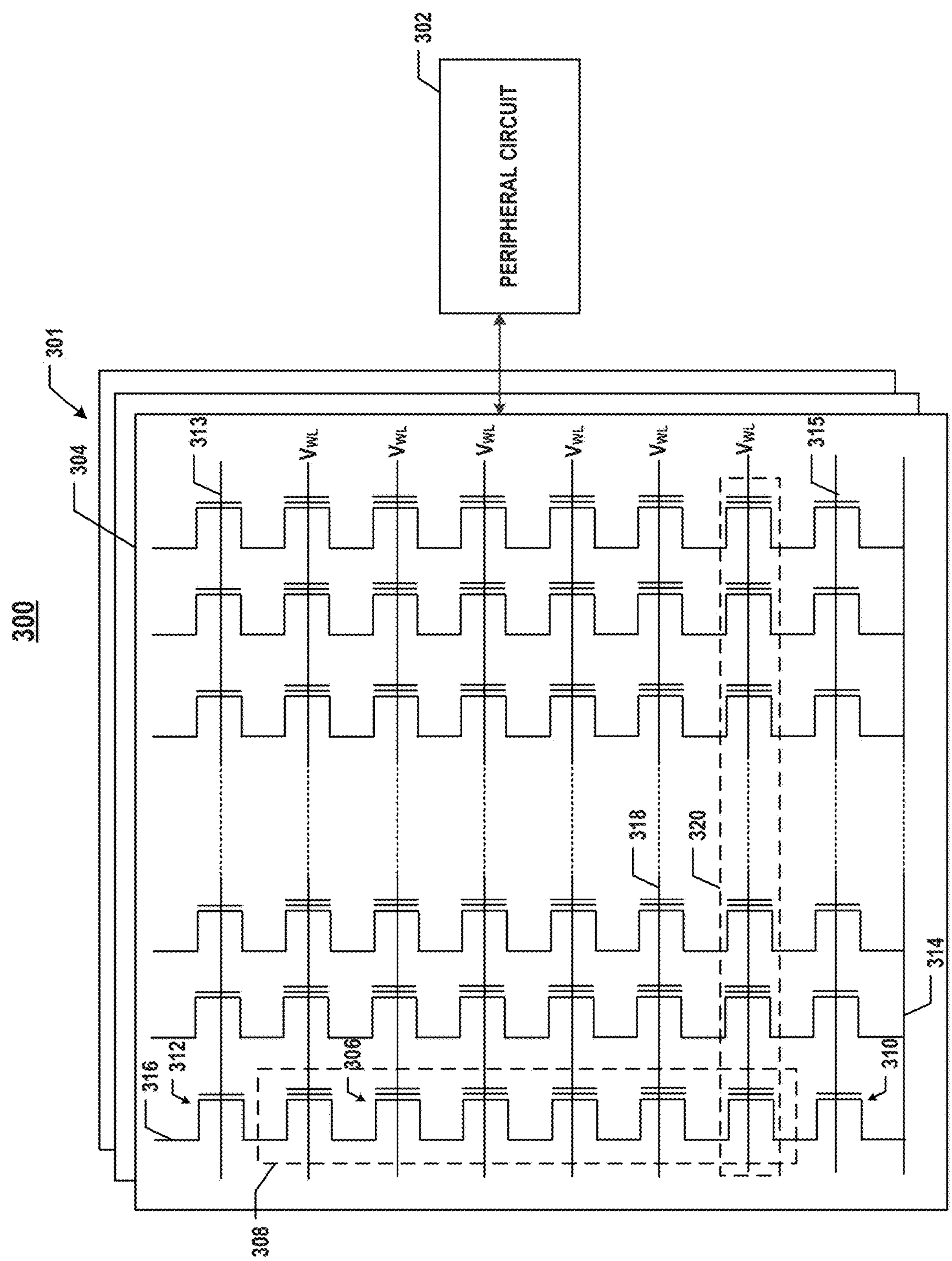
FIG. 3 illustrates a schematic diagram of an exemplary memory device including peripheral circuits, according to some aspects of the present disclosure.

FIG. 3 illustrates a schematic circuit diagram of an exemplary memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can include a source select gate (SSG) 310 at its source end and a drain select gate (DSG) 312 at its drain end. SSG 310 and DSG 312 can be configured to activate selected NAND memory strings 308 (columns of the array) during read and program operations. In some implementations, SSGs 310 of NAND memory strings 308 in the same block 304 are coupled through a same source line (SL) 314, e.g., a common SL, for example, to the ground. DSG 312 of each NAND memory string 308 is coupled to a respective bit line 316 from which data can be read or written via an output bus (not shown), according to some implementations. In some implementations, each NAND memory string 308 is configured to be selected or deselected by applying a select voltage (e.g., above the threshold voltage of the transistor having DSG 312) or a deselect voltage (e.g., 0 V) to respective DSG 312 through one or more DSG lines 313 and/or by applying a select voltage (e.g., above the threshold voltage of the transistor having SSG 310) or a deselect voltage (e.g., 0 V) to respective SSG 310 through one or more SSG lines 315.

As shown in FIG. 3, NAND memory strings 308 can be organized into multiple blocks 304, each of which can have a common source line 314. In some implementations, each block 304 is the basic data unit for erase operations, i.e., all memory cells 306 on the same block 304 are erased at the same time. Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can relate to the number of NAND memory strings 308 coupled by word line 318 in one block 304. Each word line 318 can include a plurality of control gates (gate electrodes) at each memory cell 306 in respective page 320 and a gate line coupling the control gates.

Figure 4:
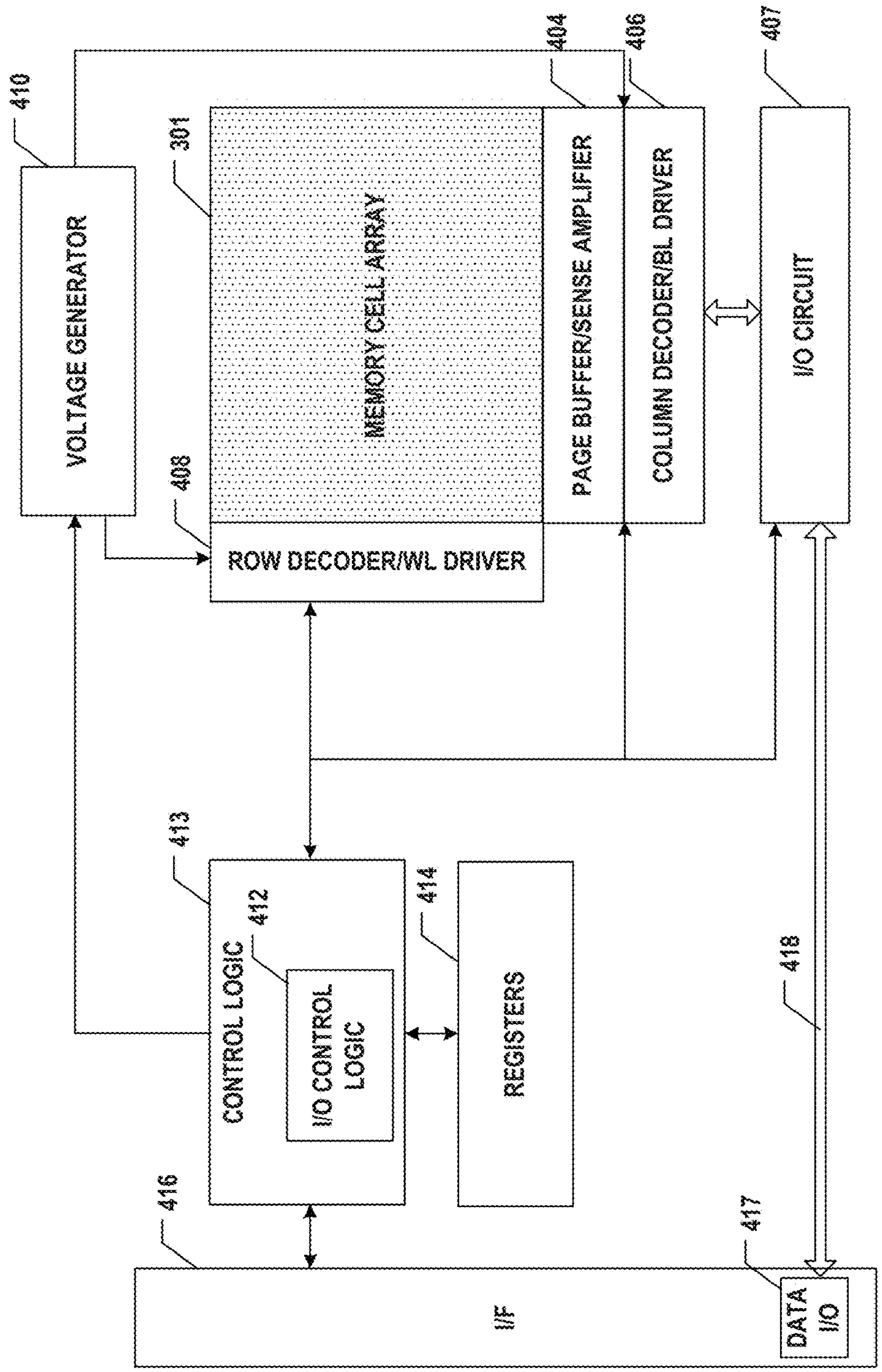
FIG. 4 illustrates a block diagram of an exemplary memory device including a memory cell array and peripheral circuits, according to some aspects of the present disclosure.

Peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 4 illustrates some exemplary peripheral circuits 302 including a page buffer/sense amplifier 404, a column decoder/bit line driver 406, an I/O circuit 407, a row decoder/word line driver 408, a voltage generator 410, control logic 413, registers 414, an interface 416, and a data bus 418. Control logic 413 may include I/O control logic 412 configured to control an operation of I/O circuit 407. It is understood that in some examples, additional peripheral circuits not shown in FIG. 4 may be included as well.

Page buffer/sense amplifier 404 can be configured to read and program (write) data from and to memory cell array 301 according to the control signals from control logic 413. In one example, page buffer/sense amplifier 404 may store one page of program data (write data) to be programmed into one page 320 of memory cell array 301. In another example, page buffer/sense amplifier 404 may perform program verify operations to ensure that the data has been properly programmed into memory cells 306 coupled to selected word lines 318. In still another example, page buffer/sense amplifier 404 may also sense the low power signals from bit line 316 that represents a data bit stored in memory cell 306 and amplify the small voltage swing to recognizable logic levels in a read operation.

Column decoder/bit line driver 406 can be configured to be controlled by control logic 413 and select one or more NAND memory strings 308 by applying bit line voltages generated from voltage generator 410. I/O circuit 407 can be coupled to page buffer/sense amplifier 404 and/or column decoder/bit line driver 406 and configured to direct (route) the data input from data bus 418 to the desired memory cell areas (e.g., banks) of memory cell array 301, as well as the data output from the desired memory cell areas to data bus 418. As described below in detail, I/O circuit 407 can include a write multiplexer (MUX) array and a read MUX array to implement the flexible, data shift-based repair scheme disclosed herein, as controlled by control logic 413 (including I/O control logic 412).

Row decoder/word line driver 408 can be configured to be controlled by control logic 413 and select block 304 of memory cell array 301 and a word line 318 of selected block 304. Row decoder/word line driver 408 can be further configured to drive the selected word line 318 using a word line voltage generated from voltage generator 410. Voltage generator 410 can be configured to be controlled by control logic 413 and generate the word line voltages (e.g., read voltage, program voltage, pass voltage, local voltage, and verification voltage) to be supplied to memory cell array 301.

As part of peripheral circuits 302, control logic 413 can be coupled to other peripheral circuits described above and configured to control the operations of other peripheral circuits. Registers 414 can be coupled to control logic 413 and include status registers, command registers, and address registers for storing status information, command operation codes (OP codes), and command addresses for controlling the operations of each peripheral circuit. Interface 416 can be coupled to control logic 413 and act as a control buffer to buffer and relay control commands received from a host (not shown) to control logic 413 and status information received from control logic 413 to the host. Interface 416 can also be coupled to I/O circuit 407 via data bus 418 and act as a data I/O interface and a data buffer to buffer and relay the write data received from a host (not shown) to I/O circuit 407 and the read data from I/O circuit 407 to the host. For example, interface 416 may include a data I/O 417 coupled to data bus 418.

Figure 5:
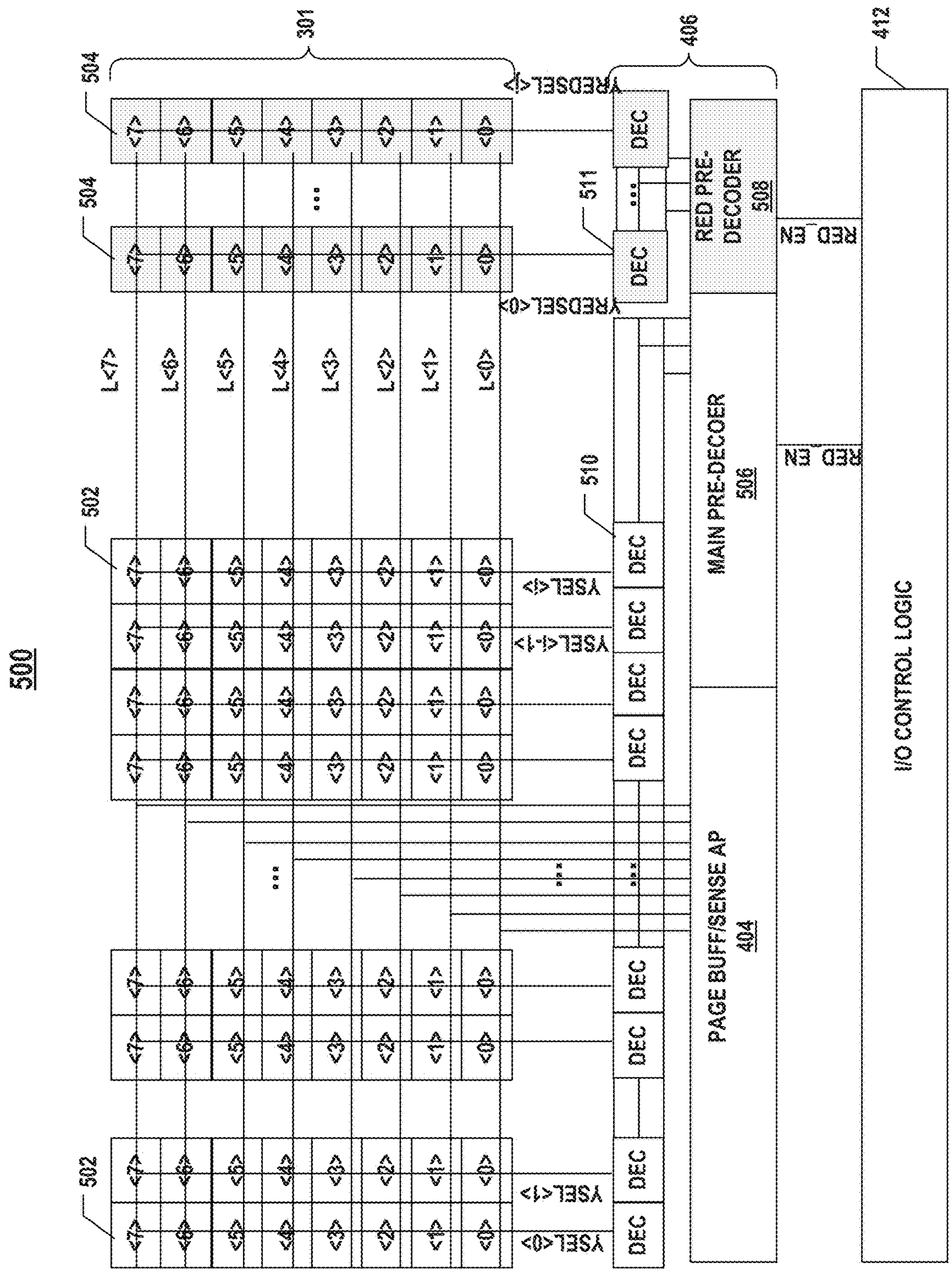
FIG. 5 illustrates a block diagram of a memory device that implements a failed main bank repair scheme using redundant banks.

FIG. 5 illustrates a block diagram of a memory device 500 that implements a failed main bank repair scheme using redundant banks. Memory cell array 301 in memory device 500 includes i sets of 8 main banks 502 (<0> . . . and <7>) and j sets of 8 redundant banks 504 (<0> . . . and <7>), and each main bank 502 is coupled to a respective redundant bank 504 via a respective data line (L<0> . . . , or L<7>). That is, each main bank 502 has its dedicated redundant bank 504 as its backup in case main bank 502 is identified as a failed main bank during the post-fabrication test. Memory device 500 is capable of concurrently inputting or outputting 8 pieces of data (e.g., 8 bytes) into 8 main banks 502, respectively. Memory device 500 includes i sets of 8 main banks 502 and j sets of 8 redundant banks 504.

Column decoder/bit line driver 406 of memory device 500 includes i main decoders 510 respectively coupled to i sets of 8 main banks 502 banks, and j redundant decoders 511 respectively coupled to j sets of 8 redundant banks 504. Column decoder/bit line driver 406 of memory device 500 also includes a main pre-decoder 506 coupled to i main decoders 510, and a redundant (RED) pre-decoder 508 coupled to j redundant decoders 511. I/O control logic 412 of memory device 500 implements a failed main bank repair scheme by controlling main pre-decoder 506 and redundant pre-decoder 508 through control signals, such as redundant enable signals (RED_EN). Based on the control signals from I/O control logic 412, main pre-decoder 506 causes each of i main decoders 510 to disable any of 8 main banks 502, which is a failed main bank, in the respective main bank set using select/deselect signals (YSEL<0> . . . , and YSEL<i>). On the other hand, based on the control signals from I/O control logic 412, redundant pre-decoder 508 causes each of j redundant decoder 511 to enable any of 8 redundant banks 504, which is coupled to the corresponding failed main bank through a respective bit line, in the respective redundant bank set using select/deselect signals (YREDSEL<0> . . . , and YREDSEL<j>). Page buffer/sense amplifier 404 of memory device 500 is shared by main banks 502 and redundant banks 504 for read and write operations.

FIGS. 6A and 6B illustrate a failed main bank repair scheme using redundant banks implemented by memory device 500 in FIG. 5. FIGS. 6A and 6B show one set of 8 main banks 502 and one set of 8 redundant banks 504. 8 main banks 502 include bank 0 low (B0_L), bank 0 high (B0_H), bank 1 low (B1_L), bank 1 high (B1_H), bank 2 low (B2_L), bank 2 high (B2_H), bank 3 low (B3_L), and bank 3 high (B3_H). Eight main banks 502 are separated from one another, meaning that a piece of data directed to one main bank 502 cannot be re-directed to another main bank 502 as they are not coupled by a data line. Instead, each main bank 502 is coupled to a respective redundant bank 504 (the adjacent one on the right as shown in FIGS. 6A and 6B) through a data line therebetween (e.g., L<0> . . . , or L<7> in FIG. 5).

FIG. 6A illustrates a case in which all 8 main banks 502 are working banks, i.e., no failed main bank identified by the post-fabrication test. In this case, the first 8 pieces of data (0 . . . , and 7) are respectively directed to or from 8 main banks 502, while all 8 redundant banks 504 are not used, i.e., without data (labeled as “x”). Similarly, the second 8 pieces of data (8 . . . , and 15) are again respectively directed to or from 8 main banks 502, while all 8 redundant banks 504 remain unused, i.e., without data (labeled as “x”).

FIG. 6B illustrates cases in which one of 8 main banks 502 is a failed main bank identified by the post-fabrication test. In one example in which B2_H is a failed main bank, 7 of the first 8 pieces of data (0, 1, 2, 3, 4, 6, and 7) are respectively directed to or from 7 working main banks 502 (except for B2_H), while data (5) is re-directed to or from B2_H. That is, failed main bank B2_H is replaced by its dedicated backup—redundant bank 504 coupled to B2_H for data input and output. In another example in which B0_L is a failed main bank, 7 of the second 8 pieces of data (9 . . . , and 15) are respectively directed to or from 7 working main banks 502 (except B0_L), while data (8) is re-directed to or from redundant bank 504 coupled to B0_L. That is, failed main bank B0_L is replaced by its dedicated backup—redundant bank 504 coupled to B0_L for data input and output.

As described above, the redundant bank design and the associated repair scheme illustrated in FIGS. 5, 6A, and 6B suffer from various problems. First, 7 out of 8 redundant banks 504 are wasted, and only one of redundant banks 504 is used for repairing one failed main bank. Second, the repair scheme lacks flexibility since a failed main bank can only be replaced by a pre-assigned dedicated redundant bank 504. Third, each main bank 502 needs to be coupled to a respective redundant bank 504 through a data line, which increases the routing length of the data line and the skew of the data line.

To overcome one or more of those issues, the present disclosure provides an improved redundant bank design having a smaller number of redundant banks and an associated flexible, data shift-based repair scheme. Consistent with the scope of the present disclosure, a memory device can include an array of memory cells (e.g., memory cell array 301 in FIGS. 3 and 4), an I/O circuit (e.g., I/O circuit 407 in FIG. 4), and control logic (e.g., I/O control logic 412 in FIG. 4). The array of memory cells can include N main banks and M redundant banks, where each of N and M is a positive integer, and N is greater than M. That is, the array of memory cells can have a smaller number of redundant banks than the main banks. It is understood that similar to memory device 500 in FIG. 5, the array of memory cells may include multiple sets of the N main banks as well as multiple sets of the M redundant banks. Nevertheless, N is the number of pieces of data that can be concurrently inputted to (write/program) and outputted from (read) the array of memory cells. It is also understood that the term "bank" used herein (either in the contexts of "main bank," "redundant bank," or "working bank") may refer to a memory cell area in which one of the N pieces of concurrent data is directed to or from. A bank may be, for example, part of a page, a block, or a plane in the array of memory cells.

The I/O circuit can be coupled to the N main banks and the M redundant banks and configured to direct N pieces of data to or from N working banks, respectively. In some implementations, the I/O circuit is coupled to each pair of adjacent banks of the N main banks and the M redundant banks, such that the I/O circuit is configured to direct one piece of data of the N pieces of data to or from either bank of the pair of adjacent banks (e.g., see FIGS. 7 and 8 below).

Figure 7:
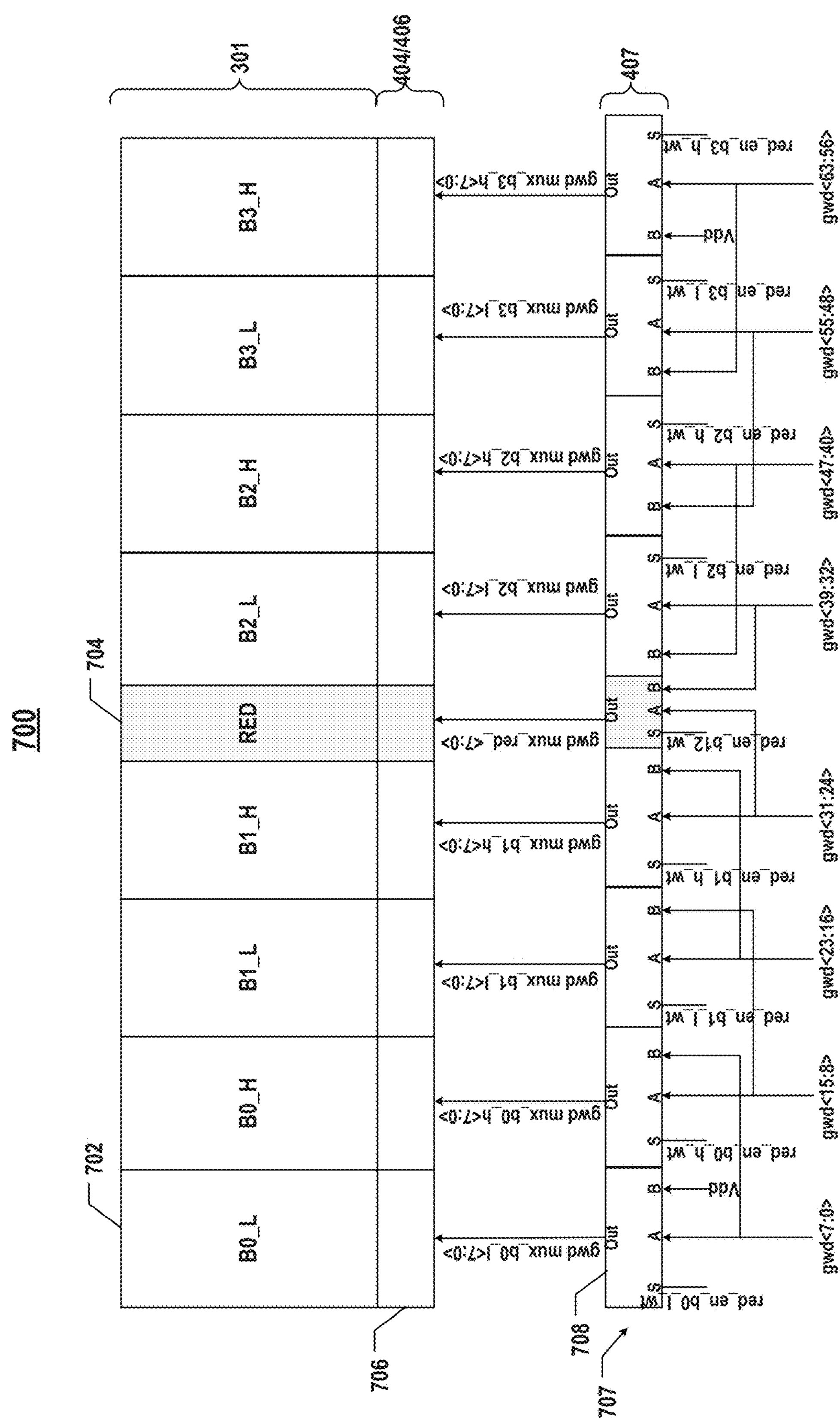
FIG. 7 illustrates a block diagram of an exemplary memory device that implements a failed main bank repair scheme using redundant banks in data input, according to some aspects of the present disclosure.
Figure 8:
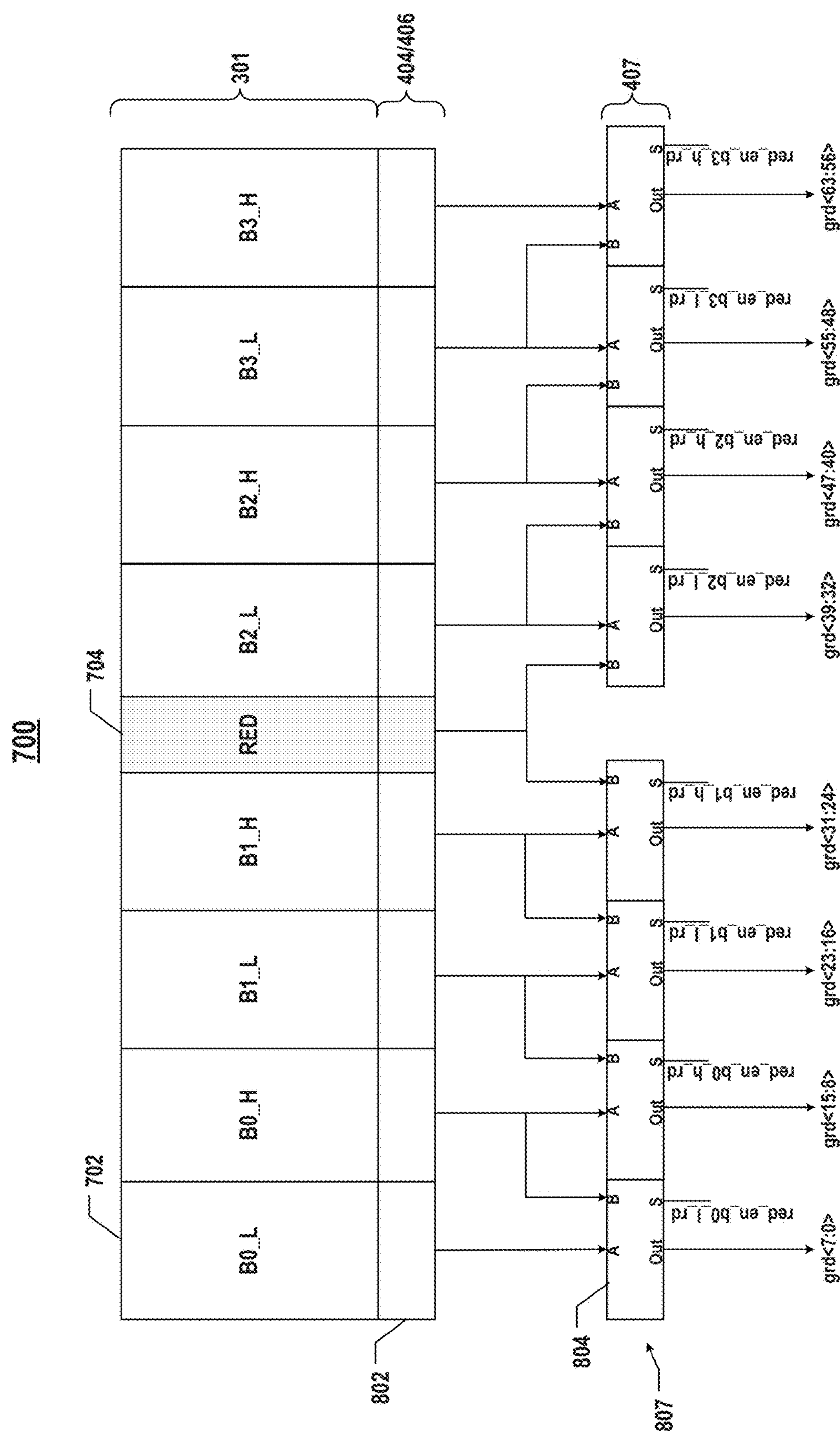
FIG. 8 illustrates a block diagram of an exemplary memory device that implements a failed main bank repair scheme using redundant banks in data output, according to some aspects of the present disclosure.

In some implementations, M equals 1. That is, a single redundant bank can be used to repair a set of N (2, 3, 4, 5, etc.) main banks, which can significantly reduce the chip area of redundant banks and the waste of unused redundant banks. For example, FIGS. 7 and 8 illustrate block diagrams of an exemplary memory device 700 that implements a failed main bank repair scheme using redundant banks in data input and data output, respectively, according to some aspects of the present disclosure. Memory device 700 may be an example of memory device 300 in FIGS. 3 and 4. For ease of description, details of components in memory device 300 may be omitted in describing memory device 700 and may be similarly applied to memory device 700. As shown in FIGS. 7 and 8, memory device 700 can include memory cell array 301 having 8 main banks 702 (B0_L, B0_H, B1_L, B1_H, B2_L, B2_H, B3_L, and B3_H), and 1 redundant bank 704 (RED). That is, N equals 8, and M equals 1 in memory device 700. In other words, memory cell array 301 includes 9 banks, which includes 8 main banks 702 and 1 redundant bank 704, according to some implementations.

I/O circuit 407 can be coupled to 8 main banks 702 and 1 redundant bank 704, for example, through page buffer/sense amplifier 404 and column decoder/bit line driver 406. In some implementations shown in FIG. 7, in data input (e.g., write operation), page buffer/sense amplifier 404 and column decoder/bit line driver 406 include 9 drivers 706 respectively coupled to 8 main banks 702 and 1 redundant banks 704. In some implementations shown in FIG. 8, in data output (e.g., read operation), page buffer/sense amplifier 404 and column decoder/bit line driver 406 include 9 sense amplifiers 802 respectively coupled to 8 main banks 702 and 1 redundant bank 704.

I/O circuit 407 can be configured to direct 8 pieces of data to or from 8 working banks, respectively. In some implementations shown in FIG. 7, in data input, I/O circuit 407 is configured to direct 8 pieces of input data (e.g., write data: gwd <7:0>, gwd <15:8>, gwd <23:16>, gwd <31:24>, gwd <39:32>, gwd <47:40>, gwd <55:48>, and gwd <63:56>) to 8 working banks of the 9 banks (i.e., 8 main banks 702 and 1 redundant bank 704), for example, 7 main banks 702 and 1 redundant bank 704. In some implementations shown in FIG. 8, in data output, I/O circuit 407 is configured to direct 8 pieces of output data (e.g., read data: grd <7:0>, grd <15:8>, grd <23:16>, grd <31:24>, grd <39:32>, grd <47:40>, grd <55:48>, and grd <63:56>) from 8 working banks of the 9 banks, for example, 7 main banks 702 and 1 redundant bank 704. As shown in FIGS. 7 and 8, in some implementations, I/O circuit 407 is coupled to each pair of adjacent banks, such that I/O circuit 407 is configured to direct one piece of write data (gwd) to either bank of the pair of adjacent banks or direct one piece of read data (grd) from either bank of the pair of adjacent banks. The pair of adjacent banks can be either both main banks 702 or one main bank 702 and one redundant bank 704. In some implementations, redundant bank 704 is coupled to two main banks 702 through I/O circuit 407. It is understood that although redundant bank 704 is coupled to two main banks 702 (B1_H and B2_L), respectively, by I/O circuit 407 in the middle of 8 main banks 702 as shown in FIGS. 7 and 8, in some examples, redundant bank 704 may be coupled to any two main banks 702, respectively, by I/O circuit 407 or coupled to only one main bank 702 (e.g., B0_L or B3_H) at the end of 8 main banks 702.

I/O circuit 407 can be implemented with one or more MUX arrays. In some implementations as shown in FIG. 7, I/O circuit 407 of memory device 700 includes a write MUX array 707. Write MUX array 707 may include a set of 9 write MUXs 708 respectively coupled to 8 main banks 702 and 1 redundant bank 704 for data input. Each write MUX 708 can include an output (Out), two inputs (A and B), and a select port (S). The output of each write MUX 708 is coupled to a respective bank 702 or 704. The select port of write MUX 708 can be configured to receive a write select signal (red_en_b0_1_wt, . . . , red_en_b12_wt, . . . , or red_en_b3_h_wt) indicative the selection of one input (A or B). For example, a positive bias write select signal, i.e., the write select signal is enabled, may select input B.

In some implementations, except for write MUXs 708 coupled to the two main banks 702 (B0_L and B3_H) at the ends (i.e., coupled to only one another main bank 702), each write MUX 708 coupled to a respective main bank 702 has two inputs configured to input two pieces of data, respectively, including one piece of write data intended for respective main bank 702 and another piece of write data intended for adjacent main bank 702. For example, write MUX 708 coupled to B0_H may have input A configured to input write data gwd<15:8> and input B configured to input write data gwd<7:0>.

As to write MUX 708 coupled to redundant bank 704, it can have two inputs configured to input two pieces of data, respectively, including one piece of write data intended for one adjacent main bank 702 and another piece of write data intended for another adjacent main bank 702. For example, write MUX 708 coupled to RED may have input A configured to input write data gwd<31:24> and input B configured to input write data gwd<39:32>.

As to write MUXs 708 coupled to the two main banks 702 (B0_L and B3_H) at the ends, one of its input can be configured to input one piece of write data intended for respective main bank 702, and another one of its input can be configured to input a signal indicative of data inhibit, for example, a system voltage Vdd, due to bank failure. As a result, each piece of write data can be coupled to two inputs of two adjacent banks and be inputted to either input of the two adjacent banks.

In some implementations as shown in FIG. 8, I/O circuit 407 of memory device 700 includes a read MUX array 807. Read MUX array 807 may include a set of 8 read MUXs 804 coupled to 8 main banks 702 and 1 redundant bank 704 for data output. Each read MUX 804 can include an output (Out), two inputs (A and B), and a select port (S). The select port of read MUX 804 can be configured to receive a read select signal (red_en_b0_1_rd, . . . , or red_en_b3_h_rd) indicative of the selection of one input (A or B). For example, a positive bias read select signal, i.e., the read select signal is enabled, may select input B.

In some implementations, each read MUX 804 has two inputs coupled to two adjacent banks. For example, the left-most read MUX 804 may have input A coupled to B0_L and input B coupled to B0_H; a middle read MUX 804 may have input A coupled to B1_H and input B coupled to RED. In other words, except for the two main banks 702 (B0_L and B3_H) at the ends, each bank 702 or 704 can be coupled to the inputs of two read MUXs 804, respectively. The output of each read MUX 804 can be configured to output one piece of data from either input A or B, i.e., either piece of data stored in two adjacent banks, based on the respective read select signal. For example, the read data gwd<7:0> outputted from the left-most read MUX 804 may be from either B0_L or B0_H; the read data gwd<31:24> outputted from a middle read MUX 804 may be from either B1_H or RED.

As described above with respect to FIGS. 7 and 8, I/O circuit 407 can be coupled to each pair of adjacent banks and configured to direct a piece of data to or from either bank of each pair of adjacent banks. It is understood that although the exemplary designs of write MUX array 707 and read MUX array 807 in I/O circuit 407 are described above with respect to memory device 700, which has 8 main banks 702 and 1 redundant bank 704, a similar design may be generally applied to a memory device that has N main banks and M redundant banks, where each of N and M is a positive integer, and N is great than M. Based on the design of redundant banks in the memory cell array and the MUX arrays in the I/O circuit, a flexible, data shift-based repair scheme can be implemented. I/O control logic can be coupled to the I/O circuit and configured to determine the N working banks from the N main banks and the M redundant banks based on bank fail information indicative of K failed main banks of the N main banks. The N working banks can include K redundant banks of the M redundant banks, where K is a positive integer not greater than M. I/O control logic 412 can be further configured to control the I/O circuit to direct K pieces of data of the N pieces of data to or from the K redundant banks, respectively.

Figure 9:
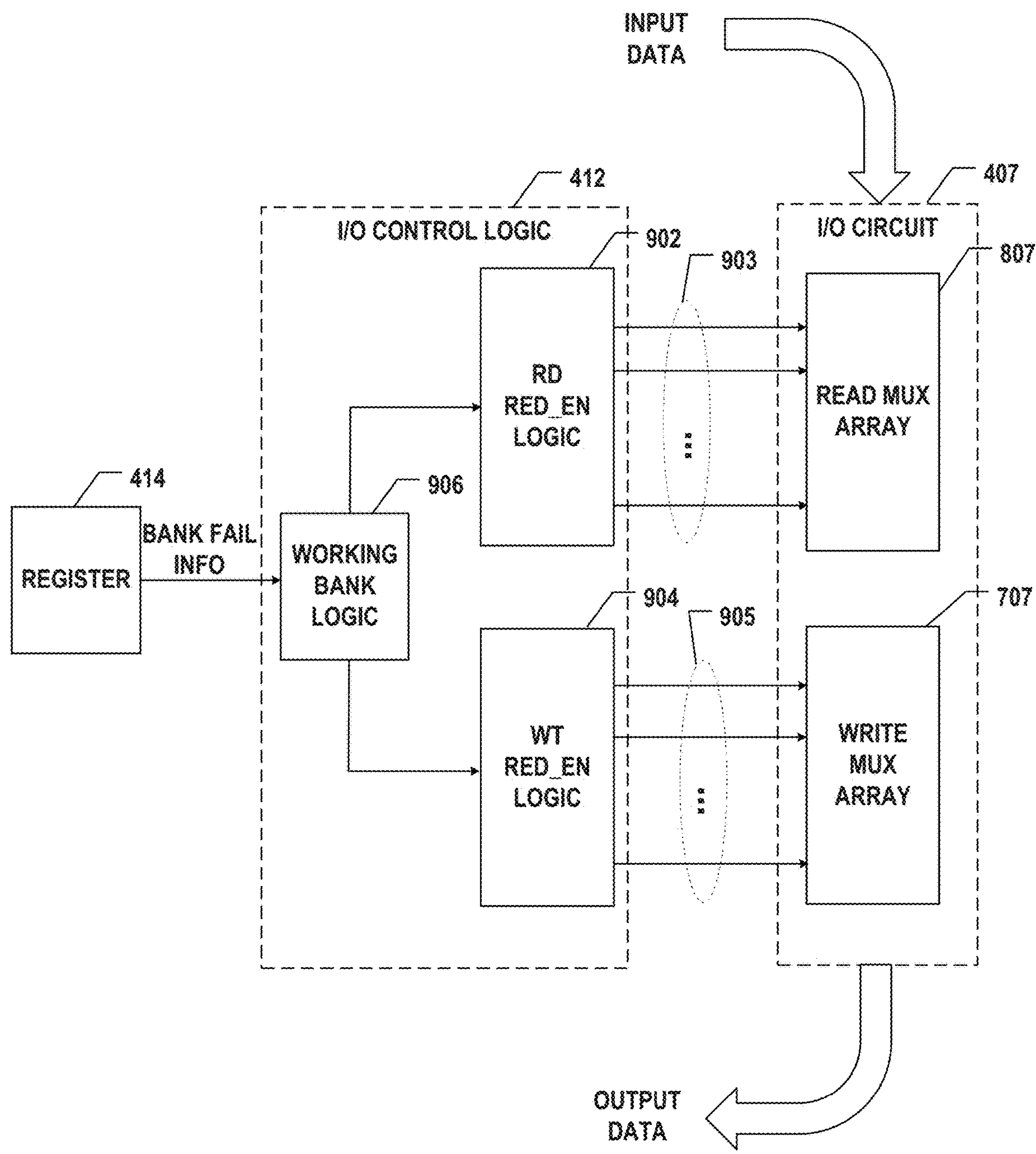
FIG. 9 illustrates a block diagram of exemplary I/O control logic in a memory device, according to some aspects of the present disclosure.

For example, as shown in FIG. 9, I/O control logic 412 may include read redundant enable logic 902, write redundant enable logic 904, and working bank logic 906. Each logic 902, 904, or 906 can be implemented by microprocessors, microcontrollers (a.k.a. microcontroller units (MCUs)), digital signal processors (DSPs), application-specific integrated circuits (ASICs), field-programmable gate arrays (FPGAs), programmable logic devices (PLDs), state machines, gated logic, discrete hardware circuits, and other suitable hardware, firmware, and/or software configured to perform the various functions described below in detail. In some implementations, one or more of read redundant enable logic 902, write redundant enable logic 904, and working bank logic 906 are implemented with content-addressable memory (CAM).

In some implementations, working bank logic 906 is coupled to registers 414 and configured to obtain the bank fail information indicative of one or more failed main banks of the main banks of a memory device (e.g., memory device 700), for example, K failed main banks of the N main banks. During the post-fabrication test, bad (non-functional) memory cells can be detected from the memory device, and each main bank including at least one bad memory cell can be identified as a failed main bank. In some implementations, the bank fail information indicates each of the failed main banks of the memory device and is saved in the memory device, for example, in register 414. Thus, each memory device may have its own bank fail information. Before operating the memory device, working bank logic 906 can obtain the bank fail information from registers 414 and determine the N working banks of the memory device that can be used for data input and output. The number (N) of the working banks is the same as the (N) number of pieces of concurrent input/output data (e.g., 8 in memory device 700), according to some implementations. That is, working bank logic 906 can replace the K failed main banks with the same number (K) of redundant banks, such that the N working banks can include K redundant banks and N−K main banks. In memory device 700, one failed main bank of 8 main banks 702 can be replaced with redundant bank 704 to form 8 working banks, as determined by working bank logic 906 of I/O control logic 412.

Based on the determined N working banks, read redundant enable logic 902 and write redundant enable logic 904 can be configured to control I/O circuit 407 to direct K pieces of data of the N pieces of data to or from the K redundant banks, respectively. In some implementations, for data input, write redundant enable logic 904 is coupled to write MUXs 708 in write MUX array 707 of I/O circuit 407, and is configured to provide a plurality of write select signals 905 to write MUXs 708. For example, write redundant enable logic 904 is coupled to 9 write MUXs 708 of I/O circuit 407 and configured to provide 9 write select signals (e.g., red_en_b0_1_wt, red_en_b12_wt and red_en_b3_h_wt)) to 9 write MUXs 708, respectively, based on the determined 8 working banks. In some implementations, for data output, read redundant enable logic 902 is coupled to read MUXs 804 in read MUX array 807 of I/O circuit 407, and is configured to provide a plurality of read select signals 903 to read MUXs 804. For example, read redundant enable logic 902 is coupled to 8 read MUXs 804 and configured to provide 8 read select signals (e.g., red_en_b0_1_rd, . . . , and red_en_b3_h_rd)) to 8 read MUXs 804, respectively, based on the determined 8 working banks. In some implementations, read redundant enable logic 902 and write redundant enable logic 904 also provide synchronization signals to the strobe clocks of read MUXs 804 and write MUXs 708, respectively, to align data and the select signals.

Each select signal can be enabled (e.g., positive biased) or disabled (e.g., negative biased) based on the K failed main banks. In some implementations, if a first bank of a pair of adjacent banks is one failed main bank of the K failed main banks, read redundant enable logic 902 and write redundant enable logic 904 are configured to control I/O circuit 407 to direct the piece of data to or from a second bank of the pair of adjacent banks. That is, I/O control logic 412 is configured to select one bank of each pair of adjacent banks based on bank fail information and control I/O circuit 407 to direct the piece of data to or from the selected bank of each pair of adjacent banks, according to some implementations.

Referring now to FIG. 7, in data input, write redundant enable logic 904 can be configured to control a first write MUX 708 coupled to the first bank (i.e., a failed main bank) to inhibit inputting the piece of data from input A of first write MUX 708 and outputting the piece of data to the first bank. Instead, write redundant enable logic 904 can be configured to control a second write MUX 708 coupled to the second bank (e.g., a main bank 702 or redundant bank 704 adjacent to the first bank) to enable inputting the piece of data from input B of second write MUX 708 and outputting the piece of data to the second bank. That is, the piece of data intended for a failed main bank can be re-directed to its adjacent bank, either a main bank 702 or a redundant bank 704, by write MUX 708 coupled to the failed main bank as controlled by write redundant enable logic 904. The same operation can be applied to each pair of adjacent banks, such that data input is shifted between adjacent banks.

For example, assuming B0_L is a failed main bank, write redundant enable logic 904 may enable red_en_b0_1_wt and red_en_b0_h_wt, such that Vdd is inputted to B0_L from input B, and gwd<7:0> is re-directed and inputted to B0_H from input B. To shift data input, write redundant enable logic 904 may also enable red_en_b1_1_wt and red_en_b1_h_wt, such that gwd<15:8> is re-directed and inputted to B1_L from input B, and gwd<23:16> is re-directed and inputted to B1_H from input B. Write redundant enable logic 904 may further disable red_en_b12_wt such that gwd<31:24> is re-directed and inputted to RED from input A. That is, the input data may be shifted from the failed main bank B0_L to the redundant bank RED, accordingly. For other main banks B2_L, B2_H, B3_L, and B3_H, no input data shift may be needed, such that write redundant enable logic 904 may disable red_en_b2_1_wt, red_en_b2_h_wt, red_en_b3_1_wt, and red_en_b3_h_wt. As a result, each of B2_L, B2_H, B3_L, and B3_H may still input data from inputs A without data shift.

Referring now to FIG. 8, in data output, read redundant enable logic 902 can be configured to control read MUX 804 coupled to the first and second banks (i.e., a failed main bank and a main bank 702 or redundant bank 704 adjacent to the failed main bank) to enable outputting the piece of data from the second bank (e.g., main bank 702 or redundant bank 704 adjacent to the failed main bank). That is, the piece of data intended for the failed main bank can be re-directed from its adjacent bank, either main bank 702 or redundant bank 704, by read MUX 804 as controlled by read redundant enable logic 902. The same operation can be applied to each pair of adjacent banks, such that data output is shifted between adjacent banks.

For example, assuming B0_L is a failed main bank, read redundant enable logic 902 may enable red_en_b0_1_rd, such that grd<7:0> is re-directed and outputted from B0_H coupled to input B. To shift data output, read redundant enable logic 902 may also enable red_en_b0_h_rd, red_en_b1_1_rd, and red_en_b1_h_rd, such that grd<15:8> is re-directed and outputted from B1_L coupled to input B, grd<23:16> is re-directed and outputted from B1_H coupled to input B, and grd<31:24> is re-directed and outputted from RED coupled to input B. That is, the output data may be shifted from the failed main bank B0_L to the redundant bank RED, accordingly. For other main banks B2_L, B2_H, B3_L, and B3_H, no output data shift may be needed, such that read redundant enable logic 902 may disable red_en_b2_1_rd, red_en_b2_h_rd, red_en_b3_1_rd, and red_en_b3_h_rd. As a result, data may still be outputted from B2_L, B2_H, B3_L, and B3_H from inputs A without data shift.

Figure 10B:
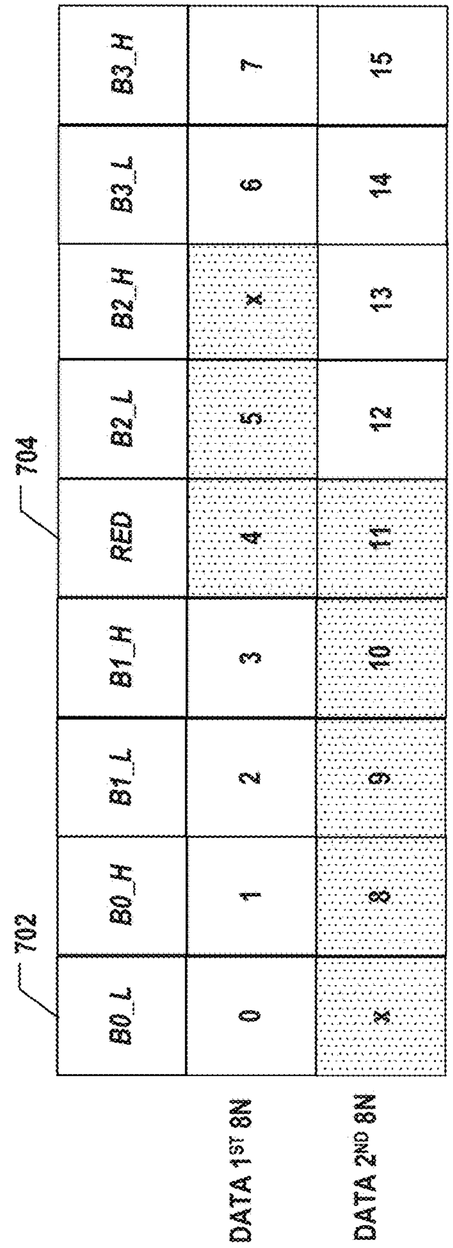
Figure 10C:
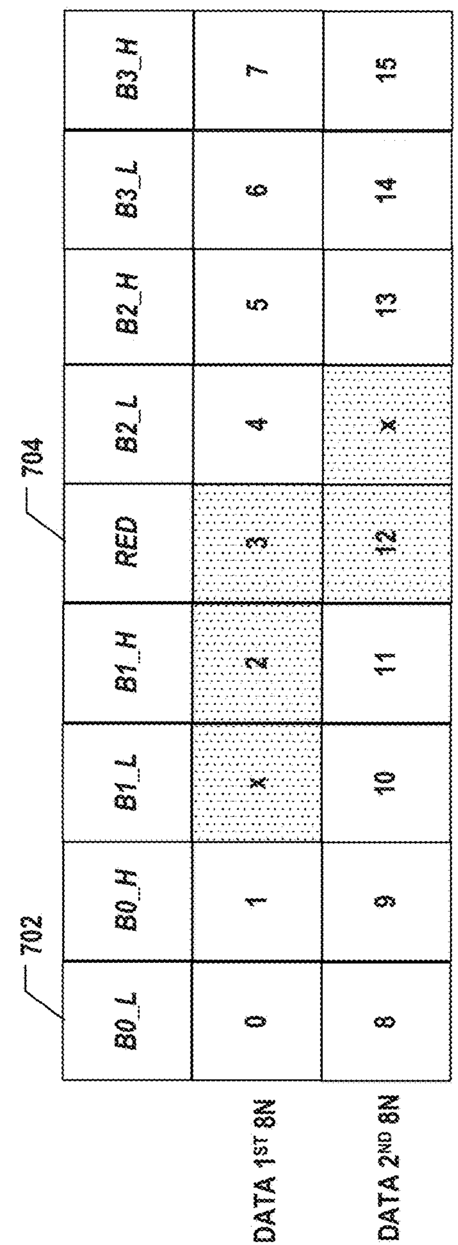

FIGS. 10A-10C illustrate further examples of the failed main bank repair scheme using redundant bank 704 implemented by memory device 700, according to some aspects of the present disclosure. FIG. 10A illustrates a case in which all 8 main banks 702 are working banks, i.e., no failed main bank identified by the post-fabrication test. In this case, the first 8 pieces of data (0, . . . , and 7) may be respectively directed to or from 8 main banks 702, while redundant bank 704 may not be used, i.e., without data (labeled as "x"). Similarly, the second 8 pieces of data (8 . . . , and 15) may be again respectively directed to or from 8 main banks 702, while redundant bank 704 may remain unused, i.e., without data (labeled as "x").

FIGS. 10B and 10C illustrate cases in which one of 8 main banks 702 is a failed main bank identified by the post-fabrication test. As shown in FIG. 10B, in one example in which B2_H is a failed main bank, the first 4 of the first 8 pieces of data (1, 2, 3, and 4) may be respectively directed to or from the 4 corresponding working main banks B0_L, B0_H, B1_L, and B1_H, which are separated by redundant bank 704 from B2_H. Data (5) intended for B2_H may be re-directed to adjacent working main bank B2_L, and data (4) intended for B2_L may be re-directed to redundant bank 704 (data shifting left). B2_H may become unused. That is, data shift may occur between B2_H and redundant bank 704. The last 2 of the first 8 pieces of data (6 and 7) may be respectively directed to or from the 2 corresponding working main banks B3_L and B3_H without data shift. In another example in which B0_L is a failed main bank, the first 4 of the second 8 pieces of data (8, 9, 10, and 11) may be respectively re-directed to or from adjacent working main banks B0_H, B1_L, and B1_H as well as redundant bank 704 (data shifting right). B0_L may become unused. That is, data shift may occur between B0_L and redundant bank 704. The last 4 of the second 8 pieces of data (12, 13, 14, and 15) may be respectively directed to or from the 4 corresponding working main banks B2_L, B2_H, B3_L, and B3_H without data shift.

As shown in FIG. 10C, in one example in which B1_L is a failed main bank, the first 2 of the first 8 pieces of data (0 and 1) may be respectively directed to or from the 2 corresponding working main banks B0_L and B0_H. The next 2 of the first 8 pieces of data (2 and 3) may be respectively re-directed to or from adjacent working main bank B1_H as well as redundant bank 704 (data shifting right). B1_L may become unused. That is, data shift may occur between B1_L and redundant bank 704. The last 4 of the second 8 pieces of data (4, 5, 6, and 7) may be respectively directed to or from the 4 corresponding working main banks B2_L, B2_H, B3_L, and B3_H without data shift. In another example in which B2_L is a failed main bank, the first 4 of the second 8 pieces of data (8, 9, 10, and 11) may be respectively directed to or from corresponding working main banks B0_L, B0_H, B1_L, and B1_H, which are separated by redundant bank 704 from B2_L. Data (12) intended for B2_L may be re-directed to or from redundant bank 704 (data shifting left), and B2_L may become unused. That is, data shift may occur between B2_L and redundant bank 704. The last 3 of the second 8 pieces of data (13, 14, and 15) may be respectively directed to or from the 3 corresponding working main banks B2_H, B3_L, and B3_H without data shift.

Figure 11:
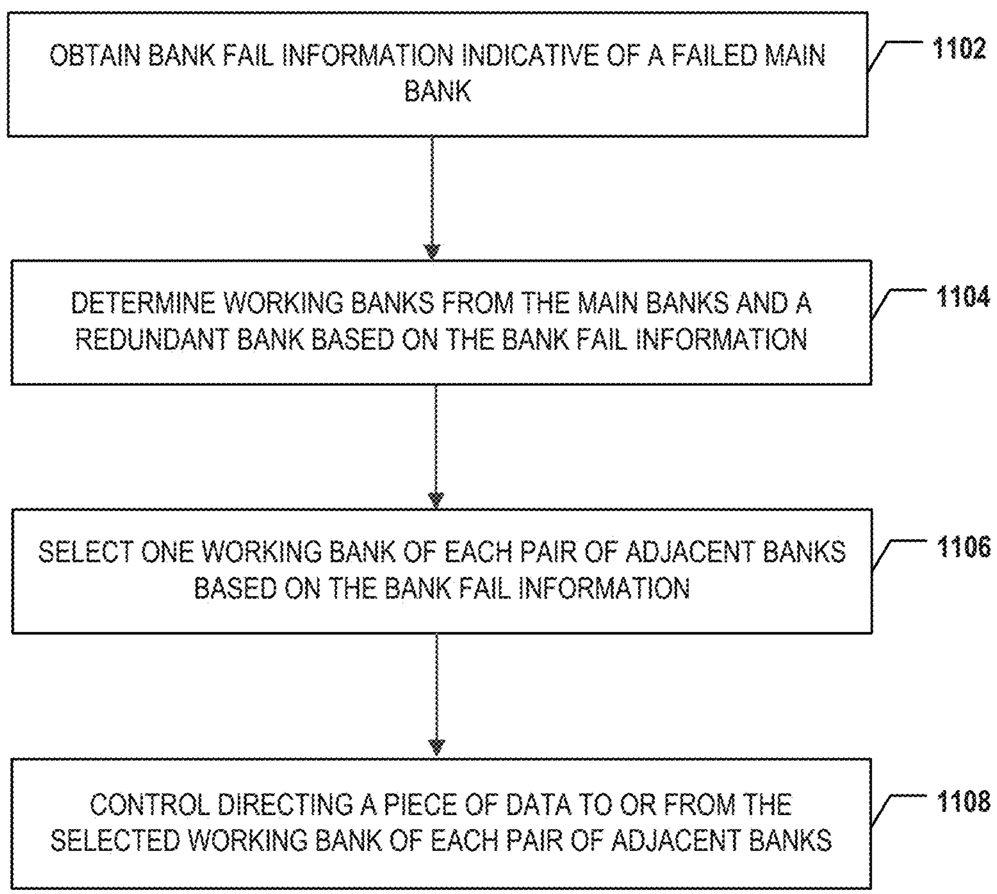
FIG. 11 illustrates a flowchart of an exemplary method for operating a memory device having a failed main bank and a redundant bank, according to some aspects of the present disclosure.

FIG. 11 illustrates a flowchart of an exemplary method 1100 for operating a memory device having a failed main bank and a redundant bank, according to some aspects of the present disclosure. The memory device may be any suitable memory device disclosed herein. Method 1100 may be implemented by I/O control logic 412. It is understood that the operations shown in method 1100 may not be exhaustive and that other operations can be performed as well before, after, or between any of the illustrated operations. Further, some of the operations may be performed simultaneously, or in a different order than shown in FIG. 11.

Referring to FIG. 11, method 1100 starts at operation 1102, in which bank fail information indicative of a failed main bank of the plurality of main banks is obtained. The failed main bank can be identified by the post-fabrication test of the memory device. For example, working bank logic 906 may obtain the bank fail information from registers 414 before operating the memory device.

Method 1100 proceeds to operation 1104, as illustrated in FIG. 11, in which a plurality of working banks are determined from the plurality of main banks and the redundant bank based on the bank fail information. The plurality of working banks can include the redundant bank. For example, working bank logic 906 may determine the working banks that include the redundant bank and the remaining main banks.

Method 1100 proceeds to operation 1106, as illustrated in FIG. 11, in which one bank of each pair of adjacent banks of the plurality of banks is selected based on the bank fail information. The selected bank is a working bank, according to some implementations. For example, working bank logic 906 may select one working bank of each pair of adjacent banks based on the bank fail information.

Method 1100 proceeds to operation 1108, as illustrated in FIG. 11, in which directing a piece of data to or from the selected bank of each pair of adjacent banks is controlled. To control directing the piece of data, a first bank of one pair of adjacent banks is determined to be the failed main bank, and the piece of data is directed to or from a second bank of the pair of adjacent banks is controlled, according to some implementations. In one example, write redundant enable logic 904 may control a first write MUX 708 to inhibit outputting the piece of data to the first bank, and control a second write MUX 708 to enable outputting the piece of data to the second bank. In another example, read redundant enable logic 902 may control a read MUX 804 to enable outputting the piece of data from the second bank.

Figure 12:
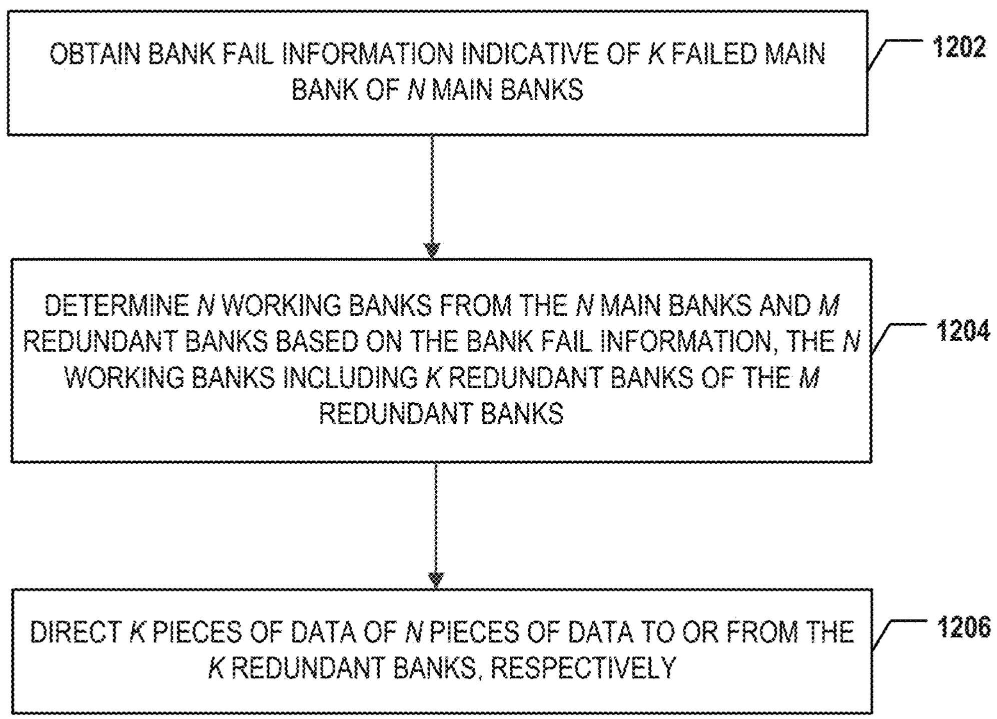
FIG. 12 illustrates a flowchart of another exemplary method for operating a memory device having a failed main bank and a redundant bank, according to some aspects of the present disclosure.

FIG. 12 illustrates a flowchart of another exemplary method 1200 for operating a memory device having a failed main bank and a redundant bank, according to some aspects of the present disclosure. The memory device may be any suitable memory device disclosed herein. Method 1200 may be implemented by I/O control logic 412. It is understood that the operations shown in method 1200 may not be exhaustive and that other operations can be performed as well before, after, or between any of the illustrated operations. Further, some of the operations may be performed simultaneously, or in a different order than shown in FIG. 12.

Referring to FIG. 12, method 1200 starts at operation 1202, in which bank fail information indicative of K failed main bank of N main banks is obtained. K can be a positive integer not greater than N. The K failed main bank can be identified by the post-fabrication test of the memory device. For example, working bank logic 906 may obtain the bank fail information from registers 414 before operating the memory device.

Method 1200 proceeds to operation 1204, as illustrated in FIG. 12, in which N working banks are determined from the N main banks and the M redundant banks based on bank fail information. The N working banks can include K redundant banks of the M redundant banks. For example, working bank logic 906 may determine the N working banks that include K redundant bank and the remaining main banks. In some implementations, M equals 1, and one working bank is selected from each pair of adjacent banks of the N main banks and the redundant bank based on the bank fail information.

Method 1200 proceeds to operation 1206, as illustrated in FIG. 12, in which K pieces of data of N pieces of data are directed to or from the K redundant banks, respectively. In some implementations, M equals 1, and one piece of data of the K pieces of data is directed to or from the selected working bank of each pair of adjacent banks of the N main banks and the redundant bank.

Figure 13:
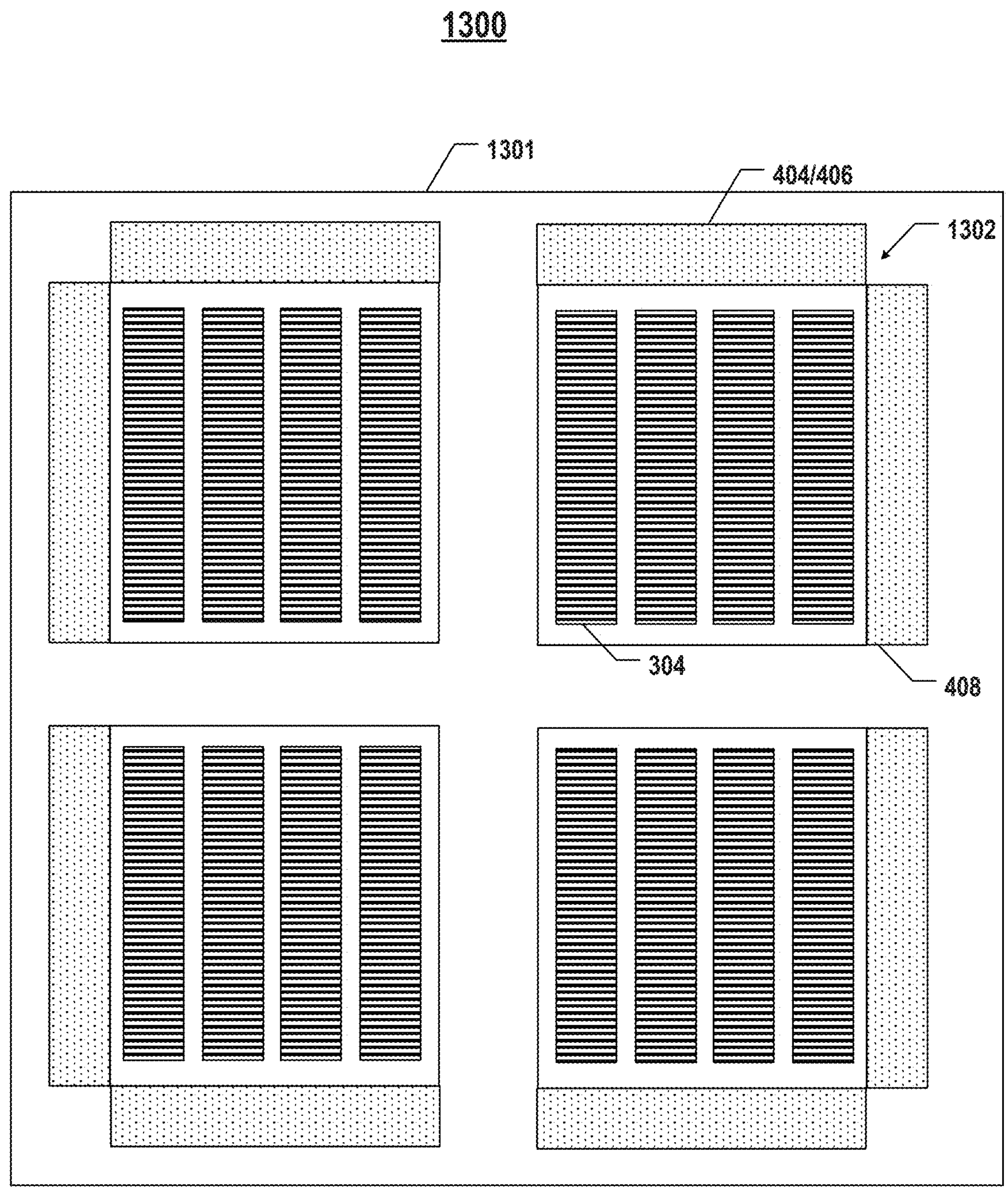
FIG. 13 illustrates a schematic diagram of an exemplary memory device including a plurality of planes, according to some aspects of the present disclosure.

FIG. 13 illustrates a schematic diagram of an exemplary memory device 1300 including a plurality of planes 1302, according to some aspects of the present disclosure. The plurality of planes 1302 can be included in a die 1301. In some implementations, planes 1302 can be mutually independent in performing a read operation, a program operation, or an erase operation. For example, each plane 1302 may be configured to perform a read operation independently in response to receiving a read control signal from control logic 413. In some implementations, each plane 1302 covers local buffering for the read and program data and can process operations in parallel, thereby increasing the operation speed. To enable its independent operation, each plane 1302 can include a set of blocks 304 of memory cell array 301 and a set of peripheral circuits, such as page buffer/sense amplifier 404, column decoder/bit line driver 406, and row decoder/word line driver 408.

In some other implementations, planes 1302 can be configured to perform a read operation, a program operation, or an erase operation in series. For example, read operations, program operations, or erase operations can be executed one by one in the plurality of planes 1302 in response to receiving a corresponding control signal from control logic 413.

Figure 14A:
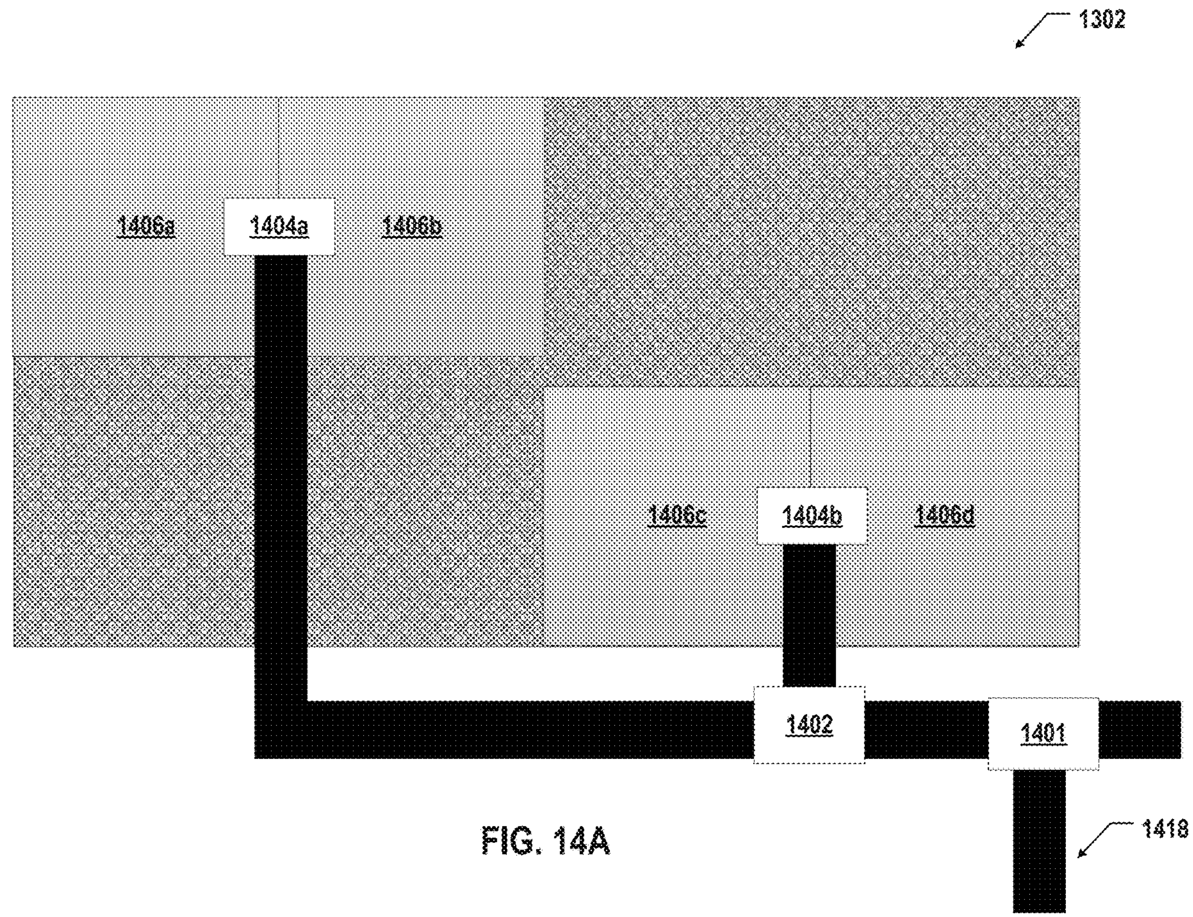
FIG. 14A illustrates a schematic diagram of an exemplary plane in a memory device, according to some aspects of the present disclosure.
Figure 14B:
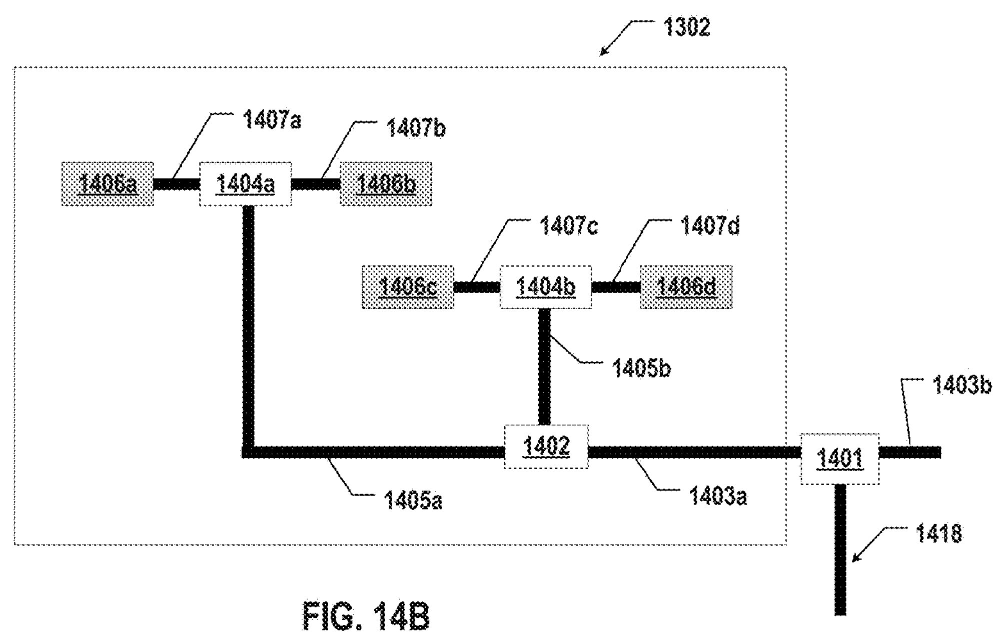
FIG. 14B illustrates a schematic diagram of exemplary data buses in the plane of FIG. 14A, according to some aspects of the present disclosure.

FIG. 14A illustrates an exemplary layout of plane 1302, according to some aspects of the present disclosure. FIG. 14B illustrates a schematic diagram of exemplary data buses in plane 1302 of FIG. 14A, according to some aspects of the present disclosure. In some implementations, memory cells in plane 1302 can be divided into a plurality of sections (referred to as plane section herein). Plane 1302 may include page buffer/sense amplifier 404 divided into a plurality of portions 1406 (referred to as page buffer/sense amplifier portion 1406 herein). Each page buffer/sense amplifier portion 1406 may correspond to a plane section in plane 1302, and may be configured to read and program (write) data from and to memory cells in the plane section according to the control signals from control logic 413.

As shown in FIG. 14A, page buffer/sense amplifier 404 includes four physically separated portions 1406*a*, 1406*b*, 1406*c*, and 1406*d* (e.g., four quarters). It is understood that the number of portions is not limited to four and may be any integer greater than 1 (e.g., 2, 3, 4, 5, 6, etc.), for example, two halves. Page buffer/sense amplifier 404 can include a plurality of storage units (e.g., latches, caches, or registers) for temporarily storing (buffering) one or more pages of data to be read from or written to the memory cells in plane 1302. In some implementations, each portion 1406*a*, 1406*b*, 1406*c*, or 1406*d* has the same size, i.e., one quarter of page buffer/sense amplifier 404. For example, page buffer/sense amplifier 404 may store 16K bytes of data, and each portion 1406*a*, 1406*b*, 1406*c*, or 1406*d* may store 4K bytes of data.

In some implementations, a global data bus 1418 may be coupled to each page buffer/sense amplifier portion 1406*a*, 1406*b*, 1406*c*, or 1406*d*, respectively. With combined reference to FIGS. 14A and 14B, global data bus 1418 can diverge at each junction 1401, 1402, 1404*a*, or 1404*b* to form branch data buses thereof. For example, global data bus 1418 may diverge into two plane branch data buses 1403*a* and 1403*b* at junction 1401. Plane branch data bus 1403*a* may diverge into two section branch data buses 1405*a* and 1405*b* at junction 1402. Section branch data bus 1405*a* may diverge into two section sub-branch data buses 1407*a* and 1407*b* at junction 1404*a*. Similarly, section branch data bus 1405*b* may diverge into two section sub-branch data buses 1407*c* and 1407*d* at junction 1404*b*. As a result, global data bus 1418 may be coupled to a respective page buffer/sense amplifier portion 1406*a*, 1406*b*, 1406*c*, or 1406*d* through one or more of the branch data buses (e.g., 1403*a*, 1405*a*, 1405*b*, 1407*a*, 1407*b*, 1407*c*, and 1407*d*).

In some implementations, plane 1302 may include row decoder/word line driver 408, which can be divided into a plurality of row decoder/word line driver portions. Each row decoder/word line driver portion may correspond to a plane section in plane 1302, and can be controlled by control logic 413 and configured to select block 304 of memory cell array 301 in the plane section and select a word line 318 of the selected block 304.

In some implementations, plane 1302 may include column decoder/bit line driver 406, which can be divided into a plurality of column decoder/bit line driver portions. Each column decoder/bit line driver portion may correspond to a plane section in plane 1302, and can be controlled by control logic 413 and configured to select one or more NAND memory strings 308 in the plane section by applying bit line voltages generated from voltage generator 410.

Figure 15A:
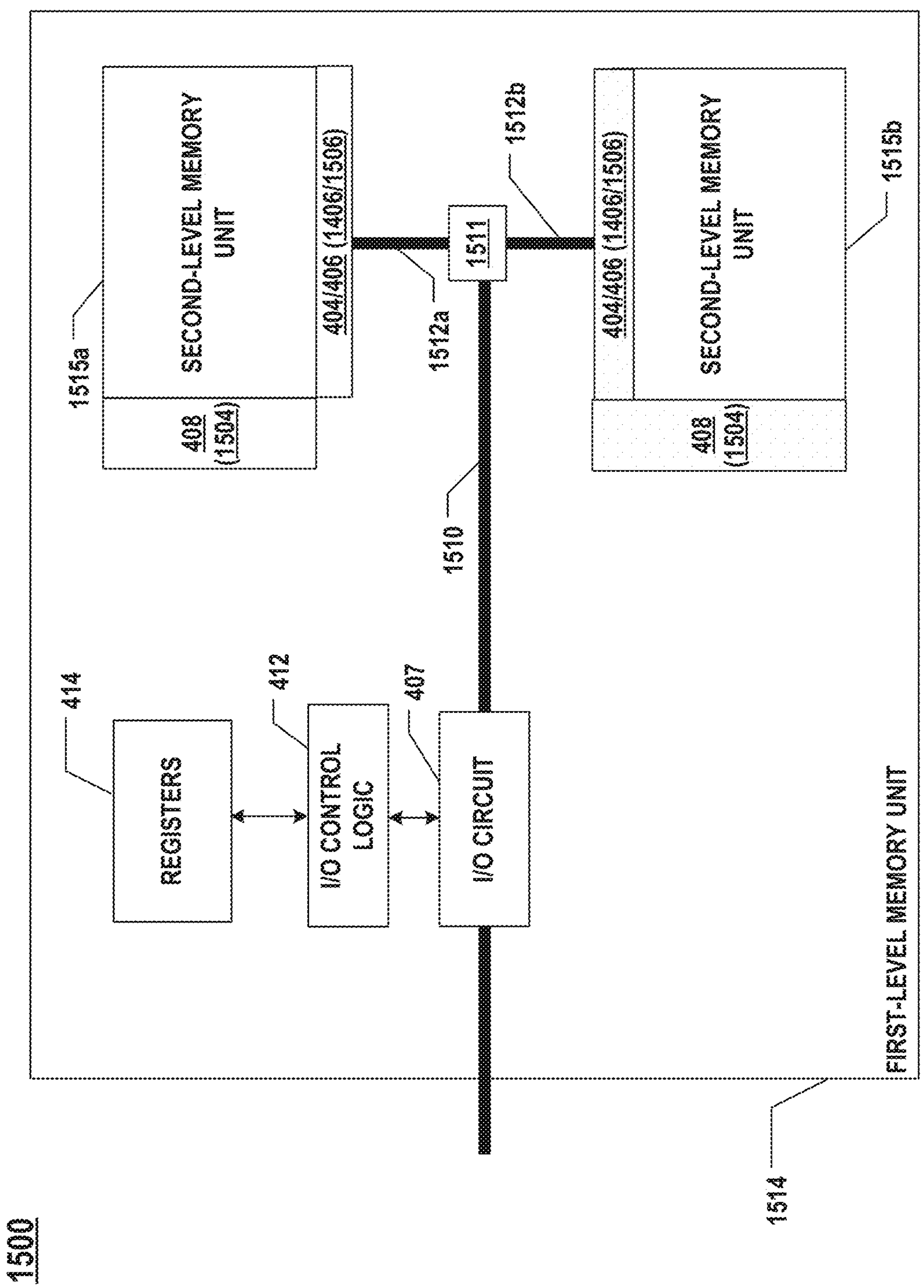
FIG. 15A illustrates a block diagram of an exemplary memory device including a first-level memory unit with a plurality of second-level memory units and an I/O circuit, according to some aspects of the present disclosure.

FIG. 15A illustrates a block diagram of an exemplary memory device 1500 including a first-level memory unit with a plurality of second-level memory unit and an I/O circuit, according to some aspects of the present disclosure. For example, memory device 1500 may include an array of memory cells that includes a first-level memory unit 1514. First-level memory unit 1514 may include second-level memory units 1515*a* and 1515*b*. Each second-level memory unit 1515*a* or 1515*b* may include one or more groups of banks, with each group of banks including N main banks and a redundant bank for concurrent data input and/or data output.

Each second-level memory unit 1515*a* or 1515*b* may be coupled to a respective page buffer/sense amplifier 404 (or a respective page buffer/sense amplifier portion 1406), a respective column decoder/bit line driver 406 (or a respective column decoder/bit line driver portion 1506), and a respective row decoder/word line driver 408 (or a respective row decoder/word line driver portion 1504).

As shown in FIG. 15A, first-level memory unit 1514 may include I/O circuit 407, I/O control logic 412, and registers 414. I/O circuit 407 and I/O control logic 412 can be shared by second-level memory units 1515*a* and 1515*b*. Each second-level memory unit 1515*a* or 1515*b* may correspond to one or more respective registers 414 configured to store bank fail information of corresponding second-level memory unit 1515*a* or 1515*b*. In some implementations, one or more of I/O circuit 407, I/O control logic 412, and registers 414 may be located outside of first-level memory unit 1514 (e.g., in a peripheral region of first-level memory unit 1514).

In some implementations, I/O circuit 407 may be coupled to a first-level data bus 1510. First-level data bus 1510 can diverge at a junction 1511 to form two branch data buses thereof, including branch data buses 1512*a* and 1512*b*. As a result, through first-level data bus 1510 and branch data bus 1512*a* or 1512*b*, I/O circuit 407 may be coupled to page buffer/sense amplifier 404 (or page buffer/sense amplifier portion 1406) and column decoder/bit line driver 406 (or column decoder/bit line driver portion 1506) in second-level memory unit 1515*a* or 1515*b*. I/O circuit 407 may be configured to direct N pieces of data to or from N working banks in second-level memory unit 1515*a* or 1515*b* through first-level data bus 1510 and branch data bus 1512*a* or 1512*b*, respectively.

I/O control logic 412 may be coupled to I/O circuit 407 and configured to determine the N working banks from the N main banks and the redundant bank in second-level memory unit 1515*a* or 1515*b* based on bank fail information indicative of a failed main bank of the N main banks. I/O control logic 412 may control I/O circuit 407 to direct the N pieces of data to or from the N working banks, respectively. I/O control logic 412 is described above with reference to FIG. 9, and the similar description will not be repeated here.

In some implementations, first-level memory unit 1514 can be a die that includes a plurality of planes, and each second-level memory unit 1515*a* or 1515*b* can be a corresponding plane in the die. First-level data bus 1510 can be a global data bus in the die. I/O circuit 407 can be coupled to the global data bus, and configured to direct the N pieces of data to or from the N working banks in a corresponding plane through the global data bus and one or more branch data buses in the corresponding plane, respectively. Examples are illustrated below with reference to FIGS. 15B-15D, with first-level memory unit 1514 being a die, second-level memory unit 1515*a* or 1515*b* being a plane, first-level data bus 1510 being a global data bus, and I/O circuit 407 being coupled to the global data bus.

In some implementations, first-level memory unit 1514 can be a plane that includes a plurality of plane sections, and each second-level memory unit 1515*a* or 1515*b* can be a corresponding plane section in the plane. First-level data bus 1510 can be a plane branch data bus in the plane. I/O circuit 407 can be coupled to the plane branch data bus, and configured to direct the N pieces of data to or from the N working banks in a corresponding plane section through the plane branch data bus and a section branch data bus, respectively. An example is illustrated below with reference to FIG. 16A, with first-level memory unit 1514 being a plane, second-level memory unit 1515*a* or 1515*b* being a plane section, first-level data bus 1510 being a plane branch data bus, and I/O circuit 407 being coupled to the plane branch data bus.

In some implementations, first-level memory unit 1514 can be a plane that includes a plurality of plane sections, and each second-level memory unit 1515*a* or 1515*b* can be a corresponding plane section in the plane. First-level data bus 1510 can be a section branch data bus in the plane. I/O circuit 407 can be coupled to the section branch data bus, and configured to direct the N pieces of data to or from the N working banks in a corresponding plane section through the section branch data bus and a section sub-branch data bus, respectively. Examples are illustrated below with reference to FIGS. 16B and 16D, with first-level memory unit 1514 being a plane, second-level memory unit 1515 being a plane section, first-level data bus 1510 being a section branch data bus, and I/O circuit 407 being coupled to the section branch data bus.

Figure 15B:
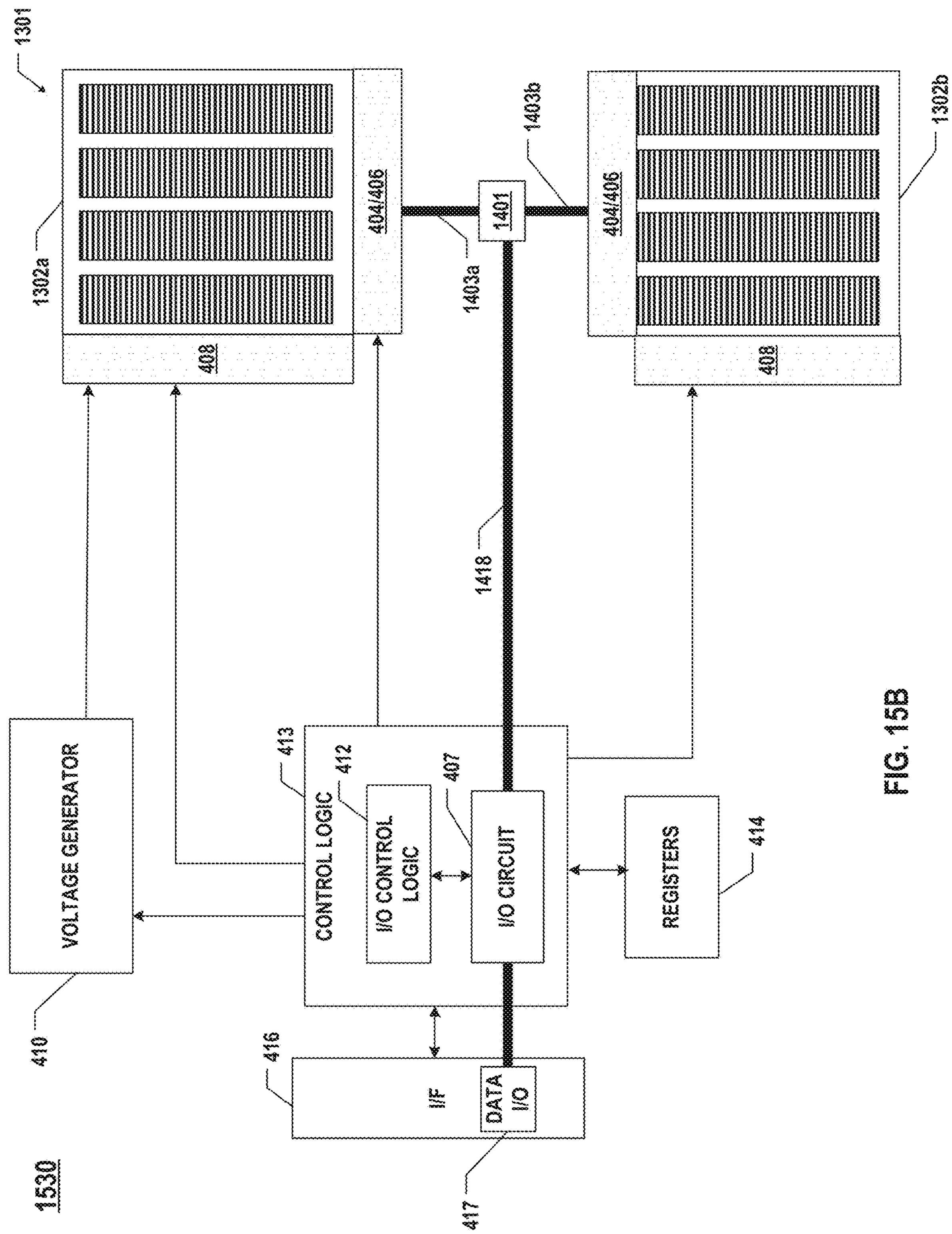
FIG. 15B illustrates a block diagram of an exemplary memory device including a die with a plurality of planes and an I/O circuit, according to some aspects of the present disclosure.

FIG. 15B illustrates a block diagram of an exemplary memory device 1530 including a die with a plurality of planes and an I/O circuit (e.g., I/O circuit 407), according to some aspects of the present disclosure. The die (e.g., die 1301) may include a plurality of planes 1302*a* and 1302*b*. Memory device 1530 may include components similar to those of any suitable memory device disclosed herein, and the similar description will not be repeated here.

In some implementations, control logic 413 can include a global I/O control logic configured to control data input and output through global data bus 1418. For example, control logic 413 may control buffering of data input/output to or from global data bus 1418, and may perform an integrity check on the input/output data. In some examples, registers 414 may also be included within control logic 413.

I/O control logic 412 and I/O circuit 407 may be shared by planes 1302*a* and 1302*b*. I/O circuit 407 may be coupled to global data bus 1418. Global data bus 1418 may diverge at junction 1401 to form plane branch data buses 1403*a* and 1403*b*. I/O circuit 407 may be configured to direct N pieces of data to or from N working banks in plane 1302*a* or 1302*b* through global data bus 1418 and plane branch data bus 1403*a* or 1403*b*, respectively.

Figure 15C:
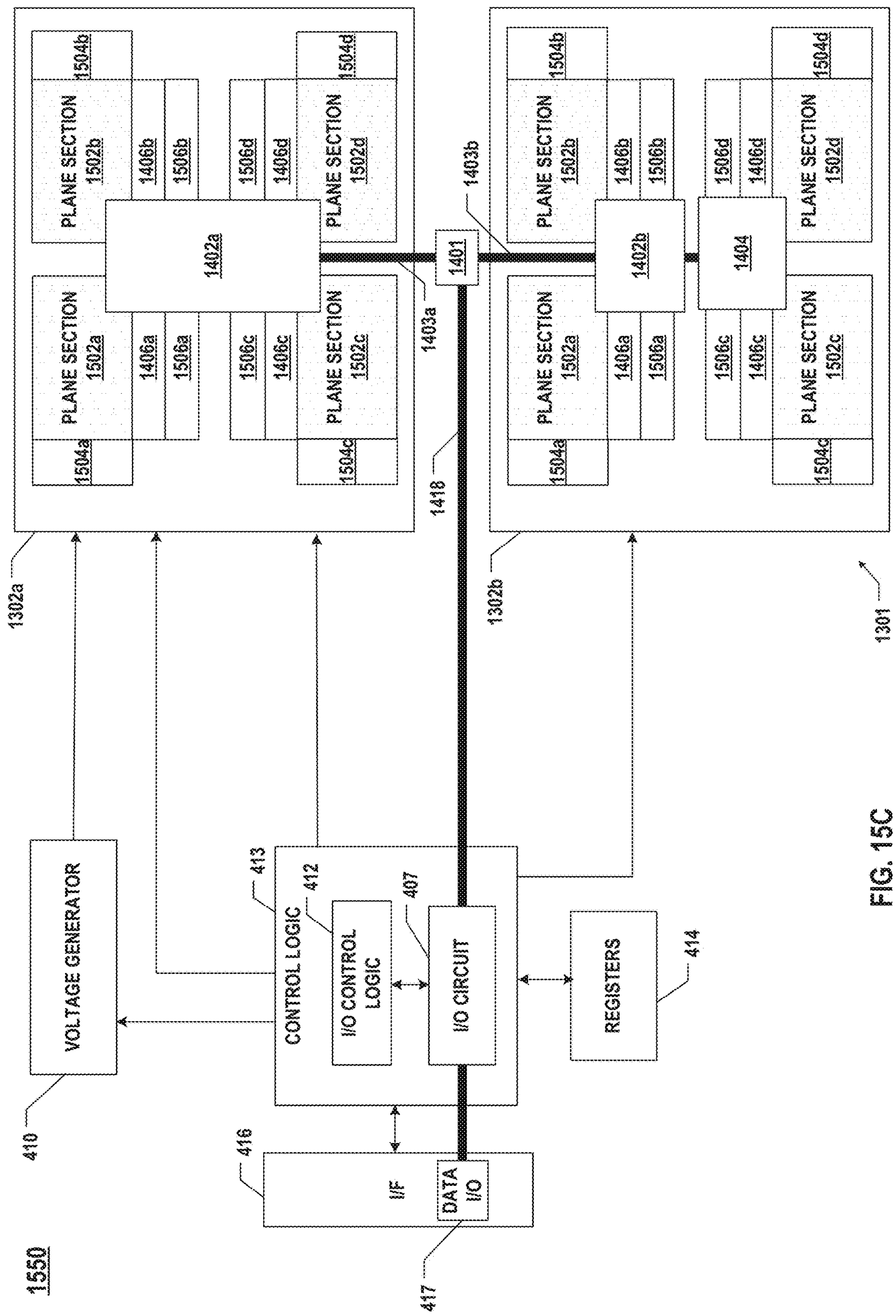
FIG. 15C illustrates a block diagram of another exemplary memory device including a die with a plurality of planes and an I/O circuit, according to some aspects of the present disclosure.
Figure 15D:
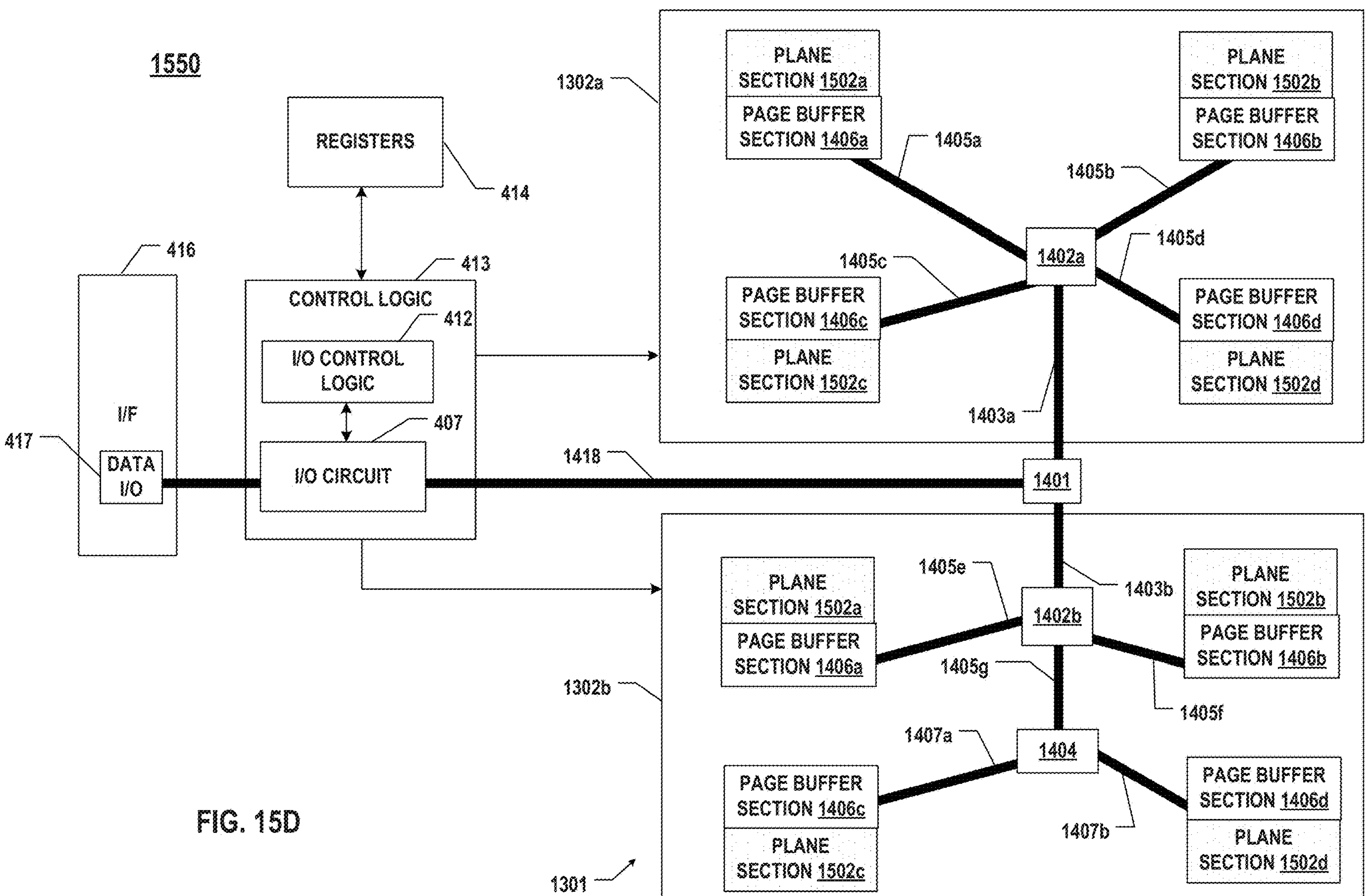
FIG. 15D illustrates a schematic diagram of exemplary data buses in the memory device of FIG. 15C, according to some aspects of the present disclosure.

FIG. 15C illustrates a block diagram of another exemplary memory device 1550 including a die with a plurality of planes and an I/O circuit (e.g., I/O circuit 407), according to some aspects of the present disclosure. FIG. 15D illustrates a schematic diagram of exemplary data buses in memory device 1550 of FIG. 15C, according to some aspects of the present disclosure. The die (e.g., die 1301) in FIGS. 15C-15D may include a plurality of planes 1302*a* and 1302*b*, with each plane 1302*a* or 1302*b* including a plurality of plane sections 1502*a*, 1502*b*, 1502*c*, and 1502*d*. I/O control logic 412 and I/O circuit 407 may be shared by planes 1302*a* and 1302*b* (e.g., also shared by plane sections 1502*a*, 1502*b*, 1502*c*, and 1502*d* of each plane 1302*a* or 1302*b*). Memory device 1550 may include components similar to those of any suitable memory device disclosed herein, and the similar description will not be repeated here.

In FIGS. 15C-15D, I/O circuit 407 may be coupled to global data bus 1418. Global data bus 1418 may diverge at junction 1401 to form plane branch data buses 1403*a* and 1403*b*. With respect to plane 1302*a*, plane branch data bus 1403*a* may diverge at junction 1402*a* to form section branch data buses 1405*a*, 1405*b*, 1405*c*, and 1405*d*. As a result, I/O circuit 407 may be coupled to each plane section 1502*a*, 1502*b*, 1502*c*, or 1502*d* of plane 1301*a* and configured to direct N pieces of data to or from N working banks in each plane section 1502*a*, 1502*b*, 1502*c*, or 1502*d*, respectively, through global data bus 1418, plane branch data bus 1403*a*, and section branch data bus 1405*a*, 1405*b*, 1405*c*, or 1405*d*.

With respect to plane 1302*b*, plane branch data bus 1403*b* may diverge at junction 1402*b* to form section branch data buses 1405*e*, 1405*f*, and 1405*g*. Section branch data bus 1405*g* may diverge at junction 1404 to form section sub-branch data buses 1407*a* and 1407*b*. As a result, I/O circuit 407 may be coupled to plane section 1502*a* or 1502*b* of plane 1302*b* and configured to direct N pieces of data to or from N working banks in plane section 1502*a* or 1502*b*, respectively, through global data bus 1418, plane branch data bus 1403*b*, and section branch data bus 1405*e* or 1405*f*. Additionally, I/O circuit 407 may be coupled to plane section 1502*c* or 1502*d* of plane 1302*b* and configured to direct N pieces of data to or from N working banks in plane section 1502*c* or 1502*d*, respectively, through global data bus 1418, plane branch data bus 1403*b*, section branch data bus 1405*g*, and section sub-branch data bus 1407*a* or 1407*b*.

Figure 16A:
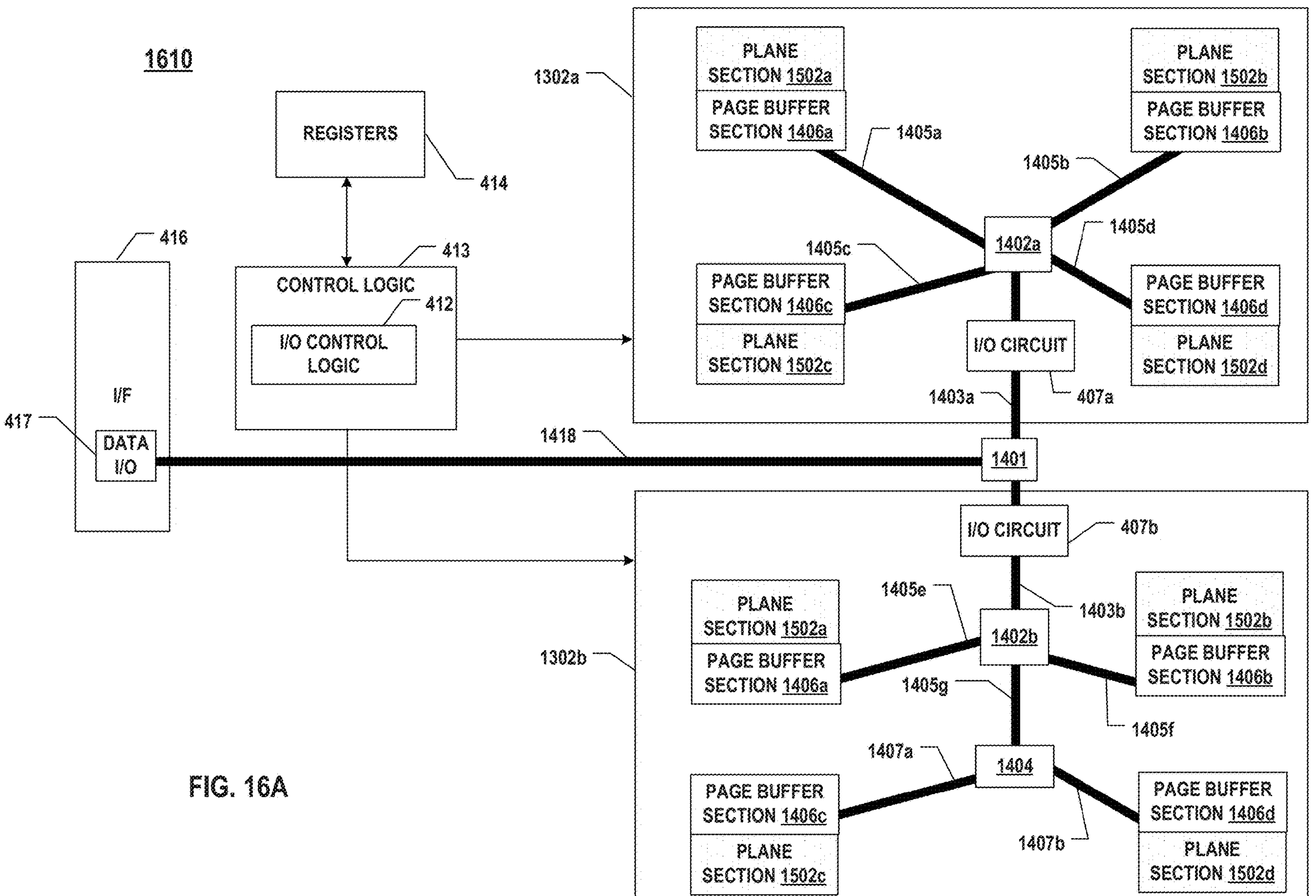
FIGS. 16A-16D illustrate schematic diagrams of exemplary memory devices each including a plurality of planes and a plurality I/O circuits, according to some aspects of the present disclosure.

FIGS. 16A-16D illustrate schematic diagrams of exemplary memory devices 1610, 1620, 1630, and 1640 each including a plurality of planes and a plurality of I/O circuits, according to some aspects of the present disclosure. Referring to FIG. 16A, memory device 1610 may include components similar to those of any suitable memory device disclosed herein, and the similar description will not be repeated here. In FIG. 16A, each plane 1302*a* or 1302*b* may include a respective I/O circuit 407*a* or 407*b*. Although memory device 1610 includes one I/O control logic 412 shared by a plurality of planes 1302*a* and 1302*b*, in some implementations each plane 1302*a* or 1302*b* may include: (1) a respective I/O control logic 412 coupled to its respective I/O circuit 407*a* or 407*b*; and (2) one or more respective registers 414 coupled to its respective I/O control logic 412.

With respect to plane 1302*a*, I/O circuit 407*a* (as well as respective I/O control logic 412 and respective register 414 if there is any in plane 1302*a*) can be shared by plane sections 1502*a*, 1502*b*, 1502*c*, and 1502*d* of plane 1302*a*. I/O circuit 407*a* may be coupled to plane branch data bus 1403*a*. I/O circuit 407*a* may be coupled to each plane section 1502*a*, 1502*b*, 1502*c*, or 1502*d* of plane 1302*a* and configured to direct N pieces of data to or from N working banks in each plane section 1502*a*, 1502*b*, 1502*c*, or 1502*d*, respectively, through plane branch data bus 1403*a* and section branch data bus 1405*a*, 1405*b*, 1405*c*, or 1405*d*.

With respect to plane 1302*b*, I/O circuit 407*b* (as well as respective I/O control logic 412 and respective register 414 if there is any in plane 1302*b*) can be shared by plane sections 1502*a*, 1502*b*, 1502*c*, and 1502*d* of plane 1302*b*. I/O circuit 407*b* may be coupled to plane branch data bus 1403*b*. I/O circuit 407*b* may be coupled to plane section 1502*a* or 1502*b* in plane 1302*b* and configured to direct N pieces of data to or from N working banks in plane section 1502*a* or 1502*b*, respectively, through plane branch data bus 1403*b* and section branch data bus 1405*e* or 1405*f*. Additionally, I/O circuit 407*b* may be coupled to plane section 1502*c* or 1502*d* of plane 1302*b* and configured to direct N pieces of data to or from N working banks in plane section 1502*c* or 1502*d*, respectively, through plane branch data bus 1403*b*, section branch data bus 1405*g*, and section sub-branch data bus 1407*a* or 1407*b*.

Figure 16B:
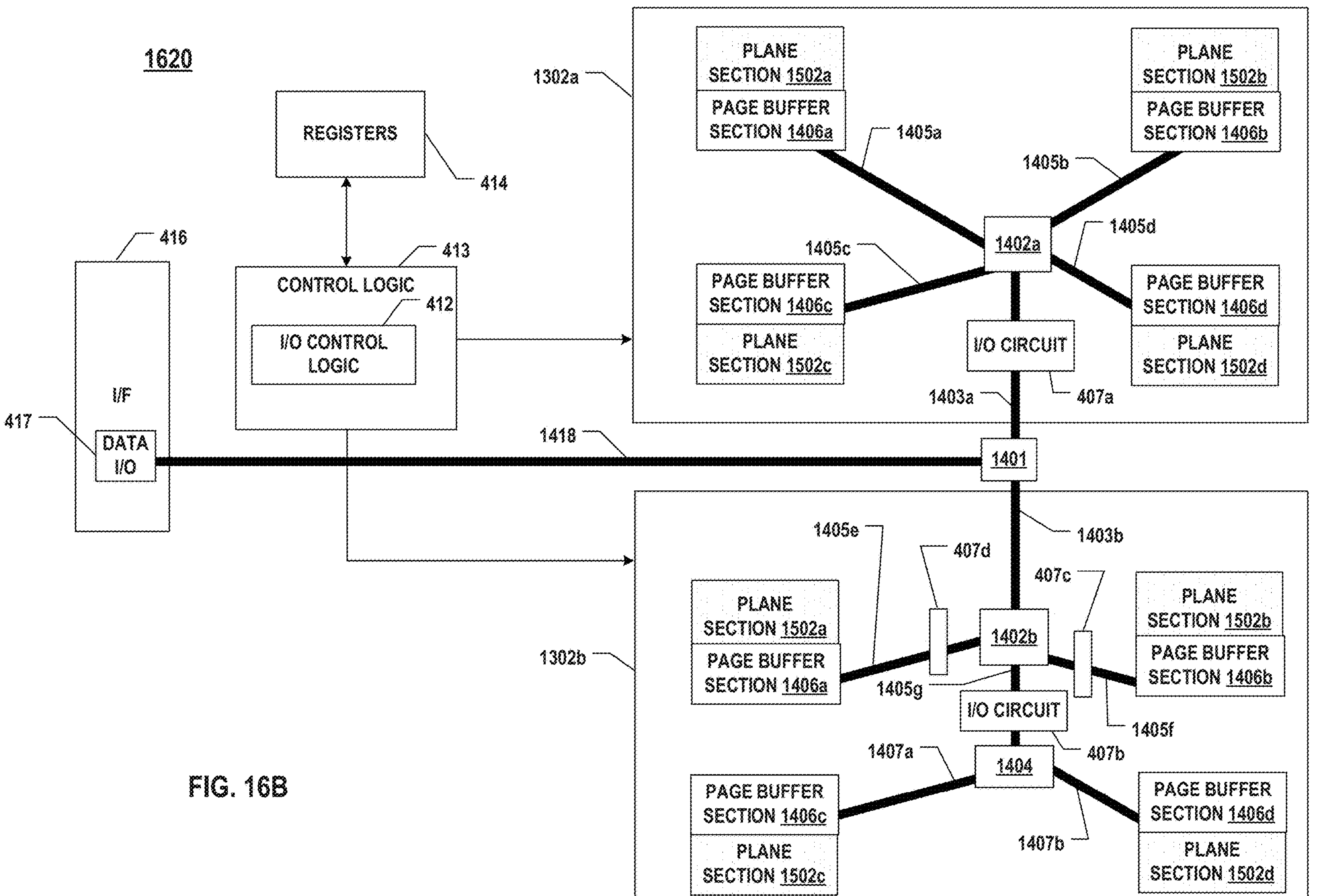

Referring to FIG. 16B, memory device 1620 may include components similar to those of any suitable memory device disclosed herein, and the similar description will not be repeated here. In FIG. 16B, plane 1302*a* may include I/O circuit 407*a* shared by plane sections 1405*a*-1405*d* of plane 1302*a*. Plane 1302*b* may include I/O circuits 407*b*, 407*c*, and 407*d*.

With respect to plane 1302*b*, I/O circuit 407*b* (as well as respective I/O control logic 412 and respective register 414 if there is any in plane 1302*b*) can be shared by plane sections 1502*c* and 1502*d* of plane 1302*b*. I/O circuit 407*b* may be coupled to section branch data bus 1405*g*. I/O circuit 407*b* may be coupled to plane section 1502*c* or 1502*d* of plane 1302*b* and configured to direct N pieces of data to or from N working banks in plane section 1502*c* or 1502*d*, respectively, through section branch data bus 1405*g* and section sub-branch data bus 1407*a* or 1407*b*. I/O circuit 407*c* may be coupled to section branch data bus 1405*f*. I/O circuit 407*c* may be coupled to plane section 1502*b* of plane 1302*b* and configured to direct N pieces of data to or from N working banks in plane section 1502*b* through section branch data bus 1405*f*, respectively. I/O circuit 407*d* may be coupled to section branch data bus 1405*e*. I/O circuit 407*d* may be coupled to plane section 1502*a* of plane 1302*b* and configured to direct N pieces of data to or from N working banks in plane section 1502*a* through section branch data bus 1405*e*, respectively.

Figure 16C:
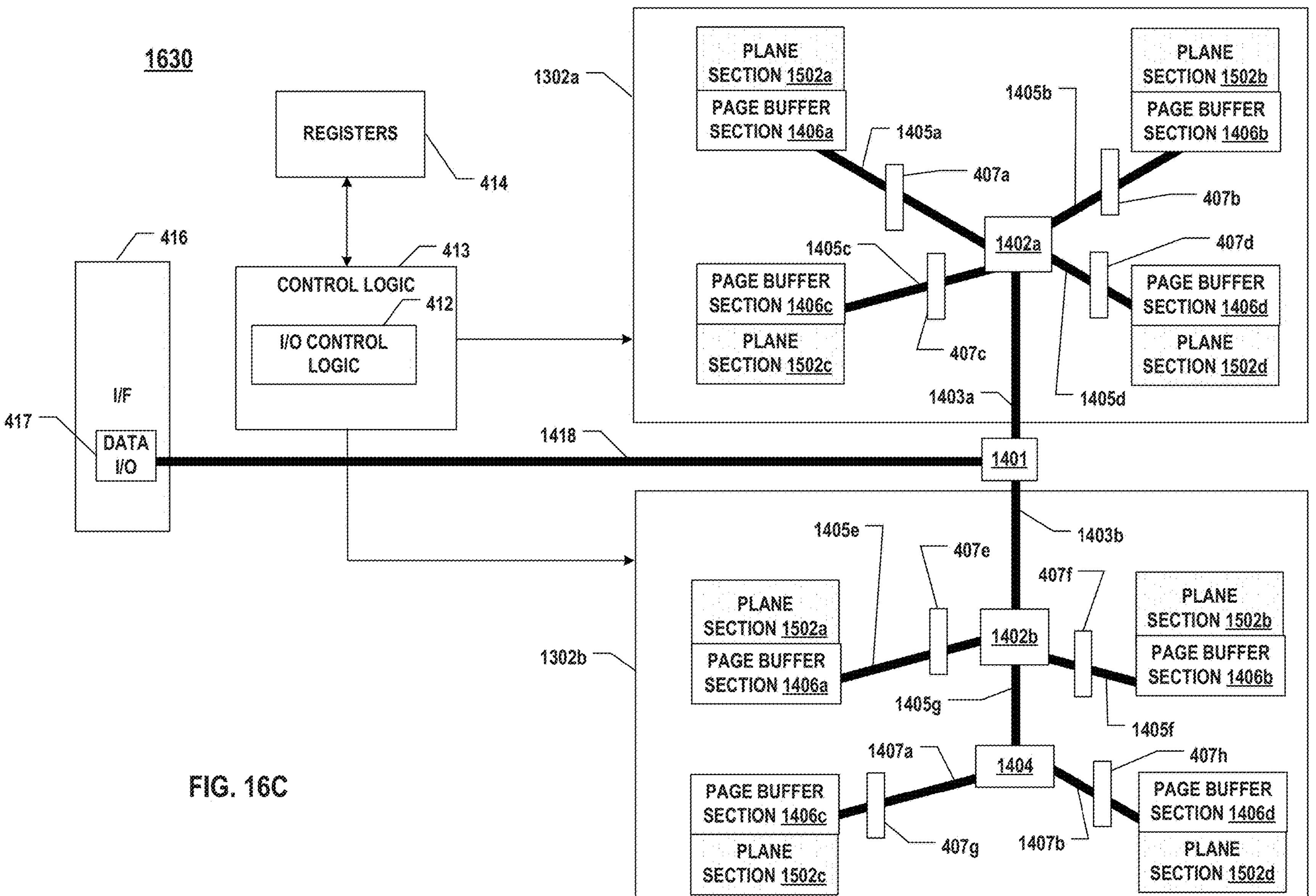

Referring to FIG. 16C, memory device 1630 may include components similar to those of any suitable memory device disclosed herein, and the similar description will not be repeated here. Plane 1302*a* may include I/O circuits 407*a*, 407*b*, 407*c*, and 407*d* corresponding to plane sections 1502*a*, 1502*b*, 1502*c*, and 1502*d* in plane 1302*a*, respectively. I/O circuit 407*a* may be coupled to plane section 1502*a* of plane 1302*a* and configured to direct N pieces of data to or from N working banks in plane section 1502*a* through section branch data bus 1405*a*, respectively. I/O circuit 407*b* may be coupled to plane section 1502*b* of plane 1302*a* and configured to direct N pieces of data to or from N working banks in plane section 1502*b* through section branch data bus 1405*b*, respectively. I/O circuit 407*c* may be coupled to plane section 1502*c* of plane 1302*a* and configured to direct N pieces of data to or from N working banks in plane section 1502*c* through section branch data bus 1405*c*, respectively. I/O circuit 407*d* may be coupled to plane section 1502*d* of plane 1302*a* and configured to direct N pieces of data to or from N working banks in plane section 1502*d* through section branch data bus 1405*d*, respectively.

Plane 1302*b* may include I/O circuits 407*e*, 407*f*, 407*g*, and 407*h* corresponding to plane sections 1502*a*, 1502*b*, 1502*c*, and 1502*d* in plane 1302*b*, respectively. I/O circuit 407*e* may be coupled to plane section 1502*a* of plane 1302*b* and configured to direct N pieces of data to or from N working banks in plane section 1502*a* through section branch data bus 1405*e*, respectively. I/O circuit 407*f* may be coupled to plane section 1502*b* of plane 1302*b* and configured to direct N pieces of data to or from N working banks in plane section 1502*b* through section branch data bus 1405*f*, respectively. I/O circuit 407*g* may be coupled to plane section 1502*c* of plane 1302*b* and configured to direct N pieces of data to or from N working banks in plane section 1502*c* through section sub-branch data bus 1407*a*, respectively. I/O circuit 407*h* may be coupled to plane section 1502*d* of plane 1302*b* and configured to direct N pieces of data to or from N working banks in plane section 1502*d* through section sub-branch data bus 1407*b*, respectively.

Figure 16D:
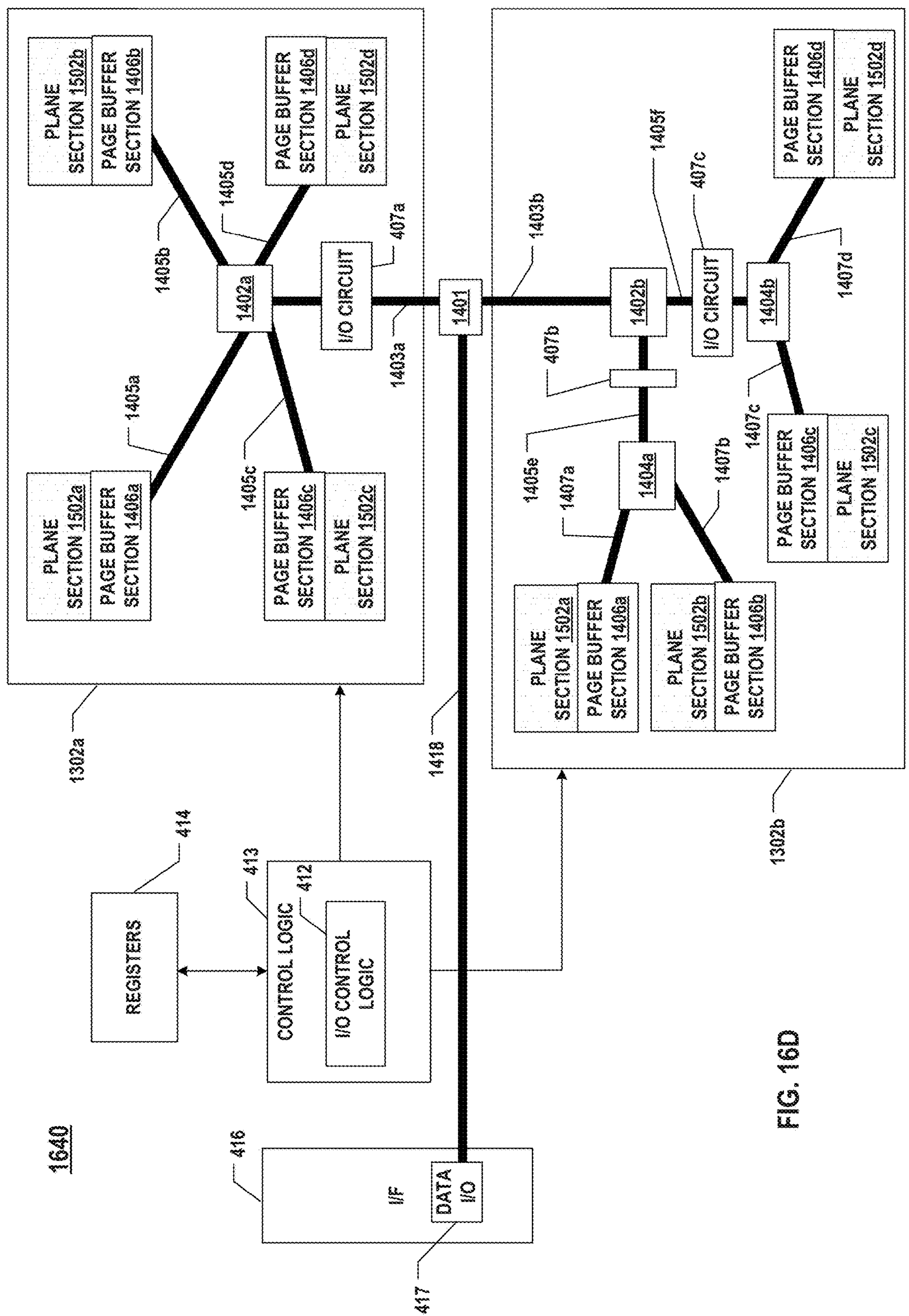

Referring to FIG. 16D, memory device 1640 may include components similar to those of any suitable memory device disclosed herein, and the similar description will not be repeated here. In FIG. 16D, plane 1302*a* may include I/O circuit 407*a* shared by plane sections 1502*a*, 1502*b*, 1502*c*, and 1502*d* of plane 1302*a*. Plane 1302*b* may include I/O circuits 407*b* and 407*c*.

With respect to plane 1302*b*, plane branch data bus 1403*b* may diverge at junction 1402*b* to form section branch data buses 1405*e* and 1405*f*. Section branch data bus 1405*e* may diverge at junction 1404*a* to form section sub-branch data buses 1407*a* and 1407*b*. Section branch data bus 1405*f* may diverge at junction 1404*b* to form section sub-branch data buses 1407*c* and 1407*d*. I/O circuit 407*b* (as well as respective I/O control logic 412 and respective register 414 if there is any in plane 1302*b*) can be shared by plane sections 1502*a* and 1502*b* of plane 1302*b*. I/O circuit 407*b* may be coupled to section branch data bus 1405*e*. I/O circuit 407*b* may be coupled to plane section 1502*a* or 1502*b* of plane 1302*b* and configured to direct N pieces of data to or from N working banks in plane section 1502*a* or 1502*b*, respectively, through section branch data bus 1405*e* and section sub-branch data bus 1407*a* or 1407*b*.

I/O circuit 407*c* (as well as respective I/O control logic 412 and respective register 414 if there is any in plane 1302*b*) can be shared by plane sections 1502*c* and 1502*d* of plane 1302*b*. I/O circuit 407*c* may be coupled to section branch data bus 1405*f*. I/O circuit 407*d* may be coupled to plane section 1502*c* or 1502*d* of plane 1302*b* and configured to direct N pieces of data to or from N working banks in plane section 1502*c* or 1502*d*, respectively, through section branch data bus 1405*f* and section sub-branch data bus 1407*c* or 1407*d*.

Figure 17:
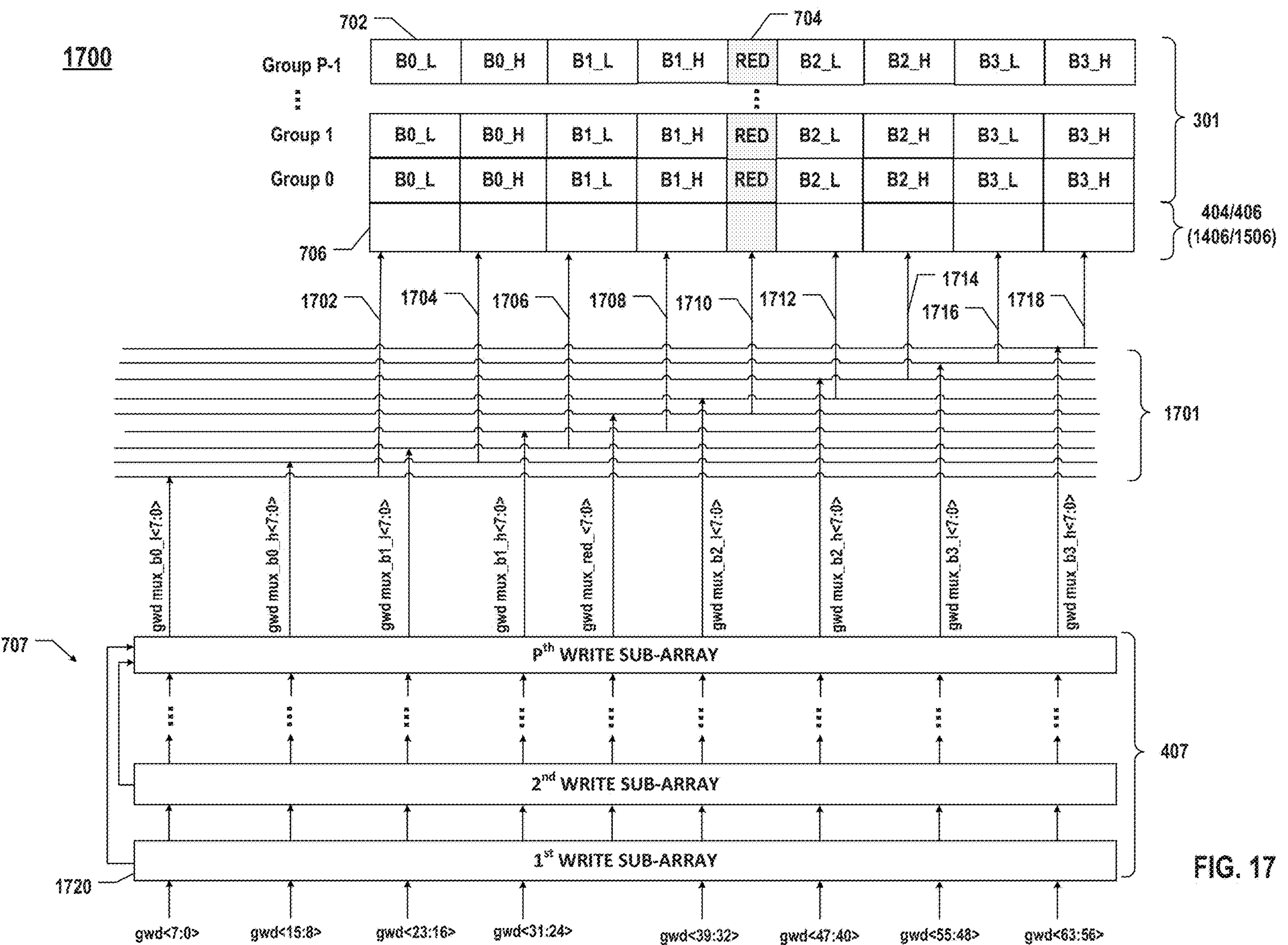
FIG. 17 illustrates a schematic diagram of an exemplary memory device that implements a failed main bank repair scheme in data input using a write multiplexer (MUX) array with a plurality of write sub-arrays, according to some aspects of the present disclosure.

FIG. 17 illustrates a schematic diagram of an exemplary memory device 1700 that implements a failed main bank repair scheme in data input using a write MUX array with a plurality of write sub-arrays, according to some aspects of the present disclosure. Memory device 1700 may include components similar to those of any suitable memory device described herein, and the similar description will not be repeated here.

In some implementations, memory device 1700 may include an array of memory cells including P groups of banks, where P can be a positive integer. Each group of banks may include N main banks 702 (e.g., N=8) and a redundant bank 704 for concurrent data input/output, and so, P redundant banks are included in and shared by the P groups of banks. I/O circuit 407 can be coupled to the P groups of banks in memory device 1700, for example, through page buffer/sense amplifier 404 and column decoder/bit line driver 406 (or page buffer/sense amplifier portion 1406 and column decoder/bit line driver portion 1506). In some implementations shown in FIG. 17, in data input (e.g., write operation), page buffer/sense amplifier 404 and column decoder/bit line driver 406 (or page buffer/sense amplifier portion 1406 and column decoder/bit line driver portion 1506) may include 9 drivers 706 respectively coupled to 8 main banks 702 and 1 redundant bank 704 in each group of banks.

I/O circuit 407 may include N+1 outputs respectively coupled to N main banks 702 and redundant bank 704 in each group of banks through a data bus 1701 and a set of wirings. The set of wirings may include wires 1702, 1704, 1706, 1708, 1710, 1712, 1714, 1716, and 1718. For example, an output of I/O circuit 407 can be coupled to a respective bank through a respective data line of data bus 1701 and a respective wire in the set of wirings.

In some implementations, I/O circuit 407 can be located in first-level memory unit 1514 and shared by a plurality of second-level memory units 1515*a* and 1515*b*, as shown in FIG. 15A. Data bus 1701 can be first-level data bus 1510 in FIG. 15A. The set of wirings may include branch data bus 1512*a* or 1512*b*, depending on which second-level memory unit 1515*a* or 1515*b* the N main banks 702 and redundant bank 704 are located in.

In some implementations, I/O circuit 407 can be located in a die and shared by a plurality of planes (e.g., as shown in FIGS. 15B-15D). For example, data bus 1701 can be global data bus 1418 shown in FIG. 15B. The set of wirings may include plane branch data bus 1403*a* or 1403*b* shown in FIG. 15B, depending on which plane the N main banks 702 and redundant bank 704 are located in. In another example, data bus 1701 can be global data bus 1418 shown in FIG. 15C or 15D. The set of wirings may include one or more of plane branch data bus 1403*a* or 1403*b*, section branch data bus 1405*a*-1405*g*, and section sub-branch data bus 1407*a* or 1407*b* shown in FIG. 15D, depending on which section of plane 1302*a* or plane 1302*b* the N main banks 702 and redundant bank 704 are located in.

In some implementations, I/O circuit 407 can be located in a plane and shared by a plurality of plane sections in the plane. For example, I/O circuit 407 in FIG. 17 can be I/O circuit 407*a* or 407*b* of FIG. 16A, and data bus 1701 can be plane branch data bus 1403*a* or 1403*b* shown in FIG. 16A. The set of wirings may include section branch data bus 1405*a*-1405*g* and/or section sub-branch data bus 1407*a* or 1407*b* shown in FIG. 16A, depending on which section of plane 1302*a* or plane 1302*b* the N main banks 702 and redundant bank 704 are located in. In another example, I/O circuit 407 in FIG. 17 can be I/O circuit 407*b* of FIG. 16D, and data bus 1701 can be section branch data bus 1405*e* in plane 1302*b* of FIG. 16D. The set of wirings may include section sub-branch data bus 1407*a* or 1407*b* shown in FIG. 16D, depending on which plane section 1502*a* or 1502*b* of plane 1302*b* the N main banks 702 and redundant bank 704 are located in. In still another example, I/O circuit 407 in FIG. 17 can be I/O circuit 407*c* of FIG. 16D, and data bus 1701 can be section branch data bus 1405*f* in plane 1302*b* of FIG. 16D. The set of wirings may include section sub-branch data bus 1407*c* or 1407*d* shown in FIG. 16D, depending on which plane section 1502*c* or 1502*d* of plane 1302*b* the N main banks 702 and redundant bank 704 are located in.

I/O circuit 407 may include write MUX array 707. In some implementations, write MUX array 707 may include P write sub-arrays 1720 (e.g., a $1^{st}$ write sub-array, a $2^{nd}$ write sub-array, . . . , and a $P^{th}$ write sub-array) that are applied in series. Various exemplary structures of each write sub-array 1720 are described below in more detail with reference to FIGS. 18A, 18D, and 19A.

Figure 18A:
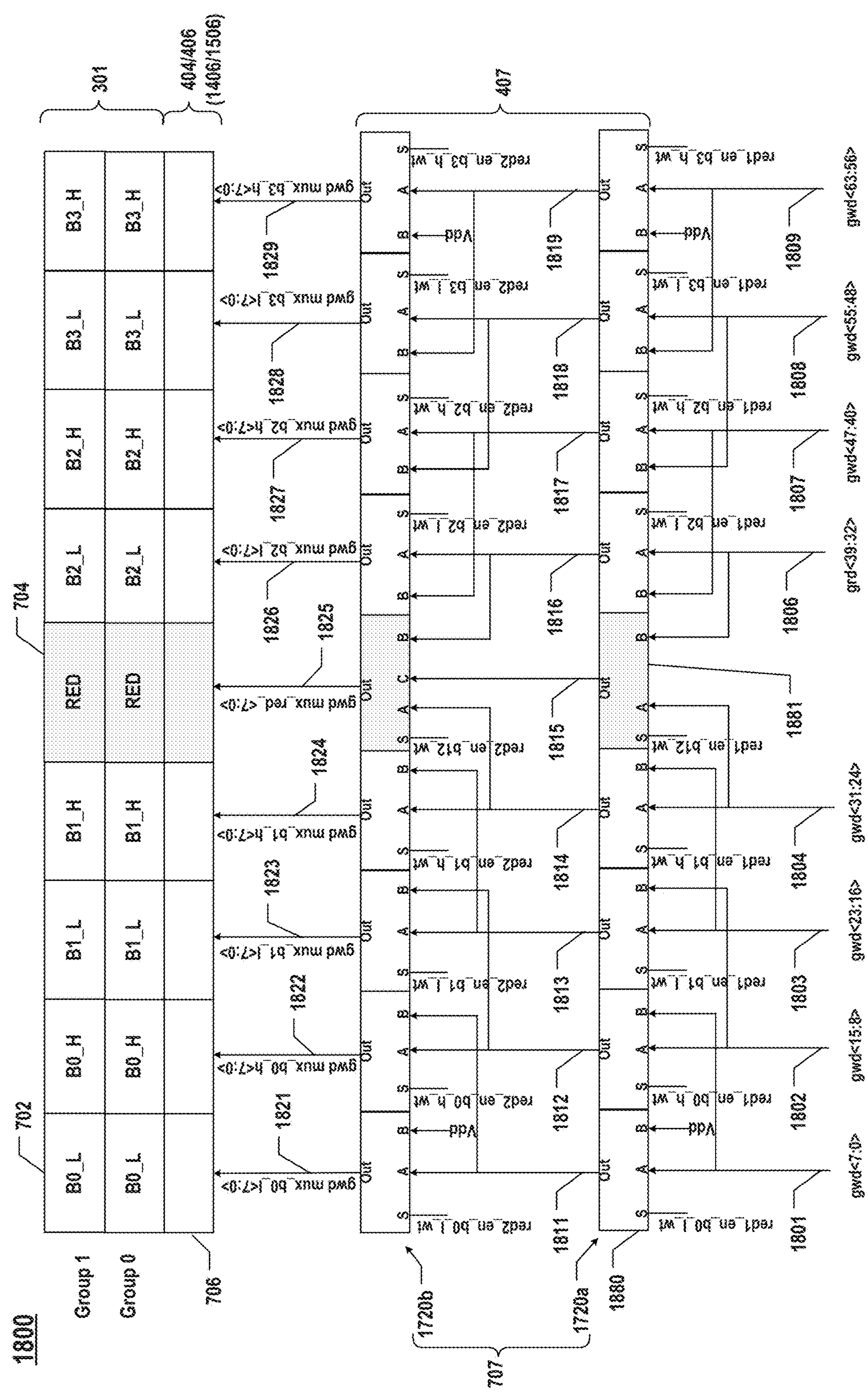
FIG. 18A illustrates a schematic diagram of an exemplary memory device that implements a failed main bank repair scheme in data input using a write MUX array with two write sub-arrays, according to some aspects of the present disclosure.

FIG. 18A illustrates a schematic diagram of an exemplary memory device 1800 that implements a failed main bank repair scheme in data input using a write MUX array with two write sub-arrays, according to some aspects of the present disclosure. Memory device 1800 may include components similar to those of any suitable memory device described herein, and the similar description will not be repeated here. In some implementations, memory device 1800 may include an array of memory cells including P groups of banks with P=2, e.g., Group 0 and Group 1. Each group of banks may include N main banks 702 (e.g., N=8) and 1 redundant bank 704 for concurrent data input/output, and so, 2 redundant banks 704 are included in and shared by the 2 groups of banks.

In some implementations shown in FIG. 18A, write MUX array 707 of I/O circuit 407 may include a $1^{st}$ write sub-array 1720*a* and a $2^{nd}$ write sub-array 1720*b*. Each write sub-array 1720*a* or 1720*b* may include a redundant write MUX 1881 and N main write MUXs 1880 (e.g., N=8). Redundant write MUX 1881 may be located among N main write MUXs 1880 in each write sub-array 1720*a* or 1720*b*. Each main write MUX 1880 and each redundant write MUX 1881 may include a first input A, a second input B, a select port S, and an output Out, respectively. Redundant write MUX 1881 in $2^{nd}$ write sub-array 1720*b* may further include a first redundant input C, while redundant write MUX 1881 in $1^{st}$ write sub-array 1720*a* does not include any redundant input.

In some implementations, each of $1^{st}$ write sub-array 1720*a* and $2^{nd}$ write sub-array 1720*b* may have a structure similar to that of write MUX array 707 shown in FIG. 7. However, redundant write MUX 1881 of $2^{nd}$ write sub-array 1720*b* may additionally include first redundant input C, while no write MUX in write MUX array 707 of FIG. 7 includes any redundant input. In some implementations, two instances of write MUX array 707 of FIG. 7 can be cascaded in series and modified thereof to form write MUX array 707 of FIG. 18A with two write sub-arrays 1720*a* and 1720*b*. In general, P instances of write MUX array 707 of FIG. 7 can be cascaded in series and modified thereof to form a write MUX array with P write sub-arrays.

With respect to $1^{st}$ write sub-array 1720*a*, an output of each main write MUX 1880 is coupled to first input A of a corresponding main write MUX 1880 in $2^{nd}$ write sub-array 1720*b* through a corresponding signal line (e.g., 1811, 1812, 1813, 1814, 1816, 1817, 1818, or 1819). An output of redundant write MUX 1881 in $1^{st}$ write sub-array 1720*a* is coupled to redundant input C of redundant write MUX 1881 in $2^{nd}$ write sub-array 1720*b* through a signal line 1815. First input A of each main write MUX 1880 in $1^{st}$ write sub-array 1720*a* is coupled to a corresponding I/O data line (e.g., 1801, 1802, 1803, 1804, 1806, 1807, 1808, or 1809), and configured to receive a corresponding piece of data from the corresponding I/O data line.

With respect to $2^{nd}$ write sub-array 1720*b*, outputs of N main write MUXs 1880 and redundant write MUX 1881 are coupled to N main banks 702 and redundant bank 704 in a corresponding group of banks through signal lines 1821, 1822, 1823, 1824, 1825, 1826, 1827, 1828, and 1829, respectively.

With respect to each write sub-array 1720*a* or 1720*b*, first input A and second input B of redundant write MUX 1881 are respectively coupled to first inputs A of two adjacent main write MUXs 1880 in the same write sub-array. Second input B of each main write MUX 1880 in each write sub-array 1720*a* or 1720*b* is coupled to a Vdd signal line or first input A of an adjacent main write MUX 1880 in the same write sub-array. The Vdd signal line may be configured to receive a system voltage Vdd. For example, for each main write MUXs 1880 located at a left or right end of each write sub-array 1720*a* or 1720*b*, second input B of the respective main write MUX 1880 is coupled to the Vdd signal line. For each main write MUX 1880 on a left side of redundant write MUX 1881 (which is not the main write MUX on the left end), second input B of the respective main write MUX 1880 is coupled to first input A of an adjacent main write MUX 1880 on its left side. For each main write MUX 1880 on a right side of redundant write MUX 1881 (which is not the main write MUX on the right end), second input B of the respective main write MUX 1880 is coupled to first input A of an adjacent main write MUX 1880 on its right side.

The select port S of each main write MUX 1880 can be configured to receive a write select signal indicative of the selection of one input (A or B). For example, a positive bias write select signal for each main write MUX 1880, i.e., the write select signal is enabled, may select second input B. A negative bias write select signal for each main write MUX 1880, i.e., the write select signal is disabled, may select first input A. In some implementations, a write select signal for a respective main write MUX 1880 in 1$^{st}$ write sub-array 1720*a* can be red1_en_b0_1_wt, red1_en_b0_h_wt, red1_en_b1_1_wt, red1_en_b1_h_wt, red1_en_b2_1_wt, red1_en_b2_h_wt, red1_en_b3_1_wt, or red1_en_b3_h_wt. A write select signal for a respective main write MUX 1880 in 2$^{nd}$ write sub-array 1720*b* can be red2_en_b0_1_wt, red2_en_b0_h_wt, red2_en_b1_1_wt, red2_en_b1_h_wt, red2_en_b2_1_wt, red2_en_b2_h_wt, red2_en_b3_1_wt, or red2_en_b3_h_wt.

The select port S of each redundant write MUX 1880 can be configured to receive a write select signal indicative of the selection of one input (A, B, C, or any other available redundant input). For example, a first level of the write select signal (which indicates that the write select signal is disabled) may select first input A, a second level of the write select signal may select second input B, a third level of the write select signal may select first redundant input C, so on and so forth. In some implementations, a write select signal for redundant write MUX 1881 in 1$^{st}$ write sub-array 1720*a* can be red1_en_b12_wt. A write select signal for redundant write MUX 1881 in 2$^{nd}$ write sub-array 1720*b* can be red2_en_b12_wt.

In some implementations, each main write MUX 1880 or redundant write MUX 1881 may be configured as a holding unit with memory functionality. The holding unit may be configured to memorize its previous output signal temporarily and keep outputting the previous output signal in a current clock cycle regardless of what the inputs are currently. For example, a write select signal may be configured to have a particular voltage level or current level (referred to as a holding level herein), such that main write MUX 1880 or redundant write MUX 1881 may become a holding unit in response to receiving the write select signal having the holding level. Exemplary applications of the holding unit are described below with reference to FIGS. 18B-18C and 19B-19C.

FIGS. 18B-18C illustrate an exemplary failed main bank repair scheme in data input implemented by memory device 1800 in FIG. 18A, according to some aspects of the present disclosure. Referring to FIG. 18B, assuming that Group 0 and Group 1 include 2 failed main banks in total. The 2 failed main banks may be distributed in Group 0 as shown in a table 1856 (e.g., B0_L and B0_H in Group 0 are failed main banks). FIG. 18B is described herein with combined reference to FIGS. 9 and 18A.

In some implementations, working bank logic 906 of I/O control logic 412 is coupled to registers 414 and configured to obtain bank fail information indicative of the 2 failed main banks from Group 0. Working bank logic 906 can determine 2×N working banks from Group 0 and Group 1 that can be used for data input and output. That is, working bank logic 906 can replace the 2 failed main banks with the same number of redundant banks, such that the 2×N working banks can include 2 redundant banks and 2×N−2 main banks from Group 0 and Group 1.

Based on the determined 2×N working banks, write redundant enable logic 904 can be configured to control I/O circuit 407 to direct 2×N pieces of data to the 2×N working banks, respectively. For example, write redundant enable logic 904 is coupled to each main write MUX 1880 and each redundant write MUX 1881 of each write sub-array 1720*a* or 1720*b*. Write redundant enable logic 904 is configured to provide a plurality of write select signals 903 to main write MUXs 1880 and redundant write MUX 1881 in each write sub-array 1720*a* or 1720*b* based on the determined 2×N working banks.

Assuming that first N pieces of data including (0,0), (0,1), . . . , and (0,7) (with N=8) are intended to be stored in N main banks of Group 0, and second N pieces of data including (1,0), (1,1), . . . , and (1,7) are intended to be stored in N main banks of Group 1. A data write order in FIG. 18B is from Group 0 to Group 1. A first row of a table 1850 shows that the first N pieces of data are respectively loaded to I/O signal lines 1801-1804 and 1806-1809 at a clock signal 0 (clk0). A second row of table 1850 also shows that the second N pieces of data are respectively loaded to I/O signal lines 1801-1804 and 1806-1809 at a clock signal 1 (clk1).

Initially, at clk0, the first N pieces of data (0,0), (0,1), . . . , and (0,7) are respectively inputted to main write MUXs 1880 of 1$^{st}$ write sub-array 1720*a* through I/O signal lines 1801-1804 and 1806-1809, as shown in a first row of table 1850.

At clk1, because B0_L of Group 0 is a failed main bank, write redundant enable logic 904 may enable red1_en_b0_1_wt, . . . , and red1_en_b1_h_wt, such that each main write MUX 1880 on the left side of redundant write MUX 1881 in 1$^{st}$ write sub-array 1720*a* may input data from second input B to achieve a right data shift of one bank. That is, data (0,0), (0,1), and (0,2) are shifted right by one bank by 1$^{st}$ write sub-array 1720*a* and outputted by signal lines 1812-1814, respectively, as shown in a first row of a table 1852. Write redundant enable logic 904 may further disable red1_en_b12_wt, such that (0,3) is re-directed to redundant write MUX 1881 of 1$^{st}$ write sub-array 1720*a* and outputted by signal line 1815, as shown in the first row of table 1852. As a result, each data (0,0), (0,1), (0,2), or (0,3) is shifted right by one bank by 1$^{st}$ write sub-array 1720*a* at clk1. For other data (0,4), (0,5), (0,6), and (0,7), no input data shift may be needed, such that write redundant enable logic 904 may disable red1_en_b2_1_wt, red1_en_b2_h_wt, red1_en_b3_1_wt, and red1_en_b3_h_wt. Then, each main write MUX 1880 on the right side of redundant write MUX 1881 may input data from first input A without data shift, and data (0,4), (0,5), (0,6), and (0,7) are outputted by 1$^{st}$ write sub-array 1720*a* through signal lines 1816-1819, respectively, as shown in the first row of table 1852. As a result, at clk1, the first N pieces of data (0,0), (0,1), (0,2), (0,3), (0,4), (0,5), (0,6), and (0,7) are inputted to 2$^{nd}$ write sub-array 1720*b* through signals 1812-1819, respectively. For example, at clk1, data (0,3) is inputted to redundant input C of redundant write MUX 1881 of 2$^{nd}$ write sub-array 1720*b* through signal line 1815.

Also at clk1, the second N pieces of data (1,0), (1,1), . . . , and (1,7) are respectively inputted to main write MUXs 1880 of 1$^{st}$ write sub-array 1720*a* through I/O signal lines 1801-1804 and 1806-1809, as shown in the second row of table 1850.

At a clock signal 2 (clk2), because B0_H of Group 0 is also a failed main bank, write redundant enable logic 904 may enable red2_en_b0_h_wt, red2_en_b1_1_wt, and red2_en_b1_h_wt, such that corresponding main write MUXs 1880 on the left side of redundant write MUX 1881 of 2$^{nd}$ write sub-array 1720*b* may input data (0,0) and (0,1) from second inputs B to achieve a right data shift of one bank. That is, data (0,0) and (0,1) are shifted right by one bank again and outputted by signal lines 1823 and 1824, respectively, as shown in a first row of a table 1854. Write redundant enable logic 904 may further disable red2_en_b12_wt, such that data (0,2) is re-directed to redundant write MUX 1881 of 2$^{nd}$ write sub-array 1720*b* from first input A and outputted by signal line 1825, as shown in the first row of table 1854. As a result, at clk2, each data (0,0), (0,1) or (0,2) is shifted right by one bank by $2^{nd}$ write sub-array 1720*b*, as shown in the first row of table 1854. For other data (0,4), (0,5), (0,6), and (0,7), no input data shift may be needed, and data (0,4), (0,5), (0,6), and (0,7) are respectively outputted by $2^{nd}$ write sub-array 1720*b* without data shift through signal lines 1826-1829, as shown in the first row of table 1854. As a result, at clk2, data (0,0), (0,1), (0,2), (0,4), (0,5), (0,6), and (0,7) from the first N pieces of data are outputted to 7 working banks in Group 0 through signal lines 1823-1829, respectively. That is, data (0,0), (0,1), (0,2), (0,4), (0,5), (0,6), and (0,7) from the first N pieces of data are stored in the 7 working banks of Group 0, as shown in a second row of table 1856.

Also at clk2, the second N pieces of data (1,0), (1,1), . . . , and (1,7) are respectively outputted from $1^{st}$ write sub-array 1720*a* without data shift through signal lines 1811-1814 and 1816-1819, as shown in a second row of table 1852. Write redundant enable logic 904 may produce a write select signal having a holding level for redundant write MUX 1881 of $1^{st}$ write sub-array 1720*a* (e.g., red1_en_b12_wt having a holding level), such that redundant write MUX 1881 of $1^{st}$ write sub-array 1720*a* is configured to be a holding unit to keep its previous output signal regardless of what the inputs are currently. Thus, redundant write MUX 1881 of $1^{st}$ write sub-array 1720*a* may still output data (0,3) through signal line 1815 at clk2 (e.g., the same as clk1), as shown in the second row of table 1852. That is, data (0,3) is still inputted to redundant input C of redundant write MUX 1881 of $2^{nd}$ write sub-array 1720*b* through signal line 1815 (e.g., the same as clk1). Thus, at clk2, the second N pieces of data are combined together with data (0,3) from the first N pieces of data and inputted to $2^{nd}$ write sub-array 1720*b*, respectively, as shown in the second row of table 1852.

At a clock signal 3 (clk3), the second N pieces of data (1,0), (1,1), . . . , and (1,7) are outputted by $2^{nd}$ write sub-array 1720*b* without data shift through signal lines 1821-1824 and 1826-1829, respectively, as shown in a second row of table 1854. Write redundant enable logic 904 may further enable red2_en_b12_wt to a third level, such that redundant write MUX 1881 of $2^{nd}$ write sub-array 1720*b* selects its output from redundant input C and outputs data (0,3) through signal line 1825, as shown in the second row of table 1854. That is, at clk3, the second N pieces of data (1,0), (1,1), . . . , and (1,7) are outputted and stored in the N main banks of Group 1, and data (0,3) from the first N pieces of data is outputted and stored in the redundant bank of Group 1, as shown in a first row of table 1856.

Referring to FIG. 18C, assuming that B0_L and B0_H in Group 0 are failed main banks as shown in a table 1866 (the same as table 1856 in FIG. 18B). Similar to FIG. 18B, the first N pieces of data including (0,0), (0,1), . . . , and (0,7) (with N=8) are intended to be stored in N main banks of Group 0, and the second N pieces of data including (1,0), (1,1), . . . , and (1,7) are intended to be stored in N main banks of Group 1. The difference between FIGS. 18B and 18C includes that a data write order in FIG. 18B is from Group 0 to Group 1, while a data write order in FIG. 18C is from Group 1 to Group 0. FIG. 18C is described herein with combined reference to FIGS. 9 and 18A.

A first row of a table 1860 in FIG. 18C shows that the second N pieces of data (1,0), (1,1), . . . , and (1,7) are respectively loaded to I/O signal lines 1801-1804 and 1806-1809 of FIG. 18A at clk0. That is, at clk0, the second N pieces of data are respectively inputted to main write MUXs 1880 of $1^{st}$ write sub-array 1720*a* through I/O signal lines 1801-1804 and 1806-1809.

At clk1, since there is no failed main bank in Group 1, the second N pieces of data (1,0), (1,1), . . . , and (1,7) are respectively outputted from $1^{st}$ write sub-array 1720*a* without data shift through signal lines 1811-1814 and 1816-1819, as shown in a first row of a table 1862.

Also at clk1, the first N pieces of data (0,0), (0,1), . . . , and (0,7) are respectively loaded to I/O signal lines 1801-1804 and 1806-1809. That is, at clk1, the first N pieces of data are respectively inputted to main write MUXs 1880 of $1^{st}$ write sub-array 1720*a* through I/O signal lines 1801-1804 and 1806-1809.

At clk2, the second N pieces of data (1,0), (1,1), . . . , and (1,7) that are already inputted to $2^{nd}$ write sub-array 1720*b* at clk1 may not be processed by $2^{nd}$ write sub-array 1720*b* yet. Because B0_L and B0_H of Group 0 are failed main banks, the second N pieces of data are kept being inputted to $2^{nd}$ write sub-array 1720*b* in order to wait for a piece of data from the first N pieces of data, so that the piece of data from the first N pieces of data can be written into the redundant bank of Group 1 at the same time when the second N pieces of data are written into the main banks of Group 1.

Specifically, at clk2, write redundant enable logic 904 may produce a write select signal having a holding level for each main write MUX 1880 of $1^{st}$ write sub-array 1720*a*, such that each main write MUX 1880 of $1^{st}$ write sub-array 1720*a* is configured to be a holding unit to keep its previous output signal of clk1 regardless of what the inputs are currently. That is, at clk2, the second N pieces of data (1,0), (1,1), . . . , and (1,7) are still respectively outputted from N main write MUXs 1880 of $1^{st}$ write sub-array 1720*a* without data shift through signal lines 1811-1814 and 1816-1819, as shown in a second row of table 1862. Meanwhile, write redundant enable logic 904 may produce a write select signal having a first level for redundant write MUX 1881 of $1^{st}$ write sub-array 1720*a* (e.g., write redundant enable logic 904 may disable red1_en_b12_wt for redundant write MUX 1881), so that data (0,3) from the first N pieces of data is re-directed to redundant write MUX 1881 of $1^{st}$ write sub-array 1720*a* from its input A and outputted by signal line 1815 (with a right data shift of one bank), as shown in the second row of table 1862. In this case, at clk2, the second N pieces of data (1,0), (1,1), . . . , and (1,7) as well as data (0,3) from the first N pieces of data are combined together and inputted to $2^{nd}$ write sub-array 1720*b* through signal lines 1811-1819, respectively.

Also at clk2, the first N pieces of data (0,0), (0,1), . . . , and (0,7) are not processed by main write MUXs 1880 of $1^{st}$ write sub-array 1720*a* (except that data (0,3) is processed by redundant write MUX 1881 of $1^{st}$ write sub-array 1720*a* as described above). The first N pieces of data are still respectively loaded to I/O signal lines 1801-1804 and 1806-1809, as shown in a third row of table 1860.

At clk3, the second N pieces of data (1,0), (1,1), . . . , and (1,7) as well as data (0,3) from the first N pieces of data are respectively outputted from N main write MUXs 1880 and redundant write MUX 1881 of $2^{nd}$ write sub-array 1720*b* without data shift through signal lines 1821-1829, as shown in a first row of a table 1864. That is, at clk3, the second N pieces of data (1,0), (1,1), . . . , and (1,7) are outputted and stored in the N main banks of Group 1, and data (0,3) from the first N pieces of data is outputted and stored in the redundant bank of Group 1, as shown in the first row of table 1866.

Also at clk3, because B0_L of Group 0 is a failed main bank, data (0,0), (0,1), and (0,2) are shifted right by one bank by 1st write sub-array 1720*a* and outputted by signal lines 1812-1814, respectively, as shown in a third row of table 1862. For other data (0,4), (0,5), (0,6), and (0,7), no input data shift may be needed. Data (0,4), (0,5), (0,6), and (0,7) are outputted by 1st write sub-array 1720*a* without data shift through signal lines 1816-1819, respectively, as shown in the third row of table 1862. As a result, at clk3, the first N pieces of data (0,0), (0,1), (0,2), (0,4), (0,5), (0,6), and (0,7) are inputted to 2nd write sub-array 1720*b* through signal lines 1812-1814 and 1816-1819, respectively.

At a clock signal 4 (clk4), because B0_H of Group 0 is also a failed main bank, data (0,0) and (0,1) are shifted right by one bank again by 2nd write sub-array 1720*b* and outputted by signal lines 1823 and 1824, respectively, as shown in a second row of table 1864. Data (0,2) is re-directed to redundant write MUX 1881 of 2nd write sub-array 1720*b* from its input A and outputted by signal line 1825 with a right data shift of one bank, as shown in the second row of table 1864. As a result, each data (0,0), (0,1) or (0,2) is shifted right by one bank by 2nd write sub-array 1720*b* at clk4. For other data (0,4), (0,5), (0,6), and (0,7), no input data shift may be needed, and data (0,4), (0,5), (0,6), and (0,7) are outputted by 2nd write sub-array 1720*b* without data shift through signal lines 1826-1829, respectively, as shown in the second row of table 1864. As a result, at clk4, data (0,0), (0,1), (0,2), (0,4), (0,5), (0,6), and (0,7) from the first N pieces of data are outputted to 7 working banks in Group 0 through signal lines 1823-1829, respectively. That is, data (0,0), (0,1), (0,2), (0,4), (0,5), (0,6), and (0,7) from the first N pieces of data are stored in the 7 working banks of Group 0, as shown in a second row of table 1866.

Figure 18D:
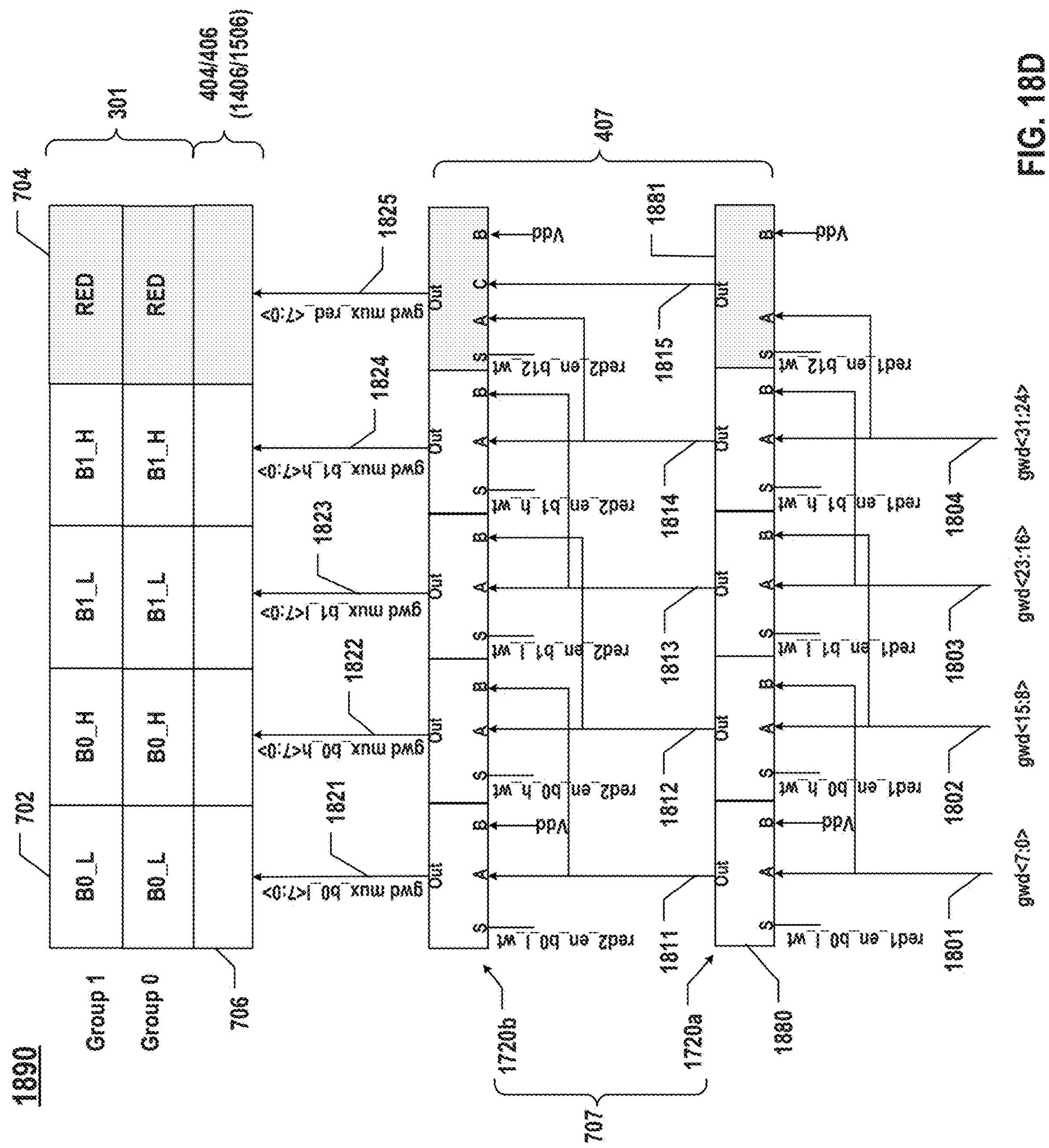
FIG. 18D illustrates a schematic diagram of another exemplary memory device that implements a failed main bank repair scheme in data input using a write MUX array with two write sub-arrays, according to some aspects of the present disclosure.

FIG. 18D illustrates a schematic diagram of another exemplary memory device 1890 that implements a failed main bank repair scheme in data input using a write MUX array with two write sub-arrays, according to some aspects of the present disclosure. Memory device 1890 may include components similar to those of any suitable memory device described herein (e.g., memory device 1800 of FIG. 18A), and the similar description will not be repeated here. By way of examples, each of Group 0 and Group 1 in FIG. 18D may include N main banks 702 with N=4 and 1 redundant bank 704 for concurrent data input/output. Write MUX array 707 of I/O circuit 407 may include 1st write sub-array 1720*a* and 2nd write sub-array 1720*b*. Each write sub-array 1720*a* or 1720*b* may include a redundant write MUX 1881 and N main write MUXs 1880 with N=4.

Redundant write MUX 1881 may be located at a left or right side of N main write MUXs 1880 in each write sub-array 1720*a* or 1720*b*. One of first and second inputs of redundant write MUX 1881 in each write sub-array 1320*a* or 1320*b* is coupled to first input A of an adjacent main write MUX 1880 in the same write sub-array, and another of the first and second inputs of redundant write MUX 1881 is coupled to a Vdd signal line. For example, as shown in FIG. 18D, redundant write MUX 1881 is located at the right side of N main write MUXs 1880 in each write sub-array 1720*a* or 1720*b*. First input A of redundant write MUX 1881 is coupled to first input A of an adjacent main write MUX 1880 on the left side. Second input B of redundant write MUX 1881 is coupled to the Vdd signal line.

Figure 19A:
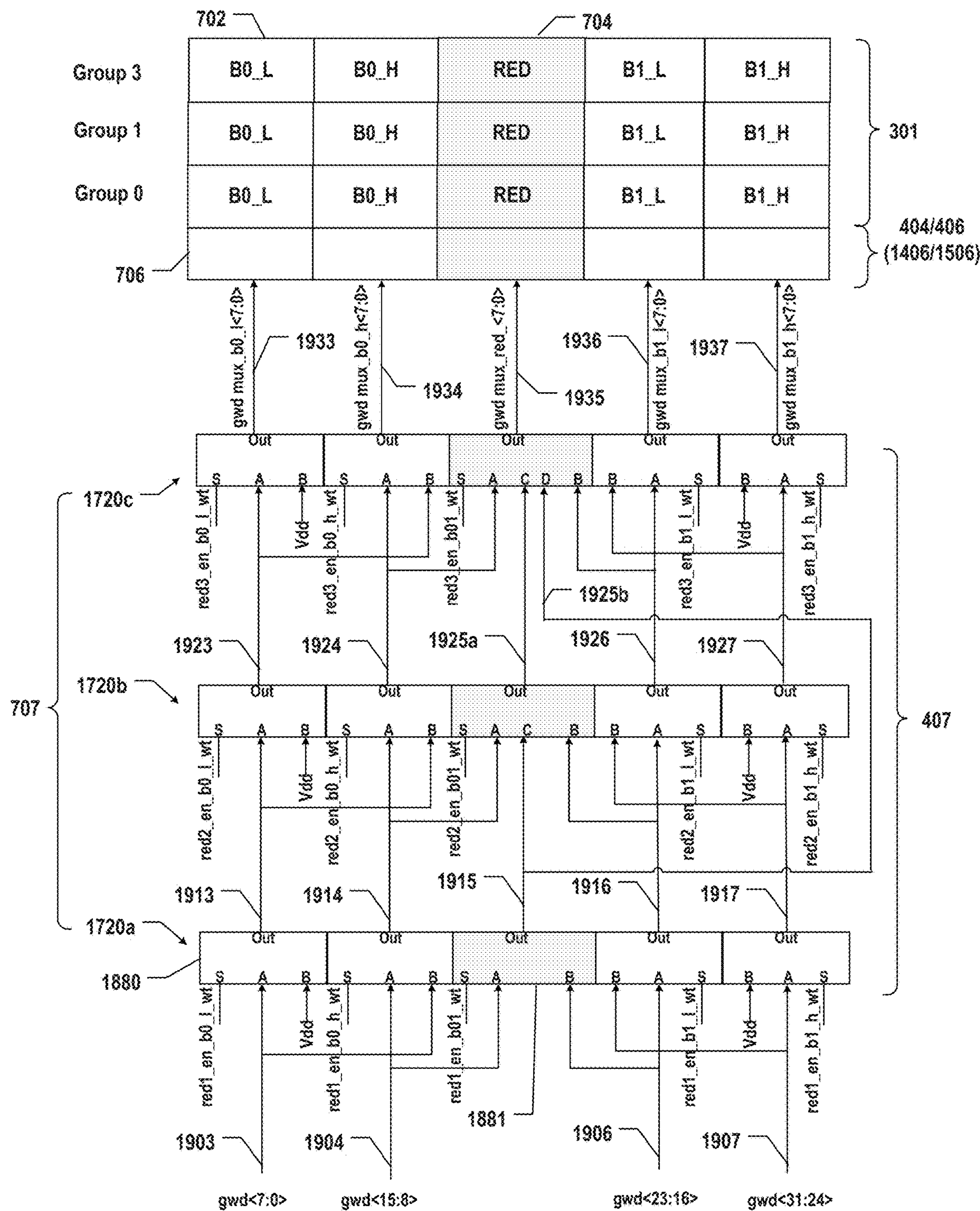
FIG. 19A illustrates a schematic diagram of an exemplary memory device that implements a failed main bank repair scheme in data input using a write MUX array with three write sub-arrays, according to some aspects of the present disclosure.

FIG. 19A illustrates a schematic diagram of an exemplary memory device 1900 that implements a failed main bank repair scheme in data input using a write MUX array with three write sub-arrays, according to some aspects of the present disclosure. Memory device 1900 may include components similar to those of any suitable memory device described herein, and the similar description will not be repeated here. In some implementations, memory device 1900 may include an array of memory cells including P groups of banks with P=3, e.g., Group 0, Group 1, and Group 2. Each group of banks may include N main banks 702 (e.g., N=4) and 1 redundant bank 704 for concurrent data input/output, and so, 3 redundant banks 704 are included in and shared by the 3 groups of banks.

Write MUX array 707 of FIG. 19A may include 1st write sub-array 1720*a*, 2nd write sub-array 1720*b*, and a 3rd write sub-array 1720*c*. Each write sub-array 1720*a*, 1720*b*, or 1720*c* may include a redundant write MUX 1881 and N main write MUXs 1880 (e.g., N=4). Redundant write MUX 1881 in 2nd write sub-array 1720*b* may include redundant input C, and redundant write MUX 1881 in 3rd write sub-array 1720*c* may include redundant inputs C and D.

With respect to 1st write sub-array 1720*a*, an output of each main write MUX 1880 is coupled to first input A of a corresponding main write MUX 1880 in 2nd write sub-array 1720*b* through a corresponding signal line (e.g., 1913, 1914, 1916, or 1917). An output of redundant write MUX 1881 in 1st write sub-array 1720*a* is coupled to redundant input C of redundant write MUX 1881 in 2nd write sub-array 1720*b* through a signal line 1915, and also coupled to redundant input D of redundant write MUX 1881 in 3rd write sub-array 1720*c* through a signal line 1925*b*. Signal line 1915 is connected to signal line 1925*b*. First input A of each main write MUX 1880 in 1st write sub-array 1720*a* is coupled to a corresponding I/O data line (e.g., 1903, 1904, 1906, or 1907), and configured to receive a corresponding piece of data from the corresponding I/O data line.

With respect to 2nd write sub-array 1720*b*, an output of each main write MUX 1880 is coupled to first input A of a corresponding main write MUX 1880 in 3rd write sub-array 1720*b* through a corresponding signal line (e.g., 1923, 1924, 1926, or 1927). An output of redundant write MUX 1881 in 2nd write sub-array 1720*b* is coupled to redundant input C of redundant write MUX 1881 in 3rd write sub-array 1720*c* through a signal line 1925*a*.

With respect to 3rd write sub-array 1720*c*, outputs of N main write MUXs 1880 and redundant write MUX 1881 are coupled to N main banks 702 and redundant bank 704 in a corresponding group of banks through signal lines 1933, 1934, 1935, 1936, and 1937, respectively.

With respect to each write sub-array 1720*a*, 1720*b*, or 1720*c*, first input A and second input B of redundant write MUX 1881 are respectively coupled to first inputs A of two adjacent main write MUXs 1880 in the same write sub-array. Second input B of each main write MUX 1880 in each write sub-array 1720*a*, 1720*b*, or 1720*c* is coupled to a Vdd signal line or first input A of an adjacent main write MUX 1880 in the same write sub-array. For example, for each main write MUX 1880 located at a respective end of each write sub-array 1720*a*, 1720*b*, or 1720*c*, second input B of the respective main write MUX 1880 is coupled to the Vdd signal line. For each main write MUX 1880 on a left side of redundant write MUX 1881 (except for the main write MUX 1880 on the left end), second input B of the respective main write MUX 1880 is coupled to first input A of an adjacent main write MUX 1880 on the left side. For each main write MUX 1880 on a right side of redundant write MUX 1881 (except for the main write MUX on the right end), second input B of the respective main write MUX 1880 is coupled to first input A of an adjacent main write MUX 1880 on the right side.

The select port S of each main write MUX 1880 can be configured to receive a write select signal indicative of the selection of one input (A or B). In some implementations, a write select signal for a respective main write MUX 1880 in 1st write sub-array 1720*a* can be red1_en_b0_1_wt, red1_en_b0_h_wt, red1_en_b1_1_wt, or red1_en_b1_h_wt. A write select signal for a respective main write MUX 1880 in 2nd write sub-array 1720*b* can be red2_en_b0_1_wt, red2_en_b0_h_wt, red2_en_b1_1_wt, or red2_en_b1_h_wt. A write select signal for a respective main write MUX 1880 in 3rd write sub-array 1720*c* can be red3_en_b0_1_wt, red3_en_b0_h_wt, red3_en_b1_1_wt, or red3_en_b1_h_wt.

The select port S of each redundant write MUX 1880 can be configured to receive a write select signal indicative of the selection of one input (A, B, C, D, or any other available input). For example, a first level of the write select signal (which indicates that the write select signal is disabled) may select first input A, a second level of the write select signal may select second input B, a third level of the write select signal may select redundant input C, and a fourth level of the write select signal may select redundant input D. In some implementations, write select signals for redundant write MUXs 1881 in 1st write sub-array 1720*a*, 2nd write sub-array 1720*b*, and 3rd write sub-array 1720*c* can be red1_en_b01_wt, red2_en_b01_wt, and red3_en_b01_wt, respectively.

FIGS. 19B-19C illustrate an exemplary failed main bank repair scheme in data input implemented by memory device 1900 in FIG. 19A, according to some aspects of the present disclosure. Referring to FIG. 19B, assuming that Group 0, Group 1, and Group 2 include 3 failed main banks in total. The 3 failed main banks may be distributed in Group 0 as shown in a table 1956 (e.g., B0_L, B0_H, and B1_L in Group 0 are failed main banks). FIG. 19B is described herein with combined reference to FIGS. 9 and 19A.

In some implementations, working bank logic 906 of I/O control logic 412 is coupled to registers 414 and configured to obtain the bank fail information indicative of the 3 failed main banks from Group 0. Working bank logic 906 can determine 3×N working banks from Group 0, Group 1, and Group 3 that can be used for data input and output. That is, working bank logic 906 can replace the 3 failed main banks with the same number of redundant banks, such that the 3×N working banks can include 3 redundant banks and 3×N−3 main banks in Group 0, Group 1, and Group 2.

Based on the determined 3×N working banks, write redundant enable logic 904 can be configured to control I/O circuit 407 to direct 3×N pieces of data to the 3×N working banks, respectively. For example, write redundant enable logic 904 is coupled to main write MUXs 1880 and redundant write MUX 1881 of each write sub-array 1720*a*, 1720*b*, or 1720*c*, and is configured to provide a plurality of write select signals 903 to main write MUXs 1880 and redundant write MUX 1881 in each write sub-array 1720*a*, 1720*b*, or 1720*c* based on the determined 3×N working banks.

Assuming that first N pieces of data including (0,0), (0,1), (0,2), and (0,3) (with N=4) are intended to be stored in N main banks of Group 0, second N pieces of data including (1,0), (1,1), (1,2), and (1,3) are intended to be stored in N main banks of Group 1, and third N pieces of data including (2,0), (2,1), (2,2), and (2,3) are intended to be stored in N main banks of Group 2. A data write order in FIG. 19B is from Group 0 to Group 1 and then to Group 2. FIG. 19B shows a table 1950 including the first N pieces of data respectively loaded to I/O signal lines 1903, 1904, 1906, and 1907 at clk0. Table 1950 also includes the second N pieces of data respectively loaded to I/O signal lines 1903, 1904, 1906, and 1907 at clk1. Table 1950 further includes the third N pieces of data respectively loaded to I/O signal lines 1903, 1904, 1906, and 1907 at clk2.

Initially, at clk0, the first N pieces of data (0,0), (0,1), (0,2), and (0,3) are respectively inputted to main write MUXs 1880 of 1st write sub-array 1720*a* through I/O signal lines 1903, 1904. 1906, and 1907, as shown in a first row of table 1950.

At clk1, because B0_L of Group 0 is a failed main bank, data (0,0) and (0,1) from the first N pieces of data are shifted right by one bank by 1st write sub-array 1720*a* and outputted through signal lines 1914-1915, respectively, as shown in a first row of a table 1952. For other data (0,2) and (0,3), no input data shift may be needed, and data (0,2) and (0,3) are outputted by 1st write sub-array 1720*a* without data shift through signal lines 1916 and 1917, respectively, as shown in the first row of table 1952. As a result, at clk1, the first N pieces of data (0,0), (0,1), (0,2) and (0,3) are inputted to 2nd write sub-array 1720*b* through signals 1914-1917, respectively. For example, at clk1, data (0,1) is inputted to redundant input C of redundant write MUX 1881 in 2 nd write sub-array 1720*b* through signal line 1915, and is also inputted to redundant input D of redundant write MUX 1881 in 3rd write sub-array 1720*b* through signal line 1925*b*.

Also at clk1, the second N pieces of data (1,0), (1,1), (1,2), and (1,3) are respectively inputted to main write MUXs 1880 of 1st write sub-array 1720*a* through I/O signal lines 1903, 1904, 1906, and 1907, as shown in a second row of table 1950.

At clk2, because B0_H of Group 0 is also a failed main bank, data (0,0) from the N pieces of data is re-directed to redundant write MUX 1881 of 2nd write sub-array 1720*b* from input A and outputted by redundant write MUX 1881 of 2nd write sub-array 1720*b* through signal line 1925*a* (with a right data shift of one bank), as shown in a first row of a table 1954. For other data (0,2) and (0,3), no input data shift may be needed, and data (0,2) and (0,3) are outputted by 2nd write sub-array 1720*b* without data shift through signal lines 1926 and 1927, respectively, as shown in the first row of table 1954. As a result, data (0,0), (0,2), and (0,3) from the first N pieces of data are outputted by 2nd write sub-array 1720*b* through signal lines 1925*a*, 1926, and 1927, respectively, as shown in the first row of table 1954.

Write redundant enable logic 904 may produce a write select signal having a holding level for redundant write MUX 1881 of 1st write sub-array 1720*a* (e.g., red1_en_b01_wt having a holding level). As a result, redundant write MUX 1881 of 1st write sub-array 1720*a* is configured as a holding unit to keep its previous output signal of clk1 and still output data (0,1) through signal line 1915 at clk2. Therefore, at clk2, data (0,1) is still inputted to redundant input C of redundant write MUX 1881 of 2nd write sub-array 1720*b* through signal line 1915 and redundant D of redundant write MUX 1881 of 3rd write sub-array 1720*c* through signal line 1925*b*. As a result, at clk2, the first N pieces of data (0,0), (0,1), (0,2), and (0,3) are inputted to 3rd write sub-array 1720*b* through signal lines 1925*a*, 1925*b*, 1926, and 1927, respectively, as shown in the first row of table 1954.

Also at clk2, the second N pieces of data (1,0), (1,1), (1,2), and (1,3) are respectively outputted from 1st write sub-array 1720*a* without data shift through signal lines 1913, 1914, 1916, and 1917, as shown in a second row of table 1952. As described above, at clk2, data (0,1) is still inputted to redundant input C of redundant write MUX 1881 of 2nd write sub-array 1720*b* through signal line 1915. As a result, at clk2, the second N pieces of data and data (0,1) from the first N pieces of data are respectively inputted to $2^{nd}$ write sub-array 1720*b* through signal lines 1913-1917, respectively, as shown in the second row of table 1952.

Also at clk2, the third N pieces of data (2,0), (2,1), (2,2), and (2,3) are respectively inputted to main write MUXs 1880 of $1^{st}$ write sub-array 1720*a* through I/O signal lines 1903, 1904, 1906, and 1907, as shown in a third row of table 1950.

At clk3, because B1_L of Group 0 is also a failed main bank, data (0,2) from the first N pieces of data is re-directed to redundant write MUX 1881 of $3^{rd}$ write sub-array 1720*c* from input B and outputted by redundant write MUX 1881 through signal line 1935 (with a left data shift of one bank), as shown in a first row of a table 1955. For data (0,3), no input data shift may be needed. Data (0,3) is outputted by $3^{rd}$ write sub-array 1720*c* with no data shift through signal line 1937, as shown in the first row of table 1955. As a result, at clk3, data (0,2) and (0,3) from the first N pieces of data are outputted to 2 working banks in Group 0 through signal lines 1935 and 1937, respectively. That is, data (0,2) and (0,3) from the first N pieces of data are stored in the 2 working banks of Group 0, as shown in a last row of table 1956.

Also at clk3, the second N pieces of data (1,0), (1,1), (1,2), and (1,3) are respectively outputted from N main write MUXs 1880 of $2^{nd}$ write sub-array 1720*b* without data shift through signal lines 1923, 1924, 1926, and 1927, as shown in a second row of table 1954. Furthermore, redundant write MUX 1881 of $1^{st}$ write sub-array 1720*a* is still configured as a holding unit to keep its previous output signal of clk2 and still output data (0,1) from the first N pieces of data through signal line 1915. Therefore, data (0,1) is still inputted to redundant input C of redundant write MUX 1881 of $2^{nd}$ write sub-array 1720*b* through signal line 1915 and redundant D of redundant write MUX 1881 of $3^{rd}$ write sub-array 1720*c* through signal line 1925*b*. Also, redundant write MUX 1881 of $2^{nd}$ write sub-array 1720*b* is configured as a holding unit to keep its previous output signal of clk2 and output data (0,0) from the first N pieces of data through signal line 1925*a* at clk3. Therefore, data (0,0) is still inputted to redundant input C of redundant write MUX 1881 of $3^{rd}$ write sub-array 1720*c* through signal line 1925*a*. As a result, at clk3, the second N pieces of data and data (0,0) and (0,1) from the first N pieces of data are respectively inputted to $3^{rd}$ write sub-array 1720*c* through signal lines 1913, 1924, 1925*a*, 1925*b*, 1926, and 1927, respectively, as shown in the second row of table 1954.

Also at clk3, the third N pieces of data (2,0), (2,1), (2,2), and (2,3) are respectively outputted from N main write MUXs 1880 of $1^{st}$ write sub-array 1720*a* without data shift through signal lines 1913, 1914, 1916, and 1917, as shown in a second row of table 1952. As described above, data (0,1) is still inputted to redundant input C of redundant write MUX 1881 of $2^{nd}$ write sub-array 1720*b* through signal line 1915 at clk3. As a result, at clk3, data (2,0), (2,1), (0,1), (2,2), and (2,3) are respectively inputted to $2^{nd}$ write sub-array 1720*b* through signal lines 1913-1917, respectively, as shown in the second row of table 1952.

At clk4, the second N pieces of data (1,0), (1,1), (1,2), and (1,3) are respectively outputted from N main write MUXs 1880 of $3^{rd}$ write sub-array 1720*c* without data shift through signal lines 1933, 1934, 1936, and 1937, as shown in a second row of table 1955. Write redundant enable logic 904 may enable red3_en_b01_wt to a third level, such that redundant write MUX 1881 of $3^{rd}$ write sub-array 1720*c* selects data (0,0) from its redundant input C and outputs data (0,0) through signal line 1935, as shown in the second row of table 1955. As a result, at clk4, the second N pieces of data are combined with data (0,0) from the first N pieces of data, so that the second N pieces of data and data (0,0) are outputted to 5 working banks in Group 1 through signal lines 1933-1937, respectively. That is, the second N pieces of data and data (0,0) from the first N pieces of data are stored in the 5 working banks of Group 1, as shown in a second row of table 1956.

Also at clk4, the third N pieces of data (2,0), (2,1), (2,2), and (2,3) are respectively outputted from N main write MUXs 1880 of $2^{nd}$ write sub-array 1720*b* without data shift through signal lines 1923, 1924, 1926, and 1927, as shown in a third row of table 1954. At clk4, redundant write MUX 1881 of $1^{st}$ write sub-array 1720*a* is also configured as a holding unit to keep its previous output signal of clk3 and still output data (0,1) from the first N piece of data through signal lines 1915 and 1925*b*. That is, data (0,1) is still inputted to redundant D of redundant write MUX 1881 of $3^{rd}$ write sub-array 1720*c* through signal line 1925*b*. As a result, at clk4, the third N pieces of data are combined with data (0,1) from the first N pieces of data, so that the third N pieces of data and data (0,1) are outputted to $3^{rd}$ write sub-array 1720*c* through signal lines 1923, 1924, 1925*b*, 1926, and 1927, respectively, as shown in the third row of table 1954.

At a clock signal 5 (clk5), the third N pieces of data (2,0), (2,1), (2,2), and (2,3) are respectively outputted from N main write MUXs 1880 of $3^{rd}$ write sub-array 1720*c* without data shift through signal lines 1933, 1934, 1936, and 1937, as shown in a third row of table 1955. Write redundant enable logic 904 may enable red3_en_b01_wt to a fourth level, such that redundant write MUX 1881 of $3^{rd}$ write sub-array 1720*c* selects data (0,1) from its redundant input D and outputs data (0,1) through signal line 1935, as shown in in the third row of table 1955. As a result, at clk5, the third N pieces of data and data (0,1) from the first N pieces of data are outputted to 5 working banks in Group 2 through signal lines 1933-1937, respectively. That is, the third N pieces of data and data (0,1) from the first N pieces of data are stored in the 5 working banks of Group 2, as shown in a first row of table 1956.

Referring to FIG. 19C, assuming that the first N pieces of data including (0,0), (0,1), (0,2), and (0,3) (with N=4) are intended to be stored in N main banks of Group 0, the second N pieces of data including (1,0), (1,1), (1,2), and (1,3) are intended to be stored in N main banks of Group 1, and the third N pieces of data including (2,0), (2,1), (2,2), and (2,3) are intended to be stored in N main banks of Group 2 (e.g., similar to that of FIG. 19B). The difference between FIGS. 19B and 19C includes that in FIG. 19C Group 0 has 2 failed main banks (e.g., B0_L, B1_L) and Group 1 has 1 failed main bank (e.g., B1_L), while in FIG. 19B Group 0 has 3 failed main banks.

FIG. 19C shows a table 1960 including the first N pieces of data respectively loaded to I/O signal lines 1903, 1904, 1906, and 1907 at clk0. Table 1960 also includes the second N pieces of data respectively loaded to I/O signal lines 1903, 1904, 1906, and 1907 at clk1. Table 1960 further includes the third N pieces of data respectively loaded to I/O signal lines 1903, 1904, 1906, and 1907 at clk2.

Initially, at clk0, the first N pieces of data (0,0), (0,1), (0,2), and (0,3) are respectively inputted to main write MUXs 1880 of $1^{st}$ write sub-array 1720*a* through I/O signal lines 1903, 1904. 1906, and 1907, as shown in a first row of table 1960.

At clk1, the first N pieces of data (0,0), (0,1), (0,2), and (0,3) are respectively outputted from N main write MUXs 1880 of 1$^{st}$ write sub-array **1720*a* without data shift through signal lines 1913, 1914, 1916, and 1917, as shown in a first row of a table 1962**.

At clk2, because B1_L of Group 0 is a failed main bank, redundant write MUX 1881 of 2$^{nd}$ write sub-array **1720*b* selects data (0,2) from its input B and outputs data (0,2) through signal line 1925*a*, as shown in a first row of a table 1964. As a result, data (0,2) is shifted left by one bank by 2$^{nd}$ write sub-array 1720*b* at clk2. For other data (0,0), (0,1), and (0,3), no input data shift may be needed. Then, data (0,0), (0,1), and (0,3) are outputted by 2$^{nd}$ write sub-array 1720*b* without data shift through signal lines 1923, 1924, and 1927, respectively, as shown in the first row of table 1964. As a result, at clk2, the first N pieces of data (0,0), (0,1), (0,2) and (0,3) are inputted to 3$^{rd}$ write sub-array 1720*c* through signal lines 1923, 1924, 1925*a*, and 1927, respectively. For example, at clk2, data (0,2) is inputted to redundant input C of redundant write MUX 1881 in 3$^{rd}$ write sub-array 1720*c* through signal line 1925*a***.

Also at clk2, the second N pieces of data (1,0), (1,1), (1,2), and (1,3) are respectively outputted from N main write MUXs 1880 of 1$^{st}$ write sub-array **1720*a* without data shift through signal lines 1913, 1914, 1916, and 1917, as shown in a second row of table 1962. Also at clk2, the third N pieces of data (2,0), (2,1), (2,2), and (2,3) are respectively inputted to main write MUXs 1880 of 1$^{st}$ write sub-array 1720*a* without data shift through I/O signal lines 1903, 1904, 1906, and 1907, as shown in a third row of table 1960**.

At clk3, because B0_L of Group 0 is also a failed main bank, data (0,0) and (0,1) from the first N pieces of data are shifted right by one bank by 3$^{rd}$ write sub-array **1720*c* and outputted through signal lines 1924 and 1935, respectively, as shown in a first row of a table 1965. For data (0,3), no input data shift may be needed. Data (0,3) is outputted by 3$^{rd}$ write sub-array 1720*c* without data shift through signal line 1937, as shown in the first row of table 1965. As a result, at clk3, data (0,0), (0,1), and (0,3) from the first N pieces of data are outputted to 3 working banks in Group 0 through signal lines 1934, 1935, and 1937, respectively. That is, data (0,0), (0,1), and (0,3) from the first N pieces of data are stored in the 3 working banks of Group 0, as shown in the last row of table 1966**.

Also at clk3, the second N pieces of data (1,0), (1,1), (1,2), and (1,3) are respectively outputted from N main write MUXs 1880 of 2$^{nd}$ write sub-array **1720*a* without data shift through signal lines 1923, 1924, 1926, and 1927, as shown in a second row of table 1964. Redundant write MUX 1881 of 2$^{nd}$ write sub-array 1720*b* is configured as a holding unit to keep its previous output signal of clk2 and output data (0,2) through signal line 1925*a* at clk3. Therefore, data (0,2) is still inputted to redundant input C of redundant write MUX 1881 of 3$^{rd}$ write sub-array 1720*b* through signal line 1925*a*. That is, at clk3, data (1,0), (1,1), (0,2), (1,2), and (1,3) are respectively inputted to 3$^{rd}$ write sub-array 1720*b* through signal lines 1923, 1924, 1925*a*, 1926, and 1927, respectively, as shown in the second row of table 1964**.

Also at clk3, the third N pieces of data (2,0), (2,1), (2,2), and (2,3) are respectively outputted from N main write MUXs 1880 of 1$^{st}$ write sub-array **1720*a* without data shift through signal lines 1913, 1914, 1916, and 1917, as shown in a third row of table 1962**.

At clk4, because B1_L of Group 1 is also a failed main bank, data (1,2) may be shifted left by one bank by redundant write MUX 1881 of 3$^{rd}$ write sub-array **1720*c* and outputted through signal line 1935, as shown in a second row of table 1965. For data (1,0), (1,1), and (1,3), no input data shift may be needed. Data (1,0), (1,1), and (1,3) are outputted by 3$^{rd}$ write sub-array 1720*c* without data shift through signal lines 1933, 1934, and 1937, respectively, as shown in the second row of table 1965. As a result, at clk4, the second N pieces of data (1,0), (1,1), (1,2), and (1,3) are outputted to 4 working banks in Group 1 through signal lines 1933-1935, and 1937, respectively. That is, the second N pieces of data (1,0), (1,1), (1,2), and (1,3) are stored in the 4 working banks of Group 1, as shown in a second row of table 1966**.

Also at clk4, the third N pieces of data (2,0), (2,1), (2,2), and (2,3) are respectively outputted from N main write MUXs 1880 of 2$^{nd}$ write sub-array **1720*a* without data shift through signal lines 1923, 1924, 1926, and 1927, as shown in a third row of table 1964. Redundant write MUX 1881 of 2$^{nd}$ write sub-array 1720*b* is also configured as a holding unit to keep its previous output signal of clk3 and still output data (0,2) through signal line 1925*a* at clk4. Therefore, data (0,2) is still inputted to redundant input C of redundant write MUX 1881 of 3$^{rd}$ write sub-array 1720*b* through signal line 1925*a*. That is, at clk4, data (2,0), (2,1), (0,2), (2,2), and (2,3) are respectively inputted to 3$^{rd}$ write sub-array 1720*c* through signal lines 1923, 1924, 1925*a*, 1926, and 1927, respectively, as shown in the third row of table 1964**.

At clk5, the third N pieces of data (2,0), (2,1), (2,2), and (2,3) are respectively outputted from N main write MUXs 1880 of 3$^{rd}$ write sub-array **1720*c* without data shift through signal lines 1933, 1934, 1936, and 1937, as shown in a third row of table 1965. Redundant write MUX 1881 of 3$^{rd}$ write sub-array 1720*c* selects data (0,2) from its redundant input C, and outputs data (0,2) through signal line 1935, as shown in the third row of table 1965. As a result, at clk5, the third N pieces of data and data (0,2) from the first N pieces of data are outputted to 5 working banks in Group 3 through signal lines 1933-1937, respectively. That is, the third N pieces of data and data (0,2) from the first N pieces of data are stored in the 5 working banks of Group 3, as shown in a first row of table 1966**.

Figure 20:
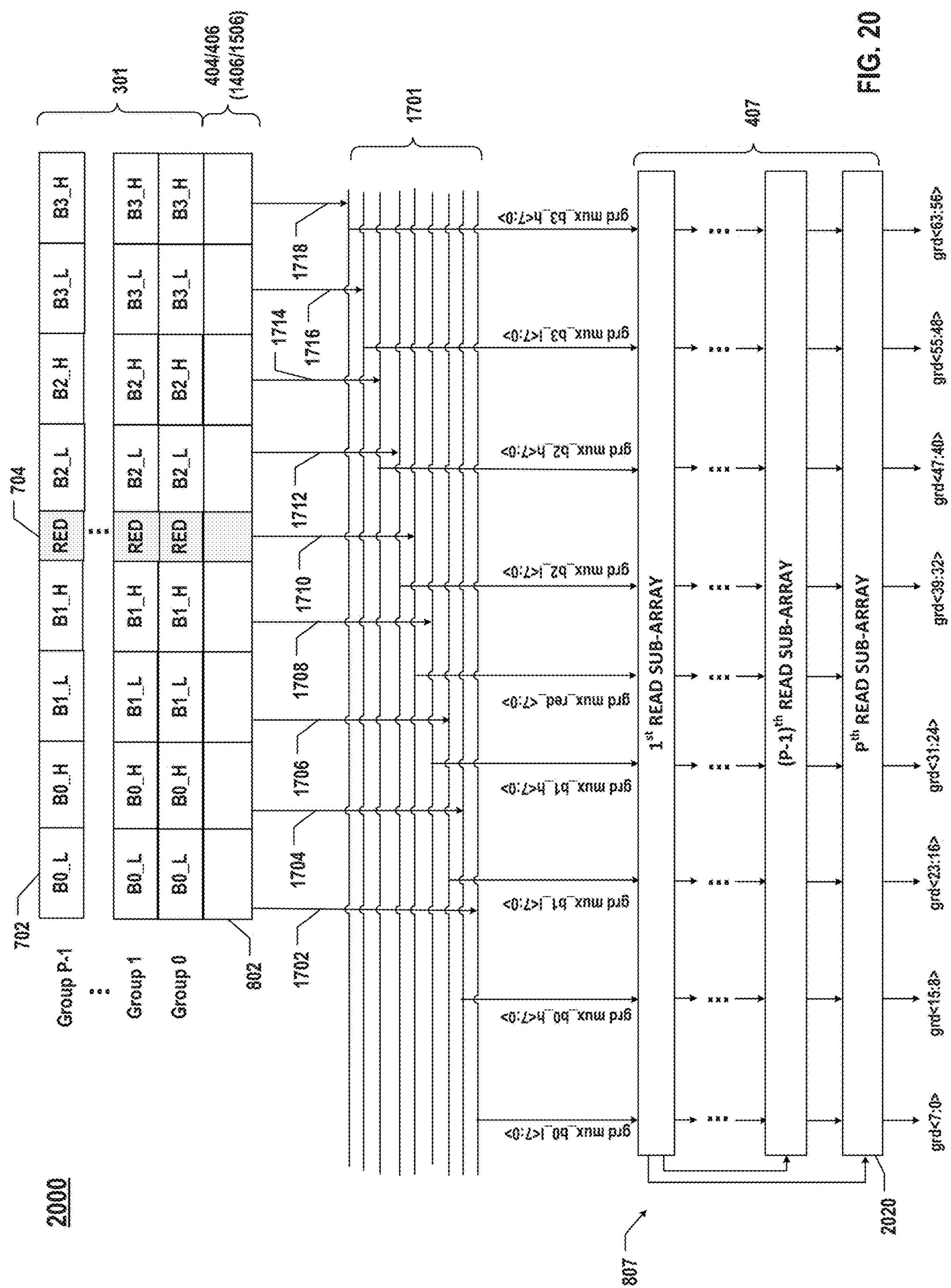
FIG. 20 illustrates a schematic diagram of an exemplary memory device that implements a failed main bank repair scheme in data output using a read MUX array with a plurality of read sub-arrays, according to some aspects of the present disclosure.

FIG. 20 illustrates a schematic diagram of an exemplary memory device 2000 that implements a failed main bank repair scheme in data output using a read MUX array with a plurality of read sub-arrays, according to some aspects of the present disclosure. In some implementations shown in FIG. 20, in data output (e.g., read operation), page buffer/sense amplifier 404 and column decoder/bit line driver 406 (or page buffer/sense amplifier portion 1406 and column decoder/bit line driver portion 1506) may include 9 sense amplifiers 802 respectively coupled to 8 main banks 702 and 1 redundant bank 704. Memory device 2000 may include components similar to those of any suitable memory device described herein (e.g., memory device 1700 of FIG. 17), and the similar description will not be repeated here.

I/O circuit 407 may include N+1 inputs respectively coupled to N main banks 702 and redundant bank 704 in each group of banks through data bus 1701 and a set of wirings including wires 1702, 1704, 1706, 1708, 1710, 1712, 1714, 1716, and 1718. For example, a respective bank can be coupled to an input of I/O circuit 407 through a respective data line of data bus 1701 and a respective wire in the set of wirings. I/O circuit 407 may include read MUX array 807. Under the control of I/O control logic 412, read MUX array 807 may be configured to direct P×N pieces of data from P×N working banks in P groups of banks, respectively. In some implementations, read MUX array 807 may include P read sub-arrays 2020 (e.g., a 1$^{st}$ read sub-array, a 2$^{nd}$ read sub-array, . . . , and a P$^{th}$ read sub-array) that are applied in series. Exemplary structures of each read sub-array 2020 are described below in more detail with reference to FIGS. 21A, 21C, and 22A.

Figure 21A:
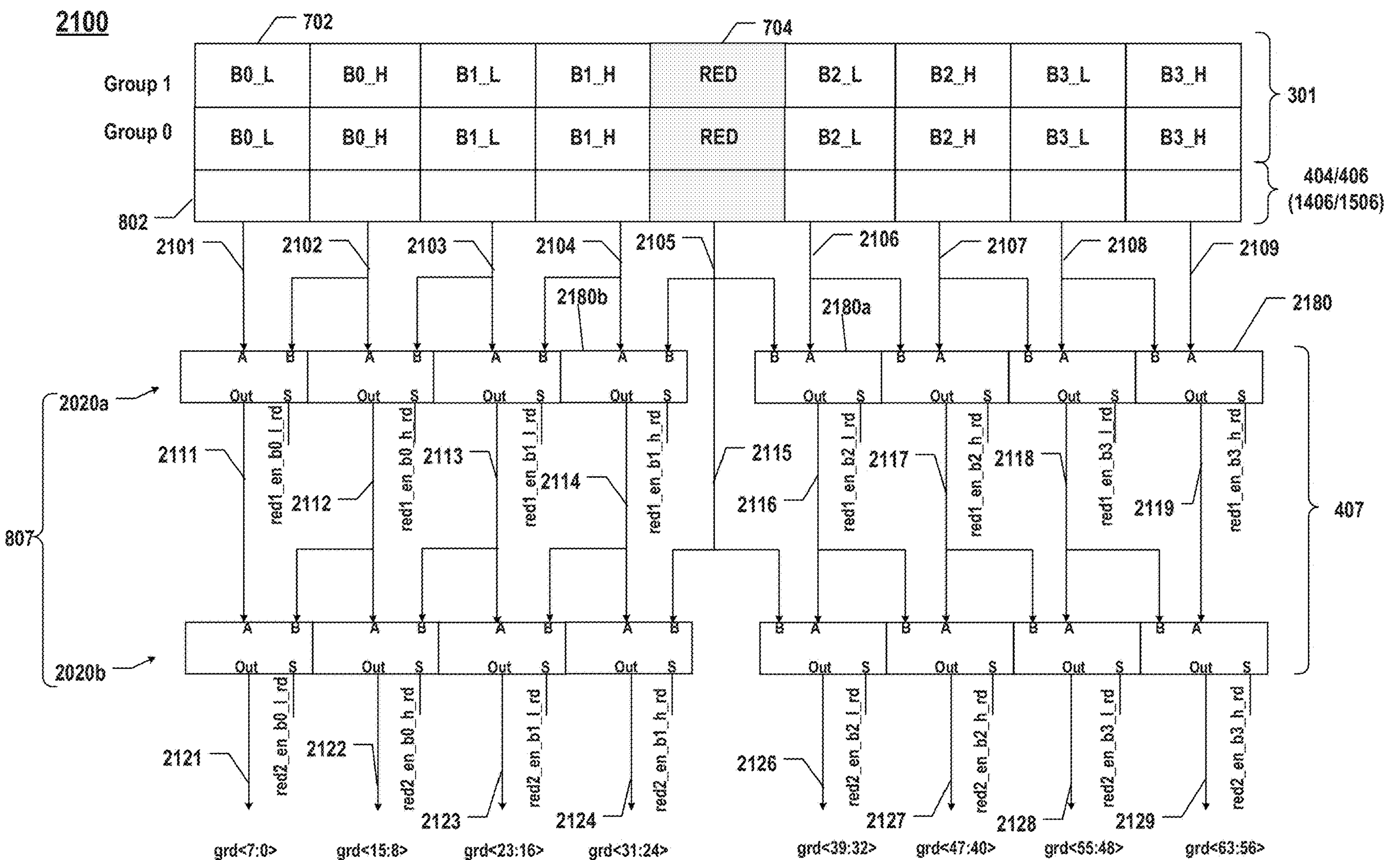
FIG. 21A illustrates a schematic diagram of an exemplary memory device that implements a failed main bank repair scheme in data output using a read MUX array with two read sub-arrays, according to some aspects of the present disclosure.

FIG. 21A illustrates a schematic diagram of an exemplary memory device 2100 that implements a failed main bank repair scheme in data output using a read MUX array with two read sub-arrays, according to some aspects of the present disclosure. Memory device 2100 may include components similar to those of any suitable memory device described herein, and the similar description will not be repeated here. In some implementations, memory device 2100 may include an array of memory cells including P groups of banks with P=2, e.g., Group 0 and Group 1. Each group of banks may include N main banks 702 (e.g., N=8) and 1 redundant bank 704 for concurrent data input/output, and so, 2 redundant banks 704 are included in and shared by the 2 groups of banks.

In some implementations shown in FIG. 21A, read MUX array 807 of I/O circuit 407 may include a 1$^{st}$ read sub-array 2020*a* and a 2$^{nd}$ read sub-array 2020*b* applied in series. Each read sub-array 2020*a* or 2020*b* may include N read MUXs 2180 (e.g., including read MUX 2180*a*, read MUX 2180*b*, etc.). Each read MUX 2180 may include a first input A, a second input B, a select port S, and an output Out, respectively.

In some implementations, each read sub-array 2020*a* or 2020*b* may have a structure similar to that of read MUX array 807 of FIG. 8. For example, two instances of read MUX array 807 of FIG. 8 can be cascaded in series and modified thereof to form read MUX array 807 of FIG. 21A. In general, P instances of read MUX array 807 of FIG. 8 can be cascaded in series and modified thereof to form a read MUX array with P read sub-arrays.

With respect to 1$^{st}$ read sub-array 2020*a*, first input A of each read MUX 2180 in 1$^{st}$ read sub-array 2020*a* is coupled to a corresponding main bank 702 through a corresponding signal line (e.g., 2101, 2102, 2103, 2104, 2106, 2107, 2108, or 2109). An output of each read MUX 2180 in 1$^{st}$ read sub-array 2020*a* is coupled to first input A of corresponding read MUX 2180 in 2$^{nd}$ read sub-array 2020*b* through a corresponding signal line (e.g., 2111, 2112, 2113, 2114, 2116, 2117, 2118, or 2119).

With respect to 2$^{nd}$ read sub-array 2020*b*, an output of each read MUX 2180 in 2$^{nd}$ read sub-array 2020*b* is coupled to a corresponding I/O data line (e.g., 2121, 2122, 2123, 2124, 2126, 2127, 2128, or 2129), and is configured to output a corresponding piece of data to the corresponding I/O data line.

With respect to each read sub-array 2020*a* or 2020*b*, the select port S of each read MUX 2180 can be configured to receive a read select signal indicative of the selection of one input (A or B). For example, a positive bias read select signal for each read MUX 2180, i.e., the read select signal is enabled, may select second input B. Second input B of each read MUX 2180 in read sub-array 2020*a* or 2020*b* is coupled to first input A of an adjacent read MUX 2180 in the same read sub-array, or is coupled to redundant bank 704 through a corresponding signal line (e.g., 2105 or 2115). Signal line 2115 is connected to signal line 2105 and coupled to redundant bank 704.

For example, in each group of banks, redundant bank 704 may be located among the N main banks 702, and the N main banks 702 may be divided into two sets of main banks (e.g., a left set of main banks and a right set of main banks respectively located on the left side and the right side of redundant bank 704). The N read MUXs 2180 in each read sub-array 2020*a* or 2020*b* can be divided into a left set of read MUXs 2180 and a right set of read MUXs 2180 that correspond to the left set of main banks and the right set of main banks, respectively. In each read sub-array 2020*a* or 2020*b*, second input B of a first read MUX (e.g., read MUX 2180*b*) in the left set of read MUXs 2180 is coupled to redundant bank 704 through signal line 2105 or 2115, and second input B of each remaining read MUX 2180 in the left set of read MUXs 2180 is coupled to first input A of an adjacent read MUX 2180 on its right. Second input B of a first read MUX (e.g., read MUX 2180*a*) in the right set of read MUXs 2180 is coupled to redundant bank 704 through signal line 2105 or 2115, and second input B of each remaining read MUX 2180 in the right set of read MUXs 2180 is coupled to first input A of an adjacent read MUX 2180 on its left.

FIG. 21B illustrates an exemplary failed main bank repair scheme in data output implemented by memory device 2100 in FIG. 21A, according to some aspects of the present disclosure. Assuming that Group 0 and Group 1 include 2 failed main banks in total. The 2 failed main banks may be distributed in Group 0 as shown in a table 2156 (e.g., B0_L and B0_H in Group 0 are failed main banks). FIG. 21B is described herein with combined reference to FIGS. 20 and 21A.

In some implementations, working bank logic 906 of I/O control logic 412 is coupled to registers 414 and configured to obtain the bank fail information indicative of the 2 failed main banks from Group 0. Working bank logic 906 can determine 2×N working banks from Group 0 and Group 1 that can be used for data input and output. Based on the determined 2×N working banks, read redundant enable logic 902 can be configured to control I/O circuit 407 to direct 2×N pieces of data from the 2×N working banks, respectively. For example, read redundant enable logic 902 is coupled to each read MUX 2180, and is configured to provide a plurality of read select signals 905 to read MUXs 2180 in each read sub-array 2020*a* or 2020*b* based on the determined 2×N working banks. For example, the plurality of read select signals 905 may include red1_en_b0_1_rd, red1_en_b0_h_rd, red1_en_b1_1_rd, red1_en_b1_h_rd, red1_en_b2_1_rd, red1_en_b2_h_rd, red1_en_b3_1_rd, and red1_en_b3_h_rd for read MUXs 2180 in 1$^{st}$ read sub-array 2020*a*, and include red2_en_b0_1_rd, red2_en_b0_h_rd, red2_en_b1_1_rd, red2_en_b1_h_rd, red2_en_b2_1_rd, red2_en_b2_h_rd, red2_en_b3_1_rd, and red2_en_b3_h_rd for read MUXs 2180 in 2$^{nd}$ read sub-array 2020*b*.

Assuming that 7 pieces of data (0,0), (0,1), (0,2), (0,4), . . . , and (0,7) from first N pieces of data (with N=8) are stored in 7 working banks of Group 0, and second N pieces of data including (1,0), (1,1), . . . , and (1,7) and data (0,3) from the first N pieces of data are stored in N+1 working banks of Group 1, as shown in a table 2156. A data read order in FIG. 21B is from Group 0 to Group 1. A table 2150 shows that the 7 pieces of data (0,0), (0,1), (0,2), (0,4), . . . , and (0,7) from the first N pieces of data are respectively read out from the 7 working banks of Group 0 and loaded to signal lines 2103-2109 at clk0. Table 2150 also shows that the second N pieces of data and data (0,3) from the first N pieces of data are respectively read out from the N+1 working banks of Group 1 and loaded to signal lines 2101-2109 at clk1.

Initially, at clk0, the 7 pieces of data (0,0), (0,1), (0,2), (0,4), . . . , and (0,7) from the first N pieces of data are respectively inputted to read MUXs 2180 of 1$^{st}$ read sub-array 2020*a* through signal lines 2103-2109, as shown in a table 2150.

At clk1, because B0_H of Group 0 is a failed main bank, read redundant enable logic 902 may enable red1_en_b0_1_rd, . . . , and red1_en_b1_h_rd, such that each read MUX 2180 in the left set of read MUXs 2180 in 1$^{st}$ read sub-array 2020*a* may input data from its input B with a left data shift of one bank. That is, data (0,0), (0,1), and (0,2) are shifted left by one bank and outputted by signal lines 2112-2114, respectively, as shown in a table 2152. For other data (0,4), (0,5), (0,6), and (0,7), no input data shift may be needed, such that read redundant enable logic 902 may disable red1_en_b2_1_rd, . . . , and red1_en_b3_h_rd, such that each read MUX 2180 in the right set of read MUXs 2180 in 1$^{st}$ read sub-array 2020*a* may input data from input A without data shift. Then, data (0,4), (0,5), (0,6), and (0,7) are outputted by signal lines 2116-2119, respectively, as shown in table 2152.

Also at clk1, the second N pieces of data and data (0,3) from the first N pieces of data are respectively inputted to read MUXs 2180 of 1$^{st}$ read sub-array 2020*a* through signal lines 2101-2109, as shown in table 2150. For example, data (0,3) from the first N pieces of data is inputted to read MUXs 2180*a* and 2180*b* of 1$^{st}$ read sub-array 2020*a* through signal line 2105. Since signal line 2115 is connected to signal line 2105, data (0,3) is also inputted to read MUXs 2180*a* and 2180*b* of 2$^{nd}$ read sub-array 2020*b* through signal line 2115. As a result, at clk1, the first N pieces of data (0,0), (0,1), (0,2), (0,3), (0,4), (0,5), (0,6), and (0,7) are inputted to 2$^{nd}$ read sub-array 2020*b* through signals 2112-2119, respectively.

At clk2, because B0_L of Group 0 is also a failed main bank, read redundant enable logic 902 may enable red1_en_b0_1_rd, . . . , and red1_en_b1_h_rd, such that each read MUX 2180 in the left set of read MUX 2180 in 2$^{nd}$ read sub-array 2020*b* may input data from its input B with a left data shift of one bank. That is, data (0,0), (0,1), (0,2), and (0,3) are shifted left by one bank and outputted by I/O data lines 2121-2124, respectively, as shown in a table 2154. For other data (0,4), (0,5), (0,6), and (0,7), no input data shift may be needed. Then, data (0,4), (0,5), (0,6), and (0,7) are outputted by 2$^{nd}$ read sub-array 2020*b* with no data shift through signal lines 2126-2129, respectively, as shown in table 2154. As a result, the first N pieces of data are successfully outputted from read MUX array 807.

Also at clk2, the second N pieces of data are respectively outputted by read MUXs 2180 of 1$^{st}$ read sub-array 2020*a* through signal lines 2111-2114 and 2116-2109 with no data shift, as shown in table 2152. The second N pieces of data are respectively inputted to read MUXs 2180 of 2$^{nd}$ read sub-array 2020*a* through signal lines 2111-2114 and 2116-2119.

At clk3, the second N pieces of data are respectively outputted by read MUXs 2180 of 2$^{nd}$ read sub-array 2020*b* through signal lines 2121-2124 and 2126-2129 with no data shift, as shown in table 2154. As a result, the second N pieces of data are successfully outputted from read MUX array 807.

Figure 21C:
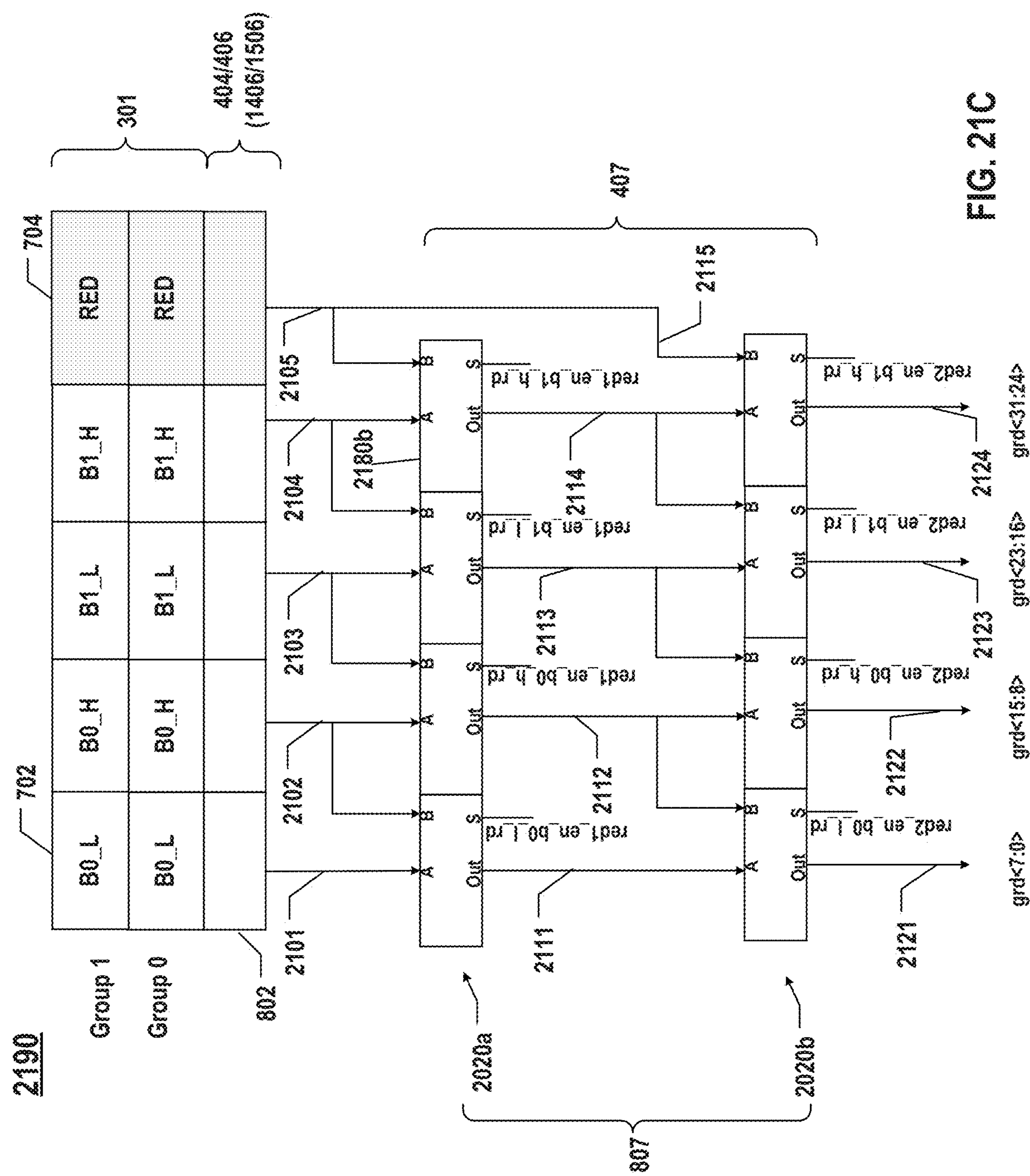
FIG. 21C illustrates a schematic diagram of another exemplary memory device that implements a failed main bank repair scheme in data output using a read MUX array with two read sub-arrays, according to some aspects of the present disclosure.

FIG. 21C illustrates a schematic diagram of another exemplary memory device 2190 that implements a failed main bank repair scheme in data output using a read MUX array with two read sub-arrays, according to some aspects of the present disclosure. Memory device 2190 may include components similar to those of any suitable memory device described herein (e.g., memory device 2100 of FIG. 21A), and the similar description will not be repeated here.

By way of examples, each of Group 0 and Group 1 in FIG. 21C may include N=4 main banks 702 and 1 redundant bank 704 for concurrent data input/output. Read MUX array 807 of I/O circuit 407 may include 1$^{st}$ read sub-array 2020*a* and 2$^{nd}$ read sub-array 2020*b*. Each read sub-array 2020*a* or 2020*b* may include N=4 read MUXs 2180.

In each group of banks shown in FIG. 21C, the N main banks 702 may be located on a left side of redundant bank 704, and may be referred to as a left set of main banks. The N read MUXs 2180 in each read sub-array 2020*a* or 2020*b* can be referred to as a left set of read MUXs 2180 corresponding to the left set of main banks. In each read sub-array 2020*a* or 2020*b*, second input B of a first read MUX (e.g., read MUX 2180*b*) in the left set of read MUXs 2180 is coupled to redundant bank 704 through signal line 2105 or 2115. Second input B of each remaining read MUX 2180 in the left set of read MUXs 2180 is coupled to first input A of an adjacent read MUX 2180 on its right.

In some other implementations, the N main banks 702 may locate on the right side of redundant bank 704, and the N main banks 702 may be referred to as a right set of main banks. The N read MUXs 2180 in each read sub-array 2020*a* or 2020*b* can be referred to as a right set of read MUXs 2180 corresponding to the right set of main banks. In each read sub-array 2020*a* or 2020*b*, second input B of a first read MUX (e.g., read MUX 2180*a*) in the right set of read MUXs 2180 is coupled to redundant bank 704 through signal line 2105 or 2115. Second input B of each remaining read MUX 2180 in the right set of read MUXs 2180 is coupled to first input A of an adjacent read MUX 2180 on its left.

Figure 22A:
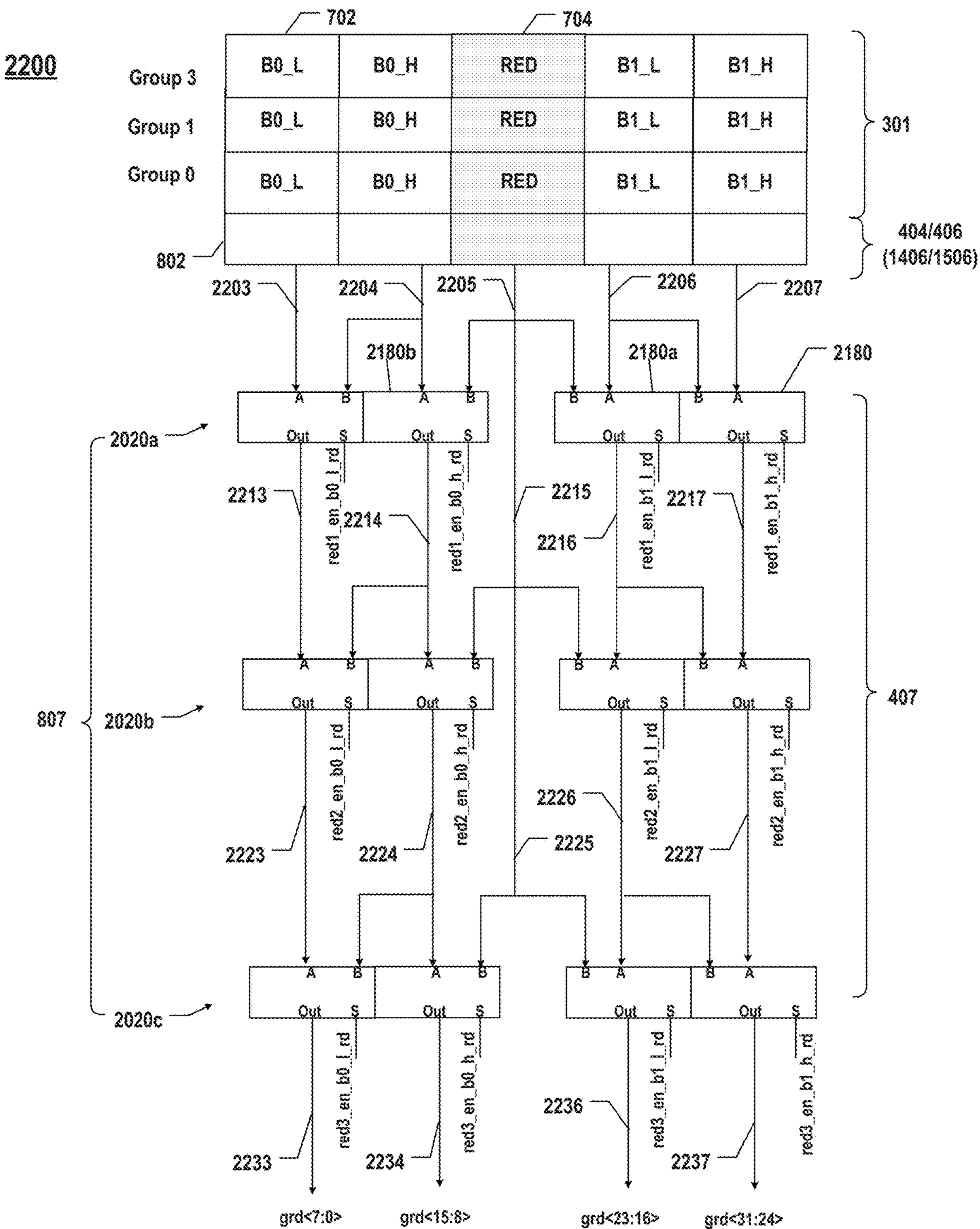
FIG. 22A illustrates a schematic diagram of an exemplary memory device that implements a failed main bank repair scheme in data output using a read MUX array with three read sub-arrays, according to some aspects of the present disclosure.

FIG. 22A illustrates a schematic diagram of an exemplary memory device 2200 that implements a failed main bank repair scheme in data output using a read MUX array with three read sub-arrays, according to some aspects of the present disclosure. Memory device 2200 may include components similar to those of any suitable memory device described herein, and the similar description will not be repeated here. In some implementations, memory device 2200 may include an array of memory cells including P groups of banks with P=3, e.g., Group 0, Group 1, and Group 2. Each group of banks may include N main banks 702 (e.g., N=4) and 1 redundant bank 704 for concurrent data input/output, and so, 3 redundant banks 704 are included in and shared by the 3 groups of banks. Read MUX array 807 of I/O circuit 407 may include 1$^{st}$ read sub-array 2020*a*, 2$^{nd}$ read sub-array 2020*b*, and a 3$^{rd}$ read sub-array 2020*c*. Each read sub-array 2020*a*, 2020*b*, or 2020*c* may include N read MUXs 2180 (e.g., N=4). Each read MUX 2180 may include a first input A, a second input B, a select port S, and an output Out, respectively.

With respect to 1$^{st}$ read sub-array 2020*a*, first input A of each read MUX 2180 in 1$^{st}$ read sub-array 2020*a* is coupled to a corresponding main bank 702 through a corresponding signal line (e.g., 2203, 2204, 2206, or 2207). An output of each read MUX 2180 in 1$^{st}$ read sub-array 2020*a* is coupled to first input A of corresponding read MUX 2180 in 2$^{nd}$ read sub-array 2020*b* through a corresponding signal line (e.g., 2213, 2214, 2216, or 2217). With respect to 2$^{nd}$ read sub-array 2020*b*, an output of each read MUX 2180 in 2$^{nd}$ read sub-array 2020*b* is coupled to first input A of corresponding read MUX 2180 in 3$^{rd}$ read sub-array 2020*c* through a corresponding signal line (e.g., 2223, 2224, 2226, or 2227). With respect to 3$^{rd}$ read sub-array 2020*c*, an output of each read MUX 2180 in 3$^{rd}$ read sub-array 2020*c* is coupled to a corresponding I/O data line (e.g., 2233, 2234, 2236, or 2237), and is configured to output a corresponding piece of data to the corresponding I/O data line.

With respect to each read sub-array 2020*a*, 2020*b*, or 2020*c*, the select port S of each read MUX 2180 can be configured to receive a read select signal indicative of the selection of one input (A or B). Second input B of each read MUX 2180 in read sub-array 2020*a*, 2020*b*, or 2020*c* is coupled to first input A of an adjacent read MUX 2180 in the same read sub-array, or coupled to redundant bank 704 through a corresponding signal line (e.g., 2205, 2215, or 2225). Signal lines 2215 and 2225 are connected to signal line 2205 and coupled to redundant bank 704.

For example, in each read sub-array 2020*a*, 2020*b*, or 2020*c*, second input B of a first read MUX (e.g., read MUX 2180*b*) in the left set of read MUXs 2180 is coupled to redundant bank 704 through signal line 2205, 2215, or 2225. Second input B of each remaining read MUX 2180 in the left set of read MUXs 2180 is coupled to first input A of an adjacent read MUX 2180 on its right. Second input B of a first read MUX (e.g., read MUX 2180*a*) in the right set of read MUXs 2180 is coupled to redundant bank 704 through signal line 2205, 2215, or 2225. Second input B of each remaining read MUX 2180 in the right set of read MUXs 2180 is coupled to first input A of an adjacent read MUX 2180 on its left.

FIGS. 22B-22C illustrate an exemplary failed main bank repair scheme in data output implemented by the memory device in FIG. 21A, according to some aspects of the present disclosure. Referring to FIG. 22B, assuming that Group 0, Group 1, and Group 2 include 3 failed main banks in total. The 3 failed main banks may be distributed in Group 0 as shown in a table 2256 (e.g., B0_L, B0_H, and B1_L in Group 0 are failed main banks). FIG. 22B is described herein with combined reference to FIGS. 9, 20, and 22A.

In some implementations, working bank logic 906 of I/O control logic 412 is coupled to registers 414 and configured to obtain bank fail information indicative of the 3 failed main banks from Group 0. Working bank logic 906 can determine 3×N working banks from Group 0, Group 1, and Group 2 that can be used for data input and output. Based on the determined 3×N working banks, read redundant enable logic 902 can be configured to control I/O circuit 407 to direct 3×N pieces of data from the 3×N working banks, respectively. For example, read redundant enable logic 902 is coupled to each read MUXs 2180, and is configured to provide a plurality of read select signals 905 to read MUXs 2180 in each read sub-array 2020*a*, 2020*b*, or 2020*c* based on the determined 3×N working banks. For example, the plurality of read select signals 905 may include red1_en_b0_1_rd, red1_en_b0_h_rd, red1_en_b1_1 rd, and red1_en_b1_h_rd for read MUXs 2180 in 1$^{st}$ read sub-array 2020*a*, red2_en_b0_1_rd, red2_en_b0_h_rd, red2_en_b1_1_rd, and red2_en_b1_h_rd for read MUXs 2180 in 2$^{nd}$ read sub-array 2020*b*, and red3_en_b0_1_rd, red3_en_b0_h_rd, red3_en_b1_1_rd, and red3_en_b1_h_rd for read MUXs 2180 in 3$^{rd}$ read sub-array 2020*c*.

Assuming that data (0,2) and (0,3) from first N pieces of data (with N=4) are stored in 2 working banks of Group 0, second N pieces of data including (1,0), (1,1), (1,2), and (1,3) and data (0,0) from the first N pieces of data are stored in N+1 working banks of Group 1, and third N pieces of data including (2,0), (2,1), (2,2), and (2,3) and data (0,1) from the first N pieces of data are stored in N+1 working banks of Group 2, as shown in a table 2256. A data read order in FIG. 22B is from Group 0 to Group 1 and then to Group 2.

A table 2250 shows that data (0,2) and (0,3) from the first N pieces of data are respectively read out from the 2 working banks of Group 0 and loaded to signal lines 2205 and 2207 at clk0. Table 2250 also shows that the second N pieces of data and data (0,0) from the first N pieces of data are respectively read out from the N+1 working banks of Group 1 and loaded to signal lines 2203-2107 at clk1. Table 2250 further shows that the third N pieces of data and data (0,1) from the first N pieces of data are respectively read out from the N+1 working banks of Group 2 and loaded to signal lines 2203-2107 at clk2.

Initially, at clk0, data (0,2) and (0,3) from the first N pieces of data are respectively inputted to read MUXs 2180 of 1$^{st}$ read sub-array 2020*a* through signal lines 2205 and 2207, as shown in a table 2250.

At clk1, because B1_L of Group 0 is a failed main bank, data (0,2) inputted to read MUX 2180*a* in 1$^{st}$ read sub-array 2020*a* may be shifted right by one bank, and outputted by read MUX 2180*a* through signal line 2216, as shown in a table 2252. For data (0,3), no input data shift may be needed, such that a corresponding read MUX 2180 in the right set of read MUXs 2180 in 1$^{st}$ read sub-array 2020*a* may select data (0,3) from its input A without data shift. Then, data (0,2) and (0,3) are outputted by signal lines 2216 and 2217, respectively, as shown in table 2252.

Also at clk1, the second N pieces of data and data (0,0) from the first N pieces of data are respectively inputted to read MUXs 2180 of 1$^{st}$ read sub-array 2020*a* through signal lines 2203-2207, as shown in table 2250. For example, data (0,0) from the first N pieces of data is inputted to read MUXs 2180*a* and 2180*b* of 1$^{st}$ read sub-array 2020*a* through signal line 2205. Since signal line 2215 is connected to signal line 2205, data (0,0) is also inputted to read MUXs 2180*a* and 2180*b* of 2$^{nd}$ read sub-array 2020*b* through signal line 2215. As a result, at clk1, data (0,0), (0,2), and (0,3) from the first N pieces of data are inputted to 2$^{nd}$ read sub-array 2020*b* through signals 2215-2217, respectively.

At clk2, because B0_H of Group 0 is a failed main bank, data (0,0) may be shifted left by one bank and outputted by read MUX 2180*b* in 2$^{nd}$ read sub-array 2020*b* through signal line 2224, as shown in a table 2254. For data (0,2) and (0,3), no input data shift may be needed, such that corresponding read MUXs 2180 in the right set of read MUXs 2180 in 2$^{nd}$ read sub-array 2020*b* may select data (0,2) and (0,3) from inputs A without data shift. Then, data (0,0), (0,2) and (0,3) are outputted by signal lines 2224, 2226, and 2227, respectively, as shown in table 2254.

Also at clk2, the second N pieces of data are respectively outputted by read MUXs 2180 of 1$^{st}$ read sub-array 2020*a* through signal lines 2213, 2214, 2216, and 2217 with no data shift, as shown in table 2252. The second N pieces of data are respectively inputted to read MUXs 2180 of 2$^{nd}$ read sub-array 2020*b* through signal lines 2213, 2214, 2216, and 2217.

Also at clk2, the third N pieces of data and data (0,1) from the first N pieces of data are respectively inputted to read MUXs 2180 of 1$^{st}$ read sub-array 2020*a* through signal lines 2203-2207, as shown in table 2250. For example, data (0,1) from the first N pieces of data is inputted to read MUXs 2180*a* and 2180*b* of 1$^{st}$ read sub-array 2020*a* through signal line 2205. Since signal line 2225 is connected to signal line 2205, data (0,1) is also inputted to read MUXs 2180*a* and 2180*b* of 3$^{rd}$ read sub-array 2020*c* through signal line 2225. As a result, at clk2, data (0,0), (0,1), (0,2), and (0,3) from the first N pieces of data are inputted to 3$^{rd}$ read sub-array 2020*c* through signals 2224-2227, respectively, as shown in table 2254.

At clk3, because B0_L of Group 0 is also a failed main bank, data (0,0) and (0,1) may be shifted left by one bank and outputted by corresponding read MUXs 2180 in 3$^{rd}$ read sub-array 2020*c* through I/O data lines 2233 and 2234, as shown in a table 2255. For data (0,2) and (0,3), no input data shift may be needed, such that corresponding read MUXs 2180 in 3$^{rd}$ read sub-array 2020*b* may output data (0,2) and (0,3) without data shift through I/O data lines 2236 and 2237, respectively, as shown in table 2255. As a result, the first N pieces of data are successfully outputted from read MUX array 807.

Also at clk3, the second N pieces of data are respectively outputted by read MUXs 2180 of 2nd read sub-array 2020b through signal lines 2223, 2224, 2226, and 2227 with no data shift, as shown in table 2254. The second N pieces of data are respectively inputted to read MUXs 2180 of 3rd read sub-array 2020c through signal lines 2223, 2224, 2226, and 2227.

Also at clk3, the third N pieces of data are respectively outputted by read MUXs 2180 of 1st read sub-array 2020a through signal lines 2213, 2214, 2216, and 2217 with no data shift, as shown in table 2252. The third N pieces of data are respectively inputted to read MUXs 2180 of 2nd read sub-array 2020b through signal lines 2213, 2214, 2216, and 2217.

At clk4, the second N pieces of data are respectively outputted by read MUXs 2180 of 3rd read sub-array 2020c through data lines 2233, 2234, 2236, and 2237 with no data shift, as shown in table 2255. As a result, the second N pieces of data are successfully outputted from read MUX array 807.

Also at clk4, the third N pieces of data are respectively outputted by read MUXs 2180 of 2nd read sub-array 2020b through signal lines 2223, 2224, 2226, and 2227 with no data shift, as shown in table 2254. The third N pieces of data are respectively inputted to read MUXs 2180 of 3rd read sub-array 2020c through signal lines 2223, 2224, 2226, and 2227.

At clk5, the third N pieces of data are respectively outputted by read MUXs 2180 of 3rd read sub-array 2020c through data lines 2233, 2234, 2236, and 2237 with no data shift, as shown in table 2255. As a result, the third N pieces of data are successfully outputted from read MUX array 807.

Referring to FIG. 22C, assuming that Group 0, Group 1, and Group 2 include 3 failed main banks in total. The 3 failed main banks may include B0_L and B1_L of Group 0 and B1_L of Group 1, as shown in a table 2266. FIG. 22C is described herein with combined reference to FIG. 22A. Table 2266 shows that data (0,0), (0,1), and (0,3) from first N pieces of data (with N=4) are stored in 3 working banks of Group 0, second N pieces of data including (1,0), (1,1), (1,2), and (1,3) are stored in N working banks of Group 1, and third N pieces of data including (2,0), (2,1), (2,2), and (2,3) and data (0,2) from the first N pieces of data are stored in N+1 working banks of Group 2, as shown in table 2266. A data read order in FIG. 22C is from Group 0 to Group 1 and then to Group 2.

A table 2260 shows that data (0,0), (0,1), and (0,3) from the first N pieces of data are respectively read out from the 3 working banks of Group 0 and loaded to signal lines 2204, 2205, and 2207 at clk0. Table 2260 also shows that the second N pieces of data are respectively read out from the N working banks of Group 1 and loaded to signal lines 2203-2105 and 2207 at clk1. Table 2260 further shows that the third N pieces of data and data (0,2) from the first N pieces of data are respectively read out from the N+1 working banks of Group 2 and loaded to signal lines 2203-2107 at clk2.

Initially, at clk0, data (0,0), (0,1), and (0,3) from the first N pieces of data are respectively inputted to read MUXs 2180 of 1st read sub-array 2020a through signal lines 2204, 2205, and 2207, as shown in table 2260.

At clk1, because B0_L of Group 0 is a failed main bank, data (0,0) and (0,1) may be shifted left by one bank by 1st read sub-array 2020a and outputted through signal lines 2213-2214, as shown in a table 2262. For data (0,3), no input data shift may be needed, such that 1st read sub-array 2020a may output data (0,3) without data shift through signal line 2217, as shown in table 2262. As a result, at clk1, data (0,0), (0,1), and (0,3) are outputted by signal lines 2213, 2214, and 2217, respectively, as shown in table 2262.

Also at clk1, the second N pieces of data are respectively inputted to read MUXs 2180 of 1st read sub-array 2020a through signal lines 2203-2205 and 2207, as shown in table 2260.

At clk2, for data (0,0), (0,1), and (0,3), no input data shift may be needed, such that 2nd read sub-array 2020b may output data (0,0), (0,1), and (0,3) without data shift through signal lines 2223, 2224, and 2227, respectively, as shown in table a 2264.

Also at clk2, because B1_L of Group 1 is a failed main bank, data (1,2) of the second N pieces of data may be shifted right by one bank by read MUX 2180a in 1st read sub-array 2020a and outputted through signal line 2216, as shown in table 2262. For data (1,0), (1,1), and (1,3), no input data shift may be needed, such that 1st read sub-array 2020a may output data (1,0), (1,1), and (1,3) without data shift through signal lines 2213-2214 and 2227, respectively. As a result, data (1,0), (1,1), (1,2), and (1,3) are outputted by signal lines 2213-2214 and 2216-227, respectively, as shown in table 2262.

Also at clk2, the third N pieces of data and data (0,2) from the first N pieces of data are respectively inputted to read MUXs 2180 of 1st read sub-array 2020a through signal lines 2203-2207, as shown in table 2260. For example, data (0,2) from the first N pieces of data is inputted to read MUXs 2180a and 2180b of 1st read sub-array 2020a through signal line 2205. Since signal line 2225 is connected to signal line 2205, data (0,2) is also inputted to read MUXs 2180a and 2180b of 3rd read sub-array 2020c through signal line 2225. As a result, at clk2, data (0,0), (0,1), (0,2), and (0,3) from the first N pieces of data are inputted to 3rd read sub-array 2020c through signal lines 2224-2225 and 2227, respectively, as shown in table 2264.

At clk3, because B1_L of Group 0 is also a failed main bank, data (0,2) from the first N pieces of data may be shifted right by one bank by read MUXs 2180a of 3rd read sub-array 2020c and outputted through I/O data line 2236, as shown in a table 2265. For data (0,0), (0,1), and (0,3), no input data shift may be needed, such that 3rd read sub-array 2020c may select data (0,0), (0,1), and (0,3) from inputs A and output data (0,0), (0,1), and (0,3) without data shift through I/O data lines 2233-2234 and 2237, respectively, as shown in table 2265. As a result, the first N pieces of data are successfully outputted from read MUX array 807.

Also at clk3, the second N pieces of data are respectively outputted by read MUXs 2180 of 2nd read sub-array 2020b through signal lines 2223, 2224, 2226, and 2227 with no data shift, as shown in table 2264. The second N pieces of data are respectively inputted to read MUXs 2180 of 3rd read sub-array 2020c through signal lines 2223, 2224, 2226, and 2227.

Also at clk3, the third N pieces of data are respectively outputted by read MUXs 2180 of 1st read sub-array 2020a through signal lines 2213, 2214, 2216, and 2217 with no data shift, as shown in table 2262. The third N pieces of data are respectively inputted to read MUXs 2180 of 2nd read sub-array 2020b through signal lines 2213, 2214, 2216, and 2217.

At clk4, the second N pieces of data are respectively outputted by read MUXs 2180 of 3rd read sub-array 2020c through data lines 2233, 2234, 2236, and 2237 with no data shift, as shown in table 2265. As a result, the second N pieces of data are successfully outputted from read MUX array 807.

Also at clk4, the third N pieces of data are respectively outputted by read MUXs 2180 of $2^{nd}$ read sub-array 2020*b* through signal lines 2223, 2224, 2226, and 2227 with no data shift, as shown in table 2264. The third N pieces of data are respectively inputted to read MUXs 2180 of $3^{rd}$ read sub-array 2020*c* through signal lines 2223, 2224, 2226, and 2227.

At clk5, the third N pieces of data are respectively outputted by read MUXs 2180 of $3^{rd}$ read sub-array 2020*c* through data lines 2233, 2234, 2236, and 2237 with no data shift, as shown in table 2265. As a result, the third N pieces of data are successfully outputted from read MUX array 807.

With combined reference to FIGS. 17-22C described above, an exemplary general structure of I/O circuit 407 in a memory device is disclosed herein. The memory device may include an array of memory cells including P groups of banks. Each group of banks may include N main banks 702 and a redundant bank 704 for concurrent data input/output, and so, P redundant banks are included in and shared by the P groups of banks.

In some implementations, the array of memory cells includes a first-level memory unit, and the first-level memory unit includes a plurality of second-level memory units, one of which includes the P groups of banks. I/O circuit 407 and I/O control logic 412 are shared by the plurality of second-level memory units. For example, the first-level memory unit is a die that includes a plurality of planes. A second-level memory unit that includes the P groups of banks is a plane in the die, and the plane includes the P×N working banks from the P groups of banks. I/O circuit 407 is coupled to a global data bus, and configured to direct the P×N pieces of data to or from the P×N working banks in the plane through the global data bus and one or more branch data buses in the plane, respectively.

I/O circuit 407 may include write MUX array 707. In some implementations, write MUX array 707 may include P write sub-arrays applied in series. For example, a write sub-array in write MUX array 707 can be represented as a $p^{th}$ write sub-array, with p being a positive integer and 1≤p≤P. Each write sub-array in write MUX array 707 may include a redundant write MUX 1881 and N main write MUXs 1880. Each main write MUX 1880 and each redundant write MUX 1881 may include a first input A, a second input B, a select port S, and an output, respectively.

For 2≤p≤P, redundant write MUX 1881 in the $p^{th}$ write sub-array may further include p−1 redundant input(s). For example, as shown in FIG. 19A, redundant write MUX 1881 in the $1^{st}$ write sub-array does not include any redundant input, redundant write MUX 1881 in the $2^{nd}$ write sub-array may include a $1^{st}$ redundant input C, a redundant write MUX 1881 in the 3 rd write sub-array may include the $1^{st}$ redundant input C and a $2^{nd}$ redundant input D, so on and so forth.

For 1≤p≤P, an output of each main write MUX 1880 in the $p^{th}$ write sub-array is coupled to first input A of corresponding main write MUX 1880 in a $(p+1)^{th}$ write sub-array. Also for 1≤p≤P, an output of redundant write MUX 1881 in the $p^{th}$ write sub-array is coupled to a $q^{th}$ redundant input of a corresponding redundant write MUX 1881 in each $(p+q)^{th}$ write sub-array with 1≤q≤P−p, where q is a positive integer. For p=P, outputs of N main write MUXs 1880 and redundant write MUX 1881 in the $p^{th}$ write sub-array are coupled to N main banks 702 and redundant bank 704 in a corresponding group of banks, respectively.

For p=1, first input A of each main write MUX 1880 in the $p^{th}$ write sub-array is coupled to a corresponding I/O data line and configured to receive a corresponding piece of data from the corresponding I/O data line. For 1≤p≤P, second input B of each main write MUX 1880 in the $p^{th}$ write sub-array is coupled to a Vdd signal line or first input A of a corresponding adjacent main write MUX 1880 in the $p^{th}$ write sub-array.

In some implementations, redundant write MUX 1881 in the $p^{th}$ write sub-array 1720 is located among N main write MUXs 1880 in the $p^{th}$ write sub-array, as shown in FIGS. 18A and 19A. For 1≤p≤P, first input A and second input B of redundant write MUX 1881 in the $p^{th}$ write sub-array are coupled to first inputs of two adjacent main write MUXs 1880 in the $p^{th}$ write sub-array, respectively.

In some other implementations, redundant write MUX 1881 in the $p^{th}$ write sub-array is located on a side of N main write MUXs 1880 in the $p^{th}$ write sub-array, as shown in FIG. 18D. For 1≤p≤P, one of first input A and second input B of redundant write MUX 1881 in the $p^{th}$ write sub-array is coupled to first input A of an adjacent main write MUX 1880 in the $p^{th}$ write sub-array. Another of first input A and second input B of redundant write MUX 1881 in the $p^{th}$ write sub-array is coupled to a Vdd signal line.

Further, I/O circuit 407 may include read MUX array 807 coupled to each group of banks and configured to direct the P×N pieces of data from the P×N working banks, respectively. Read MUX array 807 may include P read sub-arrays applied in series, and each read sub-array may include N read MUXs 2180, with each read MUX 2180 including a first input A, a second input B, a select port S, and an output Out, respectively. For example, a read sub-array in read MUX array 807 can be represented as a $p^{th}$ read sub-array with 1≤p≤P.

For 1≤p<P, an output of each read MUX 2180 in the $p^{th}$ read sub-array is coupled to first input A of a corresponding read MUX 2180 in a $(p+1)^{th}$ read sub-array. For p=P, an output of each read MUX 2180 in the $p^{th}$ read sub-array is coupled to a corresponding I/O data line and configured to output a corresponding piece of data to the corresponding I/O data line.

For p=1, first input A of each read MUX 2180 in the $p^{th}$ read sub-array is coupled to a corresponding main bank in the N main banks. For 1≤p≤P, second input B of each read MUX 2180 in the $p^{th}$ read sub-array is coupled to the redundant bank or first input A of a corresponding adjacent read MUX 2180 in the $p^{th}$ read sub-array.

In some implementations, assuming that the P groups of banks include K failed main banks, where K is a positive integer not greater than P (1≤K≤P). The K failed main banks may be distributed in a single group of banks (or two or more groups of banks) from the P groups of banks. I/O control logic 412 may be configured to determine P×N working banks from the P groups of banks based on bank fail information indicative of the K failed main banks from the P groups of banks. The P×N working banks may include K redundant banks of the P redundant banks. I/O control logic 412 may be further configured to control I/O circuit 407 to direct P×N pieces of data to or from the P×N working banks, respectively.

For example, assuming that a first group of banks includes K failed main banks and other groups of banks do not include any failed main bank. I/O control logic 412 may be configured to: (1) direct K pieces of data of a first N pieces of data to or from the K redundant banks; (2) direct the remaining N−K pieces of data of the first N pieces of data to or from N−K working main banks in the first group of banks; and (3) direct other pieces of data intended to be stored in other groups of banks to or from respective working main banks in the other groups of banks.

Figure 23:
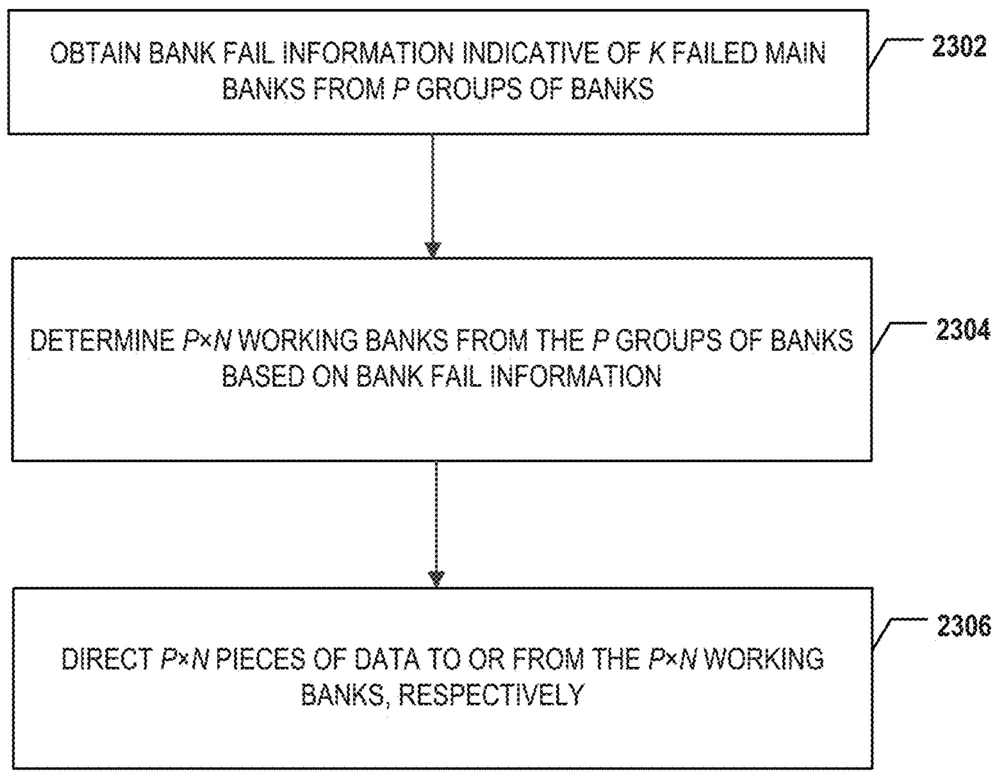
FIG. 23 illustrates a flowchart of an exemplary method for operating a memory device that implements a failed main bank repair scheme, according to some aspects of the present disclosure.

FIG. 23 illustrates a flowchart of an exemplary method 2300 for operating a memory device that implements a failed main bank repair scheme in data input/output, according to some aspects of the present disclosure. The memory device may be any suitable memory device disclosed herein. Method 2300 may be implemented by I/O control logic 412. It is understood that the operations shown in method 2300 may not be exhaustive and that other operations can be performed as well before, after, or between any of the illustrated operations. Further, some of the operations may be performed simultaneously, or in a different order than shown in FIG. 23.

Referring to FIG. 23, method 2300 starts at operation 2302, in which bank fail information indicative of K failed main banks from P groups of banks is obtained. The K failed main banks can be identified by the post-fabrication test of the memory device. For example, working bank logic 906 may obtain the bank fail information from registers 414 before operating the memory device.

Method 2300 proceeds to operation 2304, as illustrated in FIG. 23, in which P×N working banks are determined from the P groups of banks based on the bank fail information. For example, working bank logic 906 may determine the P×N working banks that include K redundant banks and the remaining main banks from the P groups of banks.

Method 2300 proceeds to operation 2306, as illustrated in FIG. 23, in which P×N pieces of data are directed to or from the P×N working banks, respectively.

According to one aspect of the present disclosure, a memory device includes an array of memory cells, an I/O circuit, and I/O control logic coupled to the I/O circuit. The array of memory cells includes P groups of banks. Each group of banks includes N main banks and a redundant bank such that P redundant banks are included in and shared by the P groups of banks. Each of P and N is a positive integer. The I/O circuit is coupled to the P groups of banks and configured to direct P×N pieces of data to or from P×N working banks, respectively. The I/O control logic is configured to determine the P×N working banks from the P groups of banks based on bank fail information indicative of K failed main banks from the P groups of banks. The P×N working banks include K redundant banks of the P redundant banks. K is a positive integer not greater than P. The I/O control logic is also configured to control the I/O circuit to direct P×N pieces of data to or from the P×N working banks, respectively.

In some implementations, the I/O circuit includes a write MUX array coupled to each group of banks and configured to direct the P×N pieces of data to the P×N working banks, respectively.

In some implementations, the write MUX array includes P write sub-arrays applied in series. Each write sub-array includes a redundant write MUX and N main write MUXs.

In some implementations, each main write MUX and each redundant write MUX include a first input, a second input, and an output, respectively. A redundant write MUX in a $p^{th}$ write sub-array of the write MUX array further includes p−1 redundant inputs for 2≤p≤P, where p is a positive integer.

In some implementations, for 1≤p<P, an output of each main write MUX in the $p^{th}$ write sub-array is coupled to a first input of a corresponding main write MUX in a $(p+1)^{th}$ write sub-array. An output of the redundant write MUX in the $p^{th}$ write sub-array is coupled to a $q^{th}$ redundant input of a corresponding redundant write MUX in each $(p+q)^{th}$ write sub-array with 1≤q≤P−p, where q is a positive integer. For p=P, outputs of the N main write MUXs and the redundant write MUX in the $p^{th}$ write sub-array are coupled to the N main banks and the redundant bank, respectively.

In some implementations, for p=1, a first input of each main write MUX in the $p^{th}$ write sub-array is coupled to a corresponding I/O data line and configured to receive a corresponding piece of data from the corresponding I/O data line. For 1≤p≤P, a second input of each main write MUX in the $p^{th}$ write sub-array is coupled to a Vdd signal line or a first input of a corresponding adjacent main write MUX in the $p^{th}$ write sub-array.

In some implementations, for 1≤p≤P, the redundant write MUX in the $p^{th}$ write sub-array is located among the N main write MUXs in the $p^{th}$ write sub-array. A first input and a second input of the redundant write MUX in the $p^{th}$ write sub-array are coupled to first inputs of two adjacent main write MUXs in the $p^{th}$ write sub-array, respectively.

In some implementations, for 1≤p≤P, the redundant write MUX in the $p^{th}$ write sub-array is located on a side of the N main write MUXs in the $p^{th}$ write sub-array. One of first and second inputs of the redundant write MUX in the $p^{th}$ write sub-array is coupled to a first input of an adjacent main write MUX in the $p^{th}$ write sub-array. Another of the first and second inputs of the redundant write MUX in the $p^{th}$ write sub-array is coupled to a Vdd signal line.

In some implementations, the I/O circuit includes a read MUX array coupled to each group of banks and configured to direct the P×N pieces of data from the P×N working banks, respectively.

In some implementations, the read MUX array includes P read sub-arrays applied in series. Each read sub-array includes N read MUXs. Each read MUX includes a first input, a second input, and an output, respectively.

In some implementations, for 1≤p<P, an output of each read MUX in a $p^{th}$ read sub-array is coupled to a first input of a corresponding read MUX in a $(p+1)^{th}$ read sub-array, where p is a positive integer. For p=P, an output of each read MUX in the $p^{th}$ read sub-array is coupled to a corresponding I/O data line and configured to output a corresponding piece of data to the corresponding I/O data line.

In some implementations, for p=1, a first input of each read MUX in the $p^{th}$ read sub-array is coupled to a corresponding main bank in the N main banks. For 1≤p≤P, a second input of each read MUX in the $p^{th}$ read sub-array is coupled to the redundant bank or a first input of a corresponding adjacent read MUX in the $p^{th}$ read sub-array.

In some implementations, the K failed main banks are distributed in one or more groups of banks from the P groups of banks.

In some implementations, the array of memory cells includes a first-level memory unit. The first-level memory unit includes a plurality of second-level memory units, one of which includes the P groups of banks. The I/O circuit and the I/O control logic are shared by the plurality of second-level memory units.

In some implementations, the first-level memory unit is a die that includes a plurality of planes. A second-level memory unit that includes the P groups of banks is a plane in the die, and the plane includes the P×N working banks from the P groups of banks. The I/O circuit is coupled to a global data bus, and configured to direct the P×N pieces of data to or from the P×N working banks in the plane through the global data bus and one or more branch data buses in the plane, respectively.

In some implementations, N=4 or 8. The memory device includes a three-dimensional (3D) NAND Flash memory device.

According to another aspect of the present disclosure, a system includes a memory device configured to store data and a memory controller coupled to the memory device and configured to control the memory device. The memory device includes an array of memory cells, an I/O circuit, and I/O control logic coupled to the I/O circuit. The array of memory cells includes P groups of banks. Each group of banks includes N main banks and a redundant bank such that P redundant banks are included in and shared by the P groups of banks. Each of P and N is a positive integer. The I/O circuit is coupled to the P groups of banks and configured to direct P×N pieces of data to or from P×N working banks, respectively. The I/O control logic is configured to determine the P×N working banks from the P groups of banks based on bank fail information indicative of K failed main banks from the P groups of banks. The P×N working banks include K redundant banks of the P redundant banks. K is a positive integer not greater than P. The I/O control logic is also configured to control the I/O circuit to direct P×N pieces of data to or from the P×N working banks, respectively.

In some implementations, the system further includes a host coupled to the memory controller and configured to send or receive the data.

In some implementations, the I/O circuit includes a write MUX array coupled to each group of banks and configured to direct the P×N pieces of data to the P×N working banks, respectively.

In some implementations, the write MUX array includes P write sub-arrays applied in series. Each write sub-array includes a redundant write MUX and N main write MUXs.

In some implementations, each main write MUX and each redundant write MUX include a first input, a second input, and an output, respectively. A redundant write MUX in a $p^{th}$ write sub-array of the write MUX array further includes p−1 redundant inputs for 2≤p≤P, where p is a positive integer.

In some implementations, for 1≤p<P, an output of each main write MUX in the $p^{th}$ write sub-array is coupled to a first input of a corresponding main write MUX in a $(p+1)^{th}$ write sub-array. An output of the redundant write MUX in the $p^{th}$ write sub-array is coupled to a $q^{th}$ redundant input of a corresponding redundant write MUX in each $(p+q)^{th}$ write sub-array with 1≤q≤P−p, where q is a positive integer. For p=P, outputs of the N main write MUXs and the redundant write MUX in the $p^{th}$ write sub-array are coupled to the N main banks and the redundant bank, respectively.

In some implementations, for p=1, a first input of each main write MUX in the $p^{th}$ write sub-array is coupled to a corresponding I/O data line and configured to receive a corresponding piece of data from the corresponding I/O data line. For 1≤p≤P, a second input of each main write MUX in the $p^{th}$ write sub-array is coupled to a Vdd signal line or a first input of a corresponding adjacent main write MUX in the $p^{th}$ write sub-array.

In some implementations, for 1≤p≤P, the redundant write MUX in the $p^{th}$ write sub-array is located among the N main write MUXs in the $p^{th}$ write sub-array. A first input and a second input of the redundant write MUX in the $p^{th}$ write sub-array are coupled to first inputs of two adjacent main write MUXs in the $p^{th}$ write sub-array, respectively.

In some implementations, for 1≤p≤P, the redundant write MUX in the $p^{th}$ write sub-array is located on a side of the N main write MUXs in the $p^{th}$ write sub-array. One of first and second inputs of the redundant write MUX in the $p^{th}$ write sub-array is coupled to a first input of an adjacent main write MUX in the $p^{th}$ write sub-array. Another of the first and second inputs of the redundant write MUX in the $p^{th}$ write sub-array is coupled to a Vdd signal line.

In some implementations, the I/O circuit includes a read MUX array coupled to each group of banks and configured to direct the P×N pieces of data from the P×N working banks, respectively.

In some implementations, the read MUX array includes P read sub-arrays applied in series. Each read sub-array includes N read MUXs. Each read MUX includes a first input, a second input, and an output, respectively.

In some implementations, for 1≤p<P, an output of each read MUX in a $p^{th}$ read sub-array is coupled to a first input of a corresponding read MUX in a $(p+1)^{th}$ read sub-array, where p is a positive integer. For p=P, an output of each read MUX in the $p^{th}$ read sub-array is coupled to a corresponding I/O data line and configured to output a corresponding piece of data to the corresponding I/O data line.

In some implementations, for p=1, a first input of each read MUX in the $p^{th}$ read sub-array is coupled to a corresponding main bank in the N main banks. For 1≤p≤P, a second input of each read MUX in the $p^{th}$ read sub-array is coupled to the redundant bank or a first input of a corresponding adjacent read MUX in the $p^{th}$ read sub-array.

In some implementations, the K failed main banks are distributed in one or more groups of banks from the P groups of banks.

In some implementations, the array of memory cells includes a first-level memory unit. The first-level memory unit includes a plurality of second-level memory units, one of which includes the P groups of banks. The I/O circuit and the I/O control logic are shared by the plurality of second-level memory units.

In some implementations, the first-level memory unit is a die that includes a plurality of planes. A second-level memory unit that includes the P groups of banks is a plane in the die, and the plane includes the P×N working banks from the P groups of banks. The I/O circuit is coupled to a global data bus, and configured to direct the P×N pieces of data to or from the P×N working banks in the plane through the global data bus and one or more branch data buses in the plane, respectively.

In some implementations, N=4 or 8. The memory device includes a 3D NAND Flash memory device.

According to still another aspect of the present disclosure, a method for operating a memory device is provided. The memory device includes an array of memory cells. The array of memory cells includes P groups of banks. Each group of banks includes N main banks and a redundant bank such that P redundant banks are included in the P groups of banks. Each of P and N is a positive integer. P×N working banks are determined from the P groups of banks based on bank fail information indicative of K failed main banks from the P groups of banks. The P×N working banks include K redundant banks of the P redundant banks. K is a positive integer not greater than P. P×N pieces of data are directed to or from the P×N working banks, respectively.

In some implementations, the bank fail information indicative of the K failed main banks is obtained.

In some implementations, P is not less than 2.

In some implementations, the K failed main banks are distributed in one or more groups of banks from the P groups of banks.

In some implementations, each of the P redundant banks is shared by the P groups of banks.

In some implementations, the memory device further includes an I/O circuit. The I/O circuit includes a write MUX array and a read MUX array coupled to each group of banks, respectively. The write MUX array includes P write sub-arrays applied in series. The read MUX array includes P read sub-arrays applied in series. Directing the P×N pieces of data includes: directing, through the P write sub-arrays, the P×N pieces of data to the P×N working banks, respectively; and directing, through the P read sub-arrays, the P×N pieces of data from the P×N working banks, respectively.

In some implementations, N=4 or 8. The memory device includes a 3D NAND Flash memory device.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:

an array of memory cells comprising P groups of banks, each group of banks comprising N main banks and M redundant banks, where each of P, N and M is a positive integer, and N is greater than M;

an input/output (I/O) circuit coupled to the P groups of banks and configured to direct P×N pieces of data to or from P×N working banks, respectively, wherein one of the M redundant banks is coupled with at least two main banks of the N main banks through the I/O circuit; and an I/O control logic coupled to the I/O circuit and configured to:

in responding to K main banks of the P groups of banks failed, determine the P×N working banks comprising K redundant banks of P×M redundant banks, where K is a positive integer not greater than P; and control the I/O circuit to direct P×N pieces of data to or from the P×N working banks, respectively.

2. The memory device of claim 1, wherein the I/O circuit comprises a write multiplexer (MUX) array coupled to each group of banks and configured to direct the P×N pieces of data to the P×N working banks, respectively.

3. The memory device of claim 2, wherein the write MUX array comprises P write sub-arrays applied in series, M=1, each write sub-array comprising a redundant write MUX and N main write MUXs.

4. The memory device of claim 3, wherein each main write MUX and each redundant write MUX comprise a first input, a second input, and an output, respectively; and a redundant write MUX in a $p^{th}$ write sub-array of the write MUX array further comprises p−1 redundant inputs for 2≤p≤P, where p is a positive integer.

5. The memory device of claim 4, wherein for 1≤p<P, an output of each main write MUX in the $p^{th}$ write sub-array is coupled to a first input of a corresponding main write MUX in a $(p+1)^{th}$ write sub-array; and an output of the redundant write MUX in the $p^{th}$ write sub-array is coupled to a $q^{th}$ redundant input of a corresponding redundant write MUX in each $(p+q)^{th}$ write sub-array with 1≤q≤P−p, where q is a positive integer; and for p=P, outputs of the N main write MUXs and the redundant write MUX in the $p^{th}$ write sub-array are coupled to the N main banks and the M redundant bank, respectively.

6. The memory device of claim 4, wherein for p=1, a first input of each main write MUX in the $p^{th}$ write sub-array is coupled to a corresponding I/O data line and configured to receive a corresponding piece of data from the corresponding I/O data line; and for 1≤p≤P, a second input of each main write MUX in the $p^{th}$ write sub-array is coupled to a Vdd signal line or a first input of a corresponding adjacent main write MUX in the $p^{th}$ write sub-array.

7. The memory device of claim 4, wherein for 1≤p≤P, the redundant write MUX in the $p^{th}$ write sub-array is located among the N main write MUXs in the $p^{th}$ write sub-array; and a first input and a second input of the redundant write MUX in the $p^{th}$ write sub-array are coupled to first inputs of two adjacent main write MUXs in the $p^{th}$ write sub-array, respectively.

8. The memory device of claim 4, wherein for 1≤p≤P, the redundant write MUX in the $p^{th}$ write sub-array is located on a side of the N main write MUXs in the $p^{th}$ write sub-array;

one of first and second inputs of the redundant write MUX in the $p^{th}$ write sub-array is coupled to a first input of an adjacent main write MUX in the $p^{th}$ write sub-array; and another of the first and second inputs of the redundant write MUX in the $p^{th}$ write sub-array is coupled to a Vdd signal line.

9. The memory device of claim 1, wherein the I/O circuit comprises a read multiplexer (MUX) array coupled to each group of banks and configured to direct the P×N pieces of data from the P×N working banks, respectively.

10. The memory device of claim 9, wherein the read MUX array comprises P read sub-arrays applied in series, each read sub-array comprising N read MUXs, each read MUX comprising a first input, a second input, and an output, respectively.

11. The memory device of claim 10, wherein for 1≤p<P, an output of each read MUX in a $p^{th}$ read sub-array is coupled to a first input of a corresponding read MUX in a $(p+1)^{th}$ read sub-array, where p is a positive integer; and for p=P, an output of each read MUX in the $p^{th}$ read sub-array is coupled to a corresponding I/O data line and configured to output a corresponding piece of data to the corresponding I/O data line.

12. The memory device of claim 11, wherein for p=1, a first input of each read MUX in the $p^{th}$ read sub-array is coupled to a corresponding main bank in the N main banks; and for 1≤p≤P, a second input of each read MUX in the $p^{th}$ read sub-array is coupled to the M redundant bank or a first input of a corresponding adjacent read MUX in the $p^{th}$ read sub-array.

13. The memory device of claim 1, wherein the K failed main banks are distributed in one or more groups of banks from the P groups of banks.

14. The memory device of claim 1, wherein the memory device includes a three-dimensional (3D) NAND Flash memory device.

15. A memory system, comprising:

a memory device configured to store data, the memory device comprising:

an array of memory cells comprising P groups of banks, each group of banks comprising N main banks and M redundant banks, where each of P, N and M is a positive integer, and N is greater than M;

an input/output (I/O) circuit coupled to the P groups of banks and configured to direct P×N pieces of data to or from P×N working banks, respectively, wherein one of the M redundant banks is coupled with at least two main banks of the N main banks through the I/O circuit; and I/O control logic coupled to the I/O circuit and configured to:

in responding to K main banks of the P groups of banks failed, determine the P×N working banks comprising K redundant banks of P×M redundant banks, where K is a positive integer not greater than P; and control the I/O circuit to direct P×N pieces of data to or from the P×N working banks, respectively; and a memory controller coupled to the memory device and configured to control the memory device.

16. The memory system of claim 15, wherein the I/O circuit comprises a write multiplexer (MUX) array coupled to each group of banks and configured to direct the P×N pieces of data to the P×N working banks, respectively; and the write MUX array comprises P write sub-arrays applied in series, M=1, each write sub-array comprising a redundant write MUX and N main write MUXs.

17. A method for operating a memory device comprising an array of memory cells, the array of memory cells comprising P groups of banks, each group of banks comprising N main banks and M redundant banks, where each of P, N and M is a positive integer, and Nis greater than M, wherein one of the M redundant banks is coupled with at least two main banks of the N main banks, the method comprising:

in responding to K main banks of the P groups of banks failed, determine P×N working banks comprising K redundant banks of P×M redundant banks, wherein K is a positive integer not greater than P; and directing P×N pieces of data to or from the P×N working banks, respectively.

18. The method of claim 17, further comprising obtaining the bank fail information indicative of the K failed main banks, wherein the K failed main banks are distributed in one or more groups of banks from the P groups of banks.

19. The method of claim 17, wherein each of the P×M redundant banks is coupled with at least two main banks of the P groups of banks.

20. The method of claim 17, wherein the memory device further comprises an input/output (I/O) circuit;

the I/O circuit comprises a write multiplexer (MUX) array and a read MUX array coupled to each group of banks, respectively;

the write MUX array comprises P write sub-arrays applied in series;

the read MUX array comprises P read sub-arrays applied in series; and directing the P×N pieces of data comprises:

directing, through the P write sub-arrays, the P×N pieces of data to the P×N working banks, respectively; and directing, through the P read sub-arrays, the P×N pieces of data from the P×N working banks, respectively.

* * * * *